(12) United States Patent
Buyuktosunoglu et al.

(10) Patent No.: US 9,195,630 B2
(45) Date of Patent: Nov. 24, 2015

(54) THREE-DIMENSIONAL COMPUTER PROCESSOR SYSTEMS HAVING MULTIPLE LOCAL POWER AND COOLING LAYERS AND A GLOBAL INTERCONNECTION STRUCTURE

(71) Applicant: International Business Machines Corporation, Armonk, NY (US)

(72) Inventors: Alper Buyuktosunoglu, White Plains, NY (US); Philip G. Emma, Danbury, CT (US); Allan M. Hartstein, Chappaqua, NY (US); Michael B. Healy, White Plains, NY (US); Krishnan K. Kailas, Tarrytown, NY (US)

(73) Assignee: International Business Machines Corporation, Armonk, NY (US)

( * ) Notice: Subject to any disclaimer, the term of this patent is extended or adjusted under 35 U.S.C. 154(b) by 210 days.

(21) Appl. No.: 13/801,071

(22) Filed: Mar. 13, 2013

(65) Prior Publication Data

US 2014/0281378 A1    Sep. 18, 2014

(51) Int. Cl.
| | | |
|---|---|---|
| *H01L 23/48* | (2006.01) | |
| *H01L 23/52* | (2006.01) | |
| *H01L 29/40* | (2006.01) | |
| *G06F 15/173* | (2006.01) | |
| *G06F 15/78* | (2006.01) | |
| *G06F 9/30* | (2006.01) | |
| *G06F 1/32* | (2006.01) | |

(52) U.S. Cl.
CPC ............ *G06F 15/17362* (2013.01); *G06F 1/32* (2013.01); *G06F 9/30123* (2013.01); *G06F 15/7807* (2013.01)

(58) Field of Classification Search
CPC ... H01L 23/538; H01L 23/5389; H01L 24/18; H01L 24/82; H01L 25/0657; H01L 2924/14; H01L 2224/48091
See application file for complete search history.

(56) References Cited

U.S. PATENT DOCUMENTS

| | | | |
|---|---|---|---|
| 5,420,754 A | 5/1995 | Segelken et al. | |
| 5,568,574 A | 10/1996 | Tanguay, Jr. et al. | |
| 5,701,233 A | 12/1997 | Carson et al. | |
| 6,174,494 B1 | 1/2001 | Lowden et al. | |
| 6,525,726 B1 | 2/2003 | Xie et al. | |
| 7,068,515 B2 | 6/2006 | Harris et al. | |
| 7,465,608 B1 | 12/2008 | Farrar | |
| 7,554,203 B2 | 6/2009 | Zhou et al. | |

(Continued)

OTHER PUBLICATIONS

H. Homayoun et al., "Dynamically Heterogeneous Cores Through 3D Resource Pooling," 18th International Symposium on High Performance Computer Architecture, Feb. 25-29, 2012, 12 pages.

(Continued)

*Primary Examiner* — Hoai V Pham
(74) *Attorney, Agent, or Firm* — Jennifer R. Davis; Ryan, Mason & Lewis, LLP

(57) ABSTRACT

A computer processor system includes a plurality of multi-chip systems that are physically aggregated and conjoined. Each multi-chip system includes a plurality of chips that are conjoined together, and a local interconnection and input/output wiring layer. A global interconnection network is connected to the local interconnection and input/output wiring layer of each multi-chip system to interconnect the multi-chip systems together. One or more of the multi-chip systems includes a plurality of processor chips that are conjoined together.

20 Claims, 37 Drawing Sheets

(56) References Cited

U.S. PATENT DOCUMENTS

| | | |
|---|---|---|
| 7,615,857 B1 | 11/2009 | Jouppi |
| 7,675,181 B2 | 3/2010 | Lee |
| 7,723,853 B2 | 5/2010 | Pan et al. |
| 2003/0148578 A1* | 8/2003 | Ku et al. ........................ 438/239 |
| 2007/0257350 A1 | 11/2007 | Lee et al. |
| 2010/0115171 A1 | 5/2010 | Tsunoda et al. |
| 2011/0078412 A1 | 3/2011 | Emma et al. |

OTHER PUBLICATIONS

R. Kumar et al., "Interconnections in Multi-Core Architectures: Understanding Mechanisms, Overheads and Scaling," IEEE 32nd Annual International Symposium on Computer Architecture (ISCA), Jun. 2005, 37 pages.

* cited by examiner

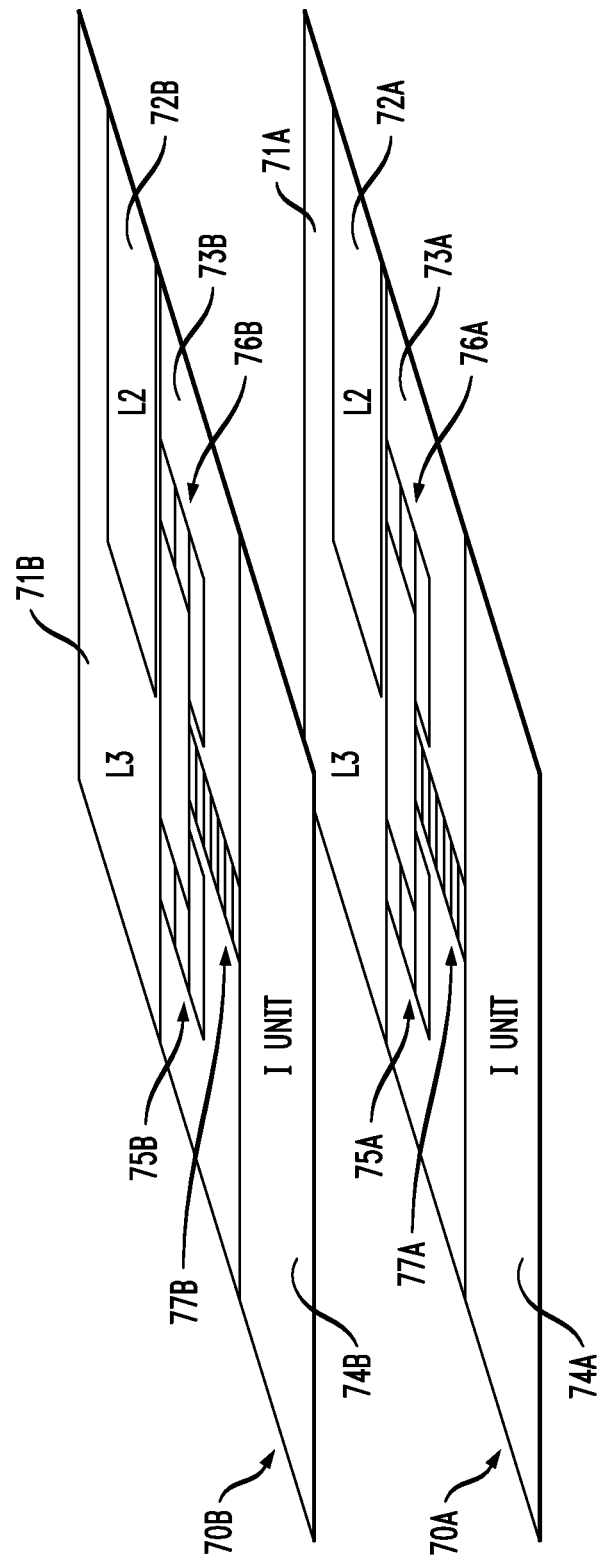

90

90

90

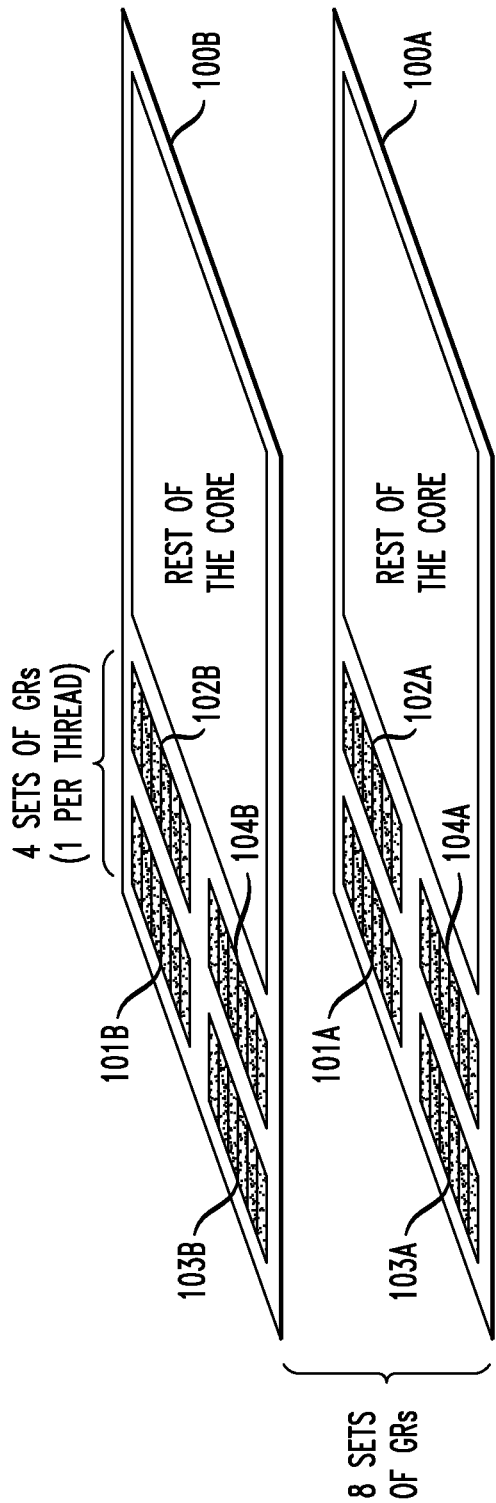

| OPERATING MODE | PROCESSOR (190A) | PROCESSOR (190B) |
|---|---|---|
| NORMAL | ON-HALF POWER | ON-HALF POWER |
| TURBO | ON-FULL POWER | OFF |
| HYPER-TURBO | ON-INCREASED FULL POWER | OFF-STATE REGISTERS USED BY PROCESSOR 190A FOR CHECKPOINTING |

210

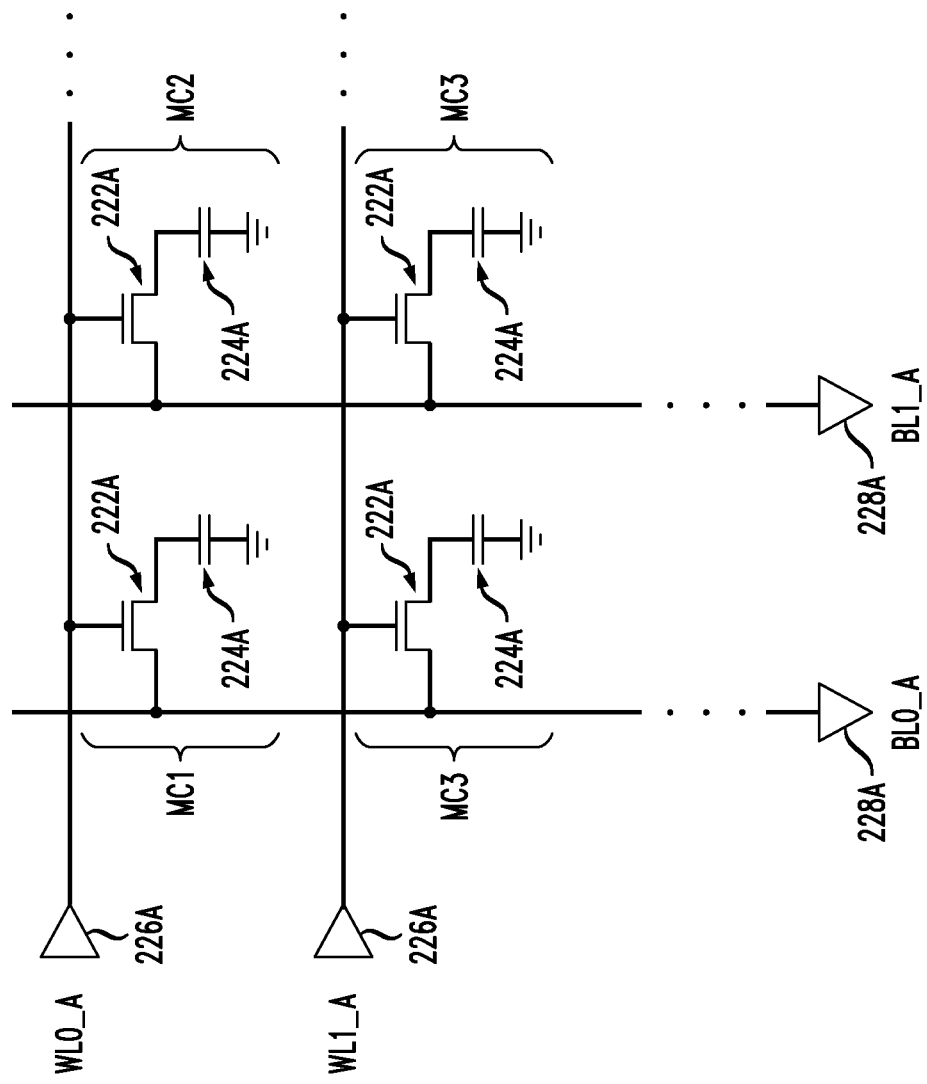

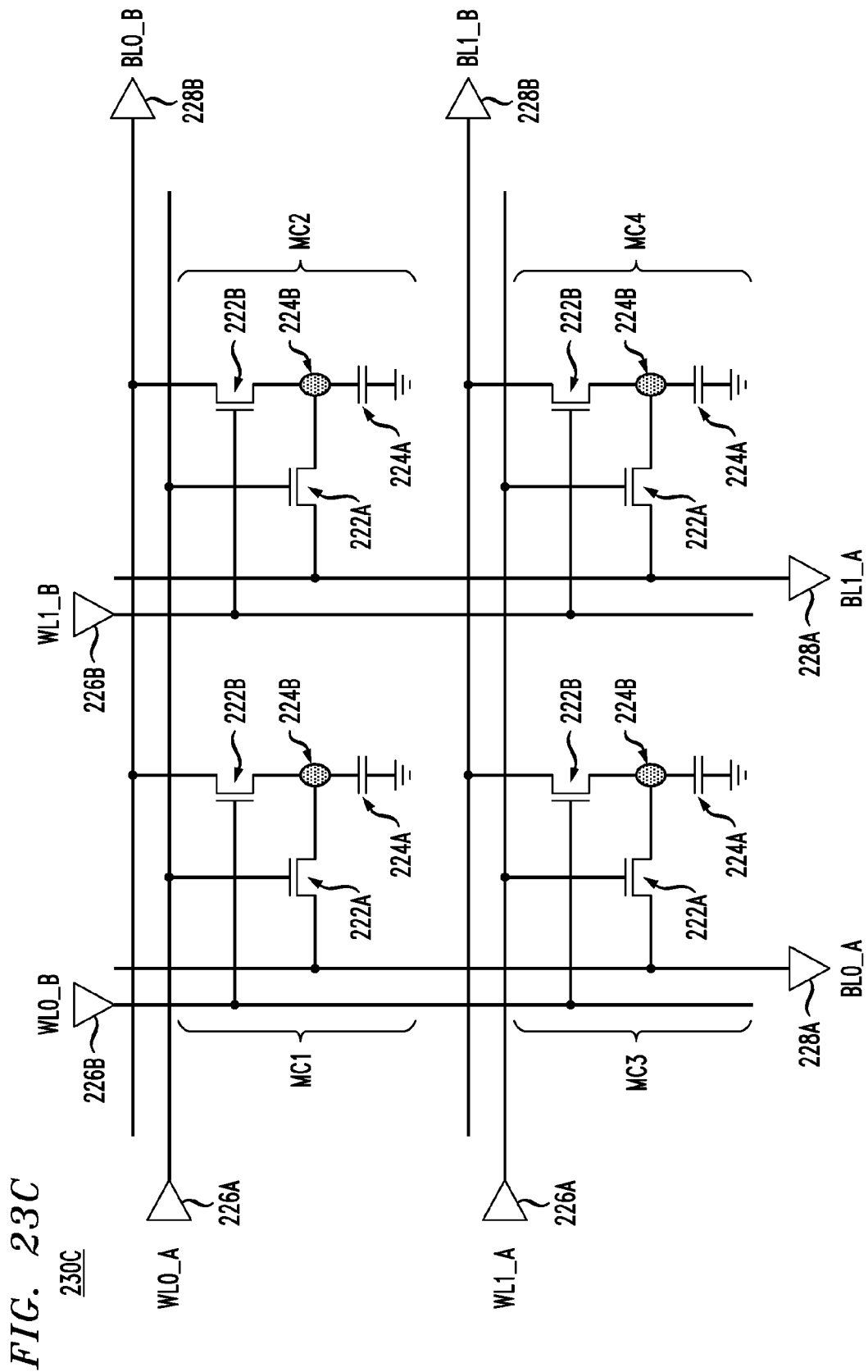

|  | CA1 | CA2 | CA3 | CA4 |
|---|---|---|---|---|
| RA1 | A11 | A13 | A13 | A14 |
| RA2 | A21 | A22 | A23 | A24 |
| RA3 | A31 | A32 | A33 | A34 |
| RA4 | A41 | A42 | A43 | A44 |

×

B

|  | CB1 | CB2 | CB3 | CB4 |
|---|---|---|---|---|
| RB1 | B11 | B12 | B13 | B14 |
| RB2 | B21 | B22 | B23 | B24 |
| RB3 | B31 | B32 | B33 | B34 |
| RB4 | B41 | B42 | B43 | B44 |

=

C

|  | CC1 | CC2 | CC3 | CC4 |
|---|---|---|---|---|
| RC1 | C11 | C12 | C13 | C14 |
| RC2 | C21 | C22 | C23 | C24 |
| RC3 | C31 | C32 | C33 | C34 |
| RC4 | C41 | C42 | C43 | C44 |

240

260

270

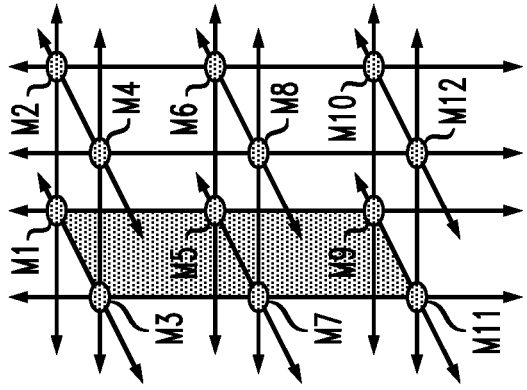
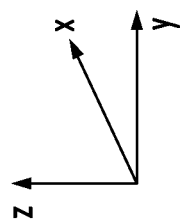
FIG. 30A
DATA IN A y-z PLANE
(y,z) OR (z,y) FOR FIXED x
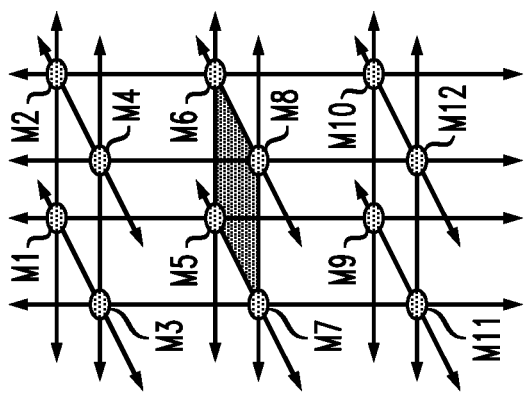
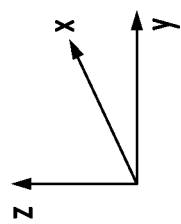
FIG. 30B
DATA IN A x-y PLANE
(x,y) OR (y,x) FOR FIXED z
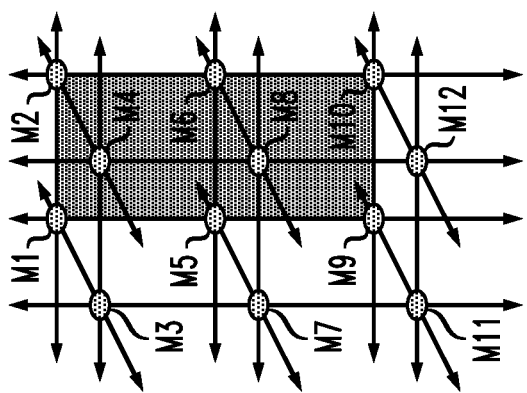
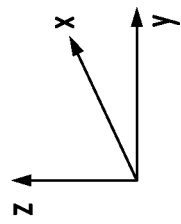
FIG. 30C
DATA IN A x-z PLANE
(x,z) OR (z,x) FOR FIXED y

280

290

700

600

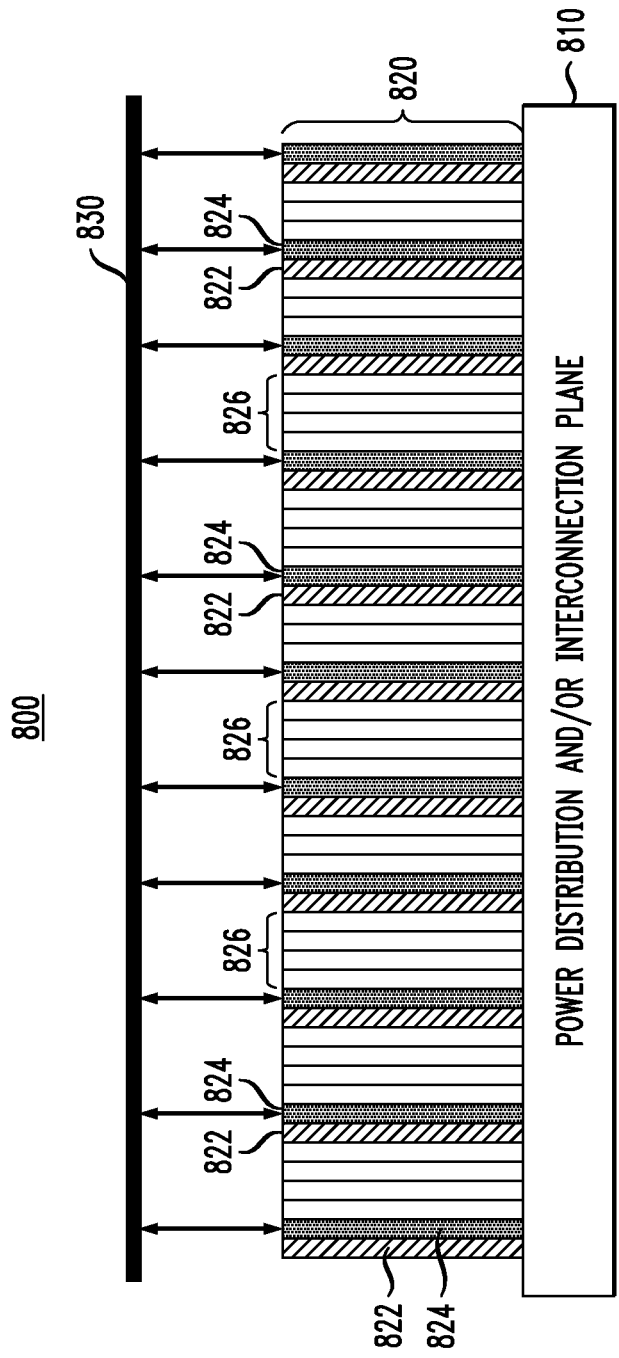

900

THREE-DIMENSIONAL COMPUTER PROCESSOR SYSTEMS HAVING MULTIPLE LOCAL POWER AND COOLING LAYERS AND A GLOBAL INTERCONNECTION STRUCTURE

TECHNICAL FIELD

The field relates generally to three-dimensional computer processor systems and, in particular, three-dimensional computer processor systems comprising a plurality of multi-chip systems in an aggregated structure that incorporates multiple local power and cooling layers, and a global interconnect structure that connects the multi-chip systems in the aggregated structure.

BACKGROUND

In the field of semiconductor processor chip fabrication, single-chip processors were fabricated by many companies during the early stages of processor technology. In the last decade or so, as Moore's Law has continued to shrink dimensions, many companies and other entities have designed processor chips with multiple processors on a single layer. However, as the number of processors per chip continues to increase, on chip communication between processors becomes problematic. For example, as the 2-D size of the processor chip increases to accommodate more processors, the length of the horizontal wiring between the processors increases (in the range of mm or cm) resulting in cycle delays in the communication between processors, and requiring the use of high-powered on-chip drivers along communication paths between processors. Furthermore, the cycle delay with respect to communication between processors increases as the operating frequency increases. Furthermore, as integration density increases, it becomes increasingly problematic and expensive to implement global interconnect schemes for connecting multiple processors in a multi-chip system, and to implement effective and efficient cooling structures to properly remove heat generated by high-power, high-density processor chips in a multi-chip structure.

SUMMARY

Embodiments of the invention generally include three-dimensional computer processor systems and, in particular, three-dimensional computer processor systems comprising a plurality of multi-chip systems in an aggregated structure that incorporates multiple local power and cooling layers, and a global interconnect structure that connects the multi-chip systems in the aggregated structure.

In one embodiment of the invention, a computer processor system includes a plurality of multi-chip systems that are physically aggregated and conjoined. Each multi-chip system includes a plurality of chips that are conjoined together, and a local interconnection and input/output wiring layer. A global interconnection network is connected to the local interconnection and input/output wiring layer of each multi-chip system to interconnect the multi-chip systems together. One or more of the multi-chip systems includes a plurality of processor chips that are conjoined together.

In another embodiment of the invention, a computer processor system includes a plurality of multi-chip systems. Each multi-chip system includes a plurality of chips that are conjoined together, a local interconnection and input/output wiring layer. One or more multi-chip systems includes a plurality of processor chips that are conjoined together. A global interconnection network is connected to the local interconnection and input/output wiring layer of each multi-chip system to interconnect the multi-chip systems together. The plurality of multi-chip systems are edge-mounted to the substrate in parallel to each other.

These and embodiments will be described or become apparent from the following detailed description of embodiments thereof, which is to be read in conjunction with the accompanying drawings.

BRIEF DESCRIPTION OF THE DRAWINGS

FIG. 8 is a schematic perspective view of a 3-D stacked multiprocessor device comprising a pair of processors having identical processor layouts as depicted in FIG. 7, according to an exemplary embodiment of the invention.

FIG. 10 is a schematic perspective view of a 3-D stacked multiprocessor device according to yet another exemplary embodiment of the invention.

FIG. 20 shows a plurality of operating modes of the 3-D stacked processor structure of FIG. 19.

FIGS. 23A, 23B and 23C collectively illustrate a method for constructing a memory structure comprising multiple levels of memory with different access patterns, according to an exemplary embodiment of the invention.

FIG. 24 schematically illustrates a process for multiplying matrices stored in two memory 4×4 blocks A and B and storing matrix multiplication results in a 4×4 memory block C.

FIGS. 30A, 30B, and 30C schematically illustrate methods for accessing data in various dimensions using the exemplary 3-D memory structure of FIG. 29, according to exemplary embodiments of the invention.

FIG. 38 illustrates a 3-D computer processor system according to another embodiment of the invention.

DETAILED DESCRIPTION OF EMBODIMENTS

Exemplary embodiments of the invention will now be described in further detail with regard to 3-D multiprocessor devices that are formed by connecting processors in a stacked configuration, and methods for controlling 3-D stacked multiprocessor devices to selectively operate in one of multiple resource aggregating and sharing modes.

Figure 1:
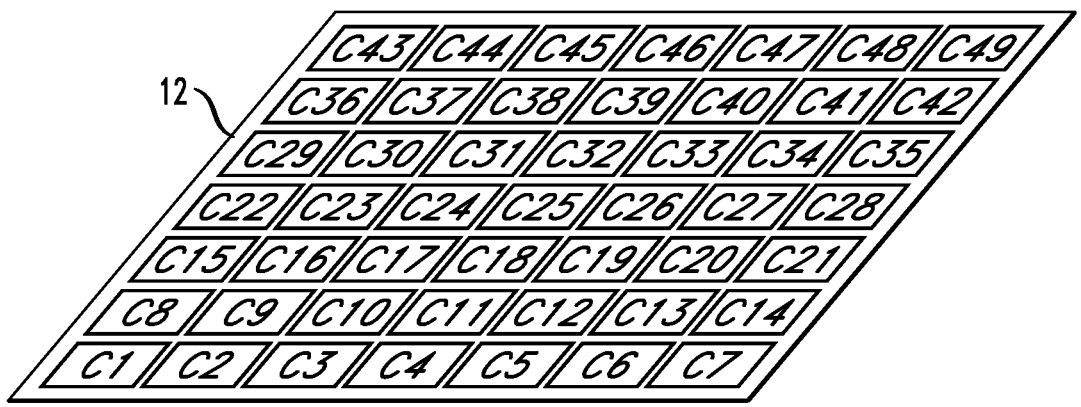
FIG. 1 is a schematic perspective view of a multiprocessor chip.

FIG. 1 is a schematic perspective view of a multiprocessor chip to which principles of the invention may be applied. In particular, FIG. 1 schematically illustrates a multiprocessor chip 10 comprising a semiconductor die 12 having a plurality of processors C1, C2, . . . , C49 (generally denoted Cn) formed on the die 12. The processors Cn are arranged in a "planar" system, wherein each processor Cn has its own dedicated footprint in a 2-D space. The processors Cn may be connected to each other in the 2-D plane using horizontal wiring and electrical interconnects that are formed as part of the BEOL (back end of line) structure of the chip 10, as is readily understood by those of ordinary skill in the art.

In a planar system as shown in FIG. 1, as the number of processors increases, communication between processors becomes problematic. For example, as the 2-D size of chip increases to accommodate more processors, the length of the horizontal wiring between the processors increases (in the range of mm or cm) resulting in cycle delays in the communication paths between processors. This cycle delay requires the use of high-powered on-chip drivers along the communication paths between processors. Furthermore, this cycle delay also increases with increasing operating frequency.

Principles of the invention utilize chip-stacking techniques to form 3-D stacked multiprocessor structures using multiple layers of processor chips wherein two or more processor chips are integrated into a single stacked system having a single-chip "footprint" (i.e., the stacked processor chips appear to be a single chip). The term "processor chip" as used herein refers to any semiconductor chip or die having one or more processors. The term "multiprocessor chip" as used herein refers to any semiconductor chip or die having two or more processors. In general, in a 3-D stacked structure, two or more chip layers includes processors that are aligned and interconnected using short vertical interconnects such that processors in one layer are aligned and vertically connected to corresponding processors in another layer. It is to be understood that when two different processors or processor components/elements on different processor chip layers are said to be "aligned" with each other, the term "aligned" means, for example, that the two different processors or processor component/elements at least partially overlap or fully overlap each other on the different layers. In this regard, two processors or components/elements of processors on different layers of processor chips can be fully aligned in that the processors or components are in the same 2-D positions of each plane within a 3-D stack of processor chips. Alternatively, the processors or components/elements of processors may be substantially aligned but with some offset between the 2-D positions of each plane within the 3-D stack of processor chips.

Figure 2:
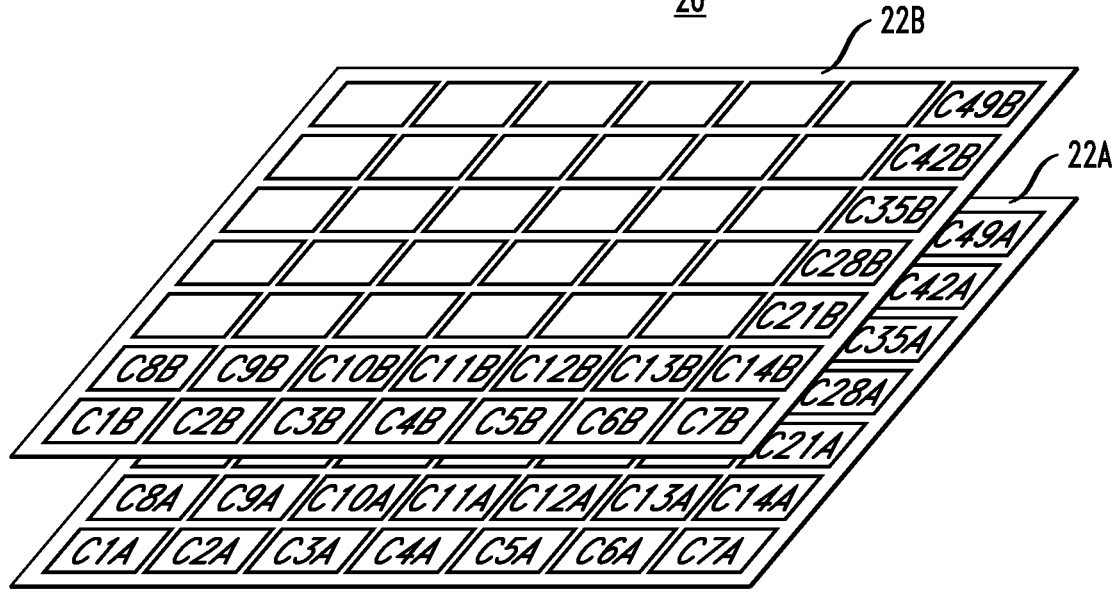
FIG. 2 is a schematic perspective view of a 3-D stacked multiprocessor structure according to an exemplary embodiment of the invention.

For example, FIG. 2 is a schematic perspective view of a 3-D stacked multiprocessor structure according to an exemplary embodiment of the invention. In particular, FIG. 2 schematically illustrates a 3-D stacked multiprocessor chip 20 comprising a first multiprocessor chip 22A and a second multiprocessor chip 22B vertically stacked on top of the first multiprocessor chip 22A. In the exemplary embodiment of FIG. 2, the multiprocessor chips 22A and 22B are substantially the same (identical in component structure, but may vary in interconnect structure), and are depicted as having 49 integrated processors, similar to the multiprocessor chip 10 depicted in FIG. 1. In particular, the first multiprocessor chip 22A comprises a plurality of processors C1A, C2A, ..., C49A and the second multiprocessor chip 22B comprises a plurality of processors C1B, C2B ..., C49B. The first and second multiprocessor chips 22A and 22B are vertically stacked on one another and connected to each other such that pairs of processors C1A/C1B, C2A/C2B, ..., C49A/C49B (generally, CnA/CnB) are aligned and connected to each other using vertical interconnects.

With the exemplary structure depicted in FIG. 2, each aligned processor stack CnA/CnB comprises a plurality of vertically connected processors that commonly share the same I/O connections. These I/O connections are multiplexed internally such that at each processor location in 2-D space, the plurality of vertically stacked (and connected) processors CnA/CnB logically appear (to other stacked processors) to operate and function as a single processor. Principles of the invention can be extended to include a plurality of 3-D stacked processor chips (such as shown in FIG. 2) packaged together on a package substrate. These principles will now be discussed in further detail with reference to FIGS. 3, 4, and 5.

Figure 3:
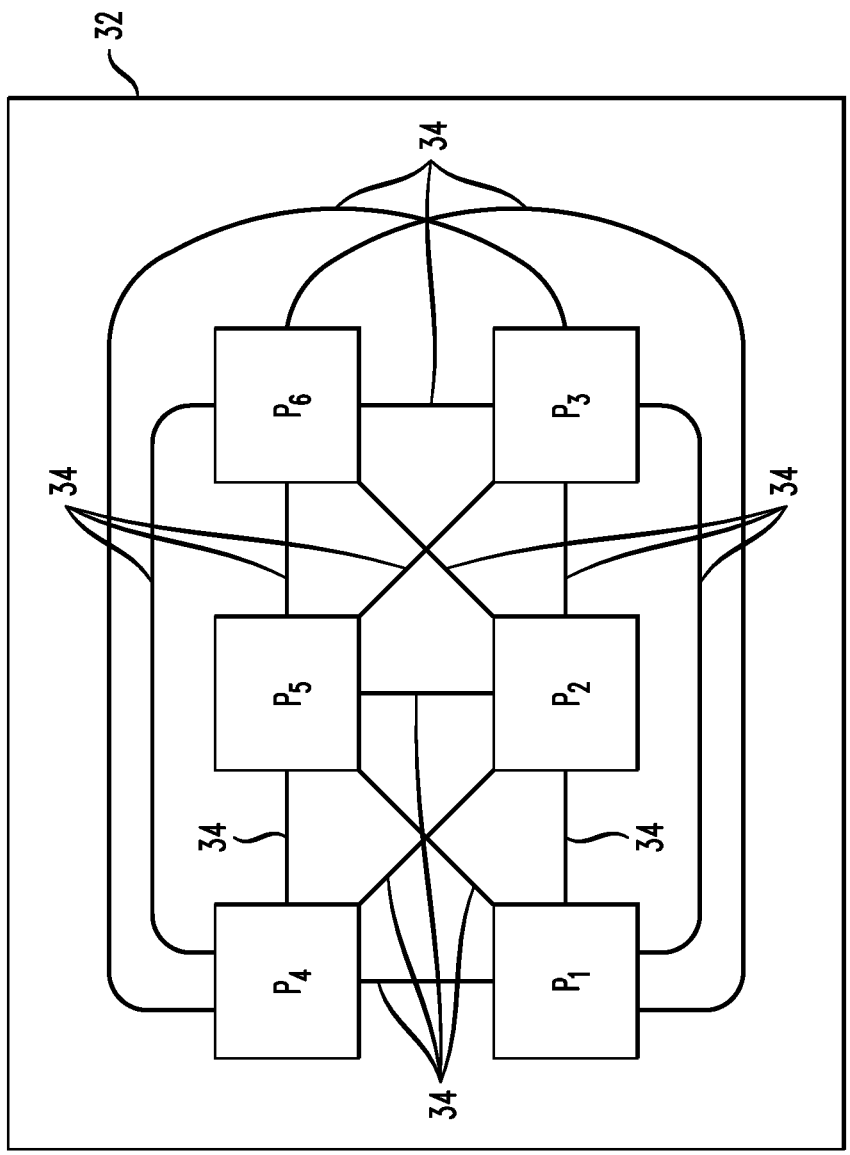
FIG. 3 is a schematic view of a chip package structure.

FIG. 3 is a schematic view of a chip package structure to which principles of the invention may be applied. In particular, FIG. 3 depicts a processor system 30 comprising a package substrate 32 and a plurality of processor chips P1, P2, P3, P4, P5 and P6 mounted on the package substrate 32. The package substrate 32 comprises a plurality of electrical interconnects and traces that form electrical wiring 34 which provides an all-to-all connection between the processor chips P1, P2, P3, P4, P5 and P6. Each of the processor chips P1, P2, P3, P4, P5, and P6 are identical and may be multiprocessor chips each having a plurality of processors.

Figure 4:
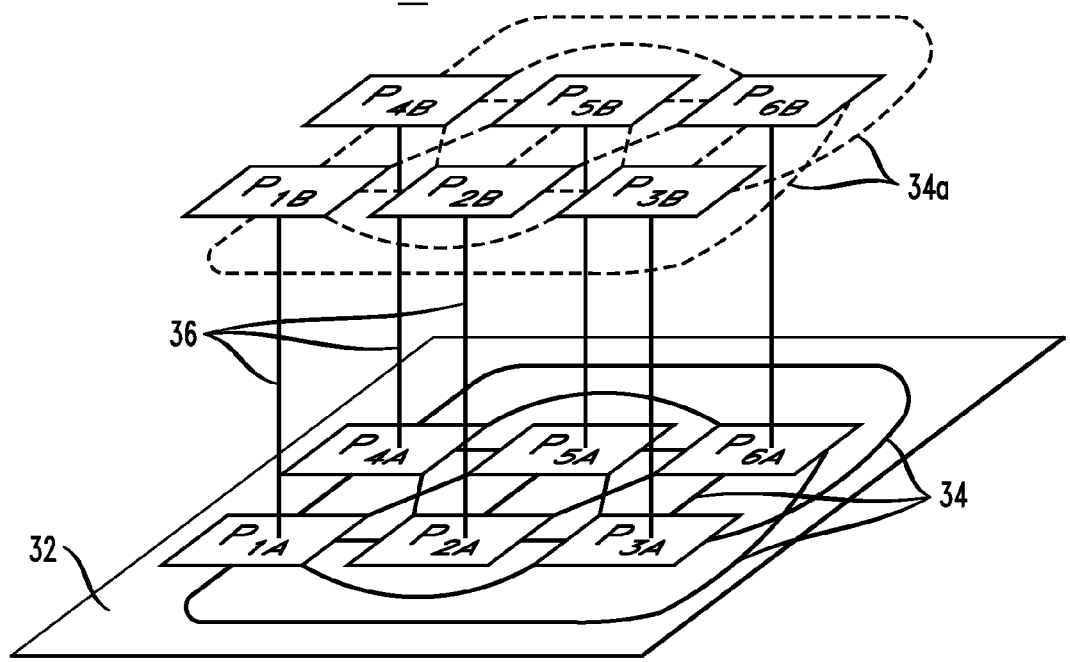
FIG. 4 conceptually illustrates a 3-D stacked multiprocessor structure according to another exemplary embodiment of the invention.
Figure 5:
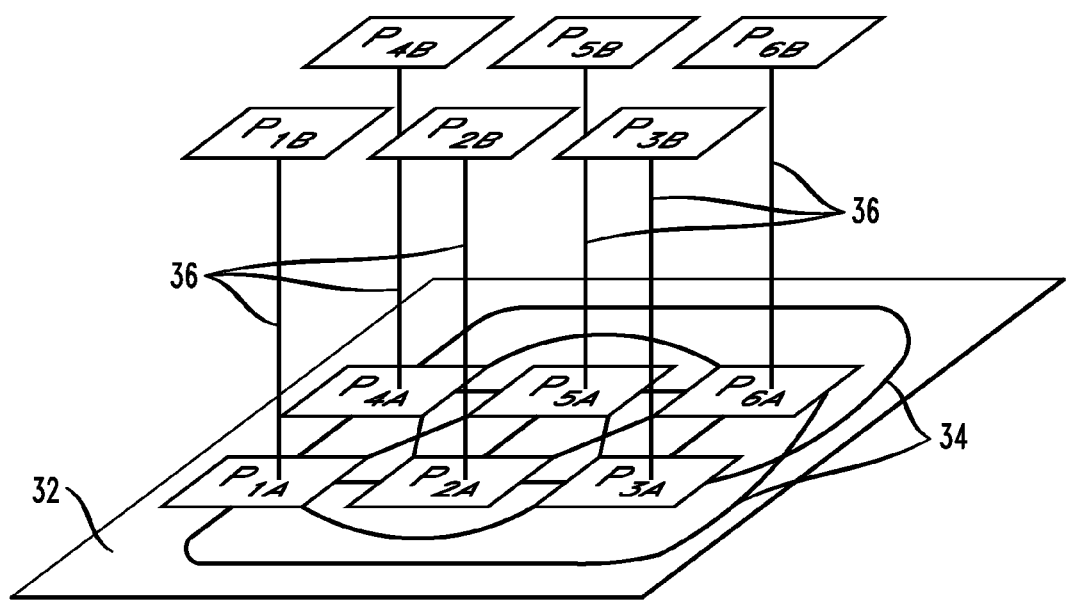
FIG. 5 schematically illustrates a physical implementation of a 3-D stacked multiprocessor structure, which is based on the conceptual implementation shown in FIG. 4, according to another exemplary embodiment of the invention.

FIGS. 4 and 5 schematically illustrate a 3-D stacked processor system according to another exemplary embodiment of the invention. In particular, FIG. 4 is a conceptual view of an exemplary 3-D stacked multiprocessor package structure 40. Similar to the package structure 30 depicted in FIG. 3, the 3-D stacked multiprocessor package structure 40 of FIG. 4 comprises a package substrate 32 and a plurality of first layer processor chips P1A, P2A, P3A, P4A, P5A and P6A mounted on the package substrate 32. The package substrate 32 comprises a plurality of electrical interconnects and traces that form electrical wiring 34 which provides an all-to-all connection between the processor chips P1A, P2A, P3A, P4A, P5A and P6A. Each of the processor chips P1A, P2A, P3A, P4A, P5A and P6A are identical and may be multiprocessor chips each having a plurality of processors.

As further shown in FIG. 4, a plurality of second layer processor chips P1B, P2B, P3B, P4B, P5B and P6B are vertically disposed and mounted on corresponding first layer processor chips P1A, P2A, P3A, P4A, P5A and P6A using short vertical connections 36. The second layer of processor chips P1B, P2B, P3B, P4B, P5B and P6B are identical to the corresponding first layer of processor chips P1A, P2A, P3A, P4A, P5A and P6A, and may be multiprocessor chips each having a plurality of processors. FIG. 4 depicts a plurality of dotted lines 34a that represent virtual all-to-all wiring between the processor chips P1B, P2B, P3B, P4B, P5B and P6B in the second package layer of chips. These virtual wires 34a do not physically exist, but rather represent that the second layer processor chips P1B, P2B, P3B, P4B, P5B and P6B are connected to each other and can communicate using the same physical wiring 34 that is formed on the package substrate 32.

FIG. 5 schematically illustrates a physical implementation of a 3-D stacked multiprocessor structure 50, which is based on the conceptual implementation shown in FIG. 4, according to another exemplary embodiment of the invention. As depicted in FIG. 5, the only wiring that physically exists in the 3-D stacked multiprocessor package structure 50 is the wiring 34 that is formed on the package substrate 32 and the short vertical interconnects 36 that are formed between the corresponding processor chip stacks P1A/P1B, P2A/P2B, P3A/P3B, P4A/P4B, P5A/P5B and P6A/P6B. In the 3-D stacked multiprocessor package structure 50 of FIG. 5, the processor chips within a given vertical stack P1A/P1B, P2A/P2B, P3A/P3B, P4A/P4B, P5A/P5B and P6A/P6B will communicate with each other using the vertical connections 36 that are formed between processor chips (and these vertical connections 36 include connections that are formed between corresponding aligned processors in different processor chip layers).

In accordance with exemplary embodiments of the invention, two processor chips can be conjoined using known semiconductor fabrication techniques wherein two identical processor chips can be bonded together "face-to-back" or "face-to-face". In a face-to-back configuration, the active surface (face) of a first processor chip is bonded to the non-active surface (back) of a second processor chip, wherein the processors and other corresponding elements of the two processor chips are aligned. With this structure, vertical wiring (e.g., conductive vias) can be formed in the active surface of the first processor chip and exposed as a first array of contact pads on the active surface of the first processor chip, and vertical wiring (e.g., through-silicon-vias) can be formed through the back side of the second processor chip and exposed as a second array of contact pads on the non-active surface of the second processor chip. The first and second array of contact pads can be soldered together when the first and second processor chips are conjoined face-to-back, thereby forming the short vertical connections between the aligned processor elements. To shorten the length of the vertical connections, the back side of the second processor chip can be ground down using known techniques, to make the die thinner.

In a "face-to-face" configuration, wherein two identical processor chips (identical in function) that are mirror images of each other are bonded such that the active surface (face) of a first processor chip is bonded to the active surface (face) of a second processor chip, with the processors and other elements of the two chips aligned. With this structure, vertical wiring (e.g., conductive vias) can be formed in the active surface of the first processor chip and exposed as a first array of contact pads on the active surface of the first processor chip, and vertical wiring can be formed in the active surface of the second processor chip and exposed as a second array of contact pads on the active surface of the second processor chip. The first and second array of contact pads can be soldered together when the first and second processor chips are conjoined face-to-face, thereby forming short vertical connections between the aligned processor elements.

With 3-D stacked processor systems, two or more processors that are approximately (or literally) co-located in their planar space, but lying on different layers, can operate independently or collaboratively by aggregating and/or sharing resources to augment functionality and to push operating thresholds, reliability, and performance further than what would be practical to do in a planar system where each chip has its own space on a 2-dimensional package. Various methods for controlling 3-D stacked multiprocessors to selectively operate in one or more multiple resource aggregating and/or sharing modes will be discussed in further detail below with reference to FIGS. 6-18. In general, exemplary methods for selectively controlling 3-D stacked multiprocessors enable a group of stacked processors to operate concurrently, yet independently of each other for certain applications. For other application as discussed below, two or more vertically stacked processors can be controlled to selectively operate in a collaborative fashion by sharing or aggregating resources (e.g., threads, execution units, caches, etc.) across the various layers, using the short vertical connections between the processor layers as fast communication paths, to provide enhanced operation.

Figure 6:
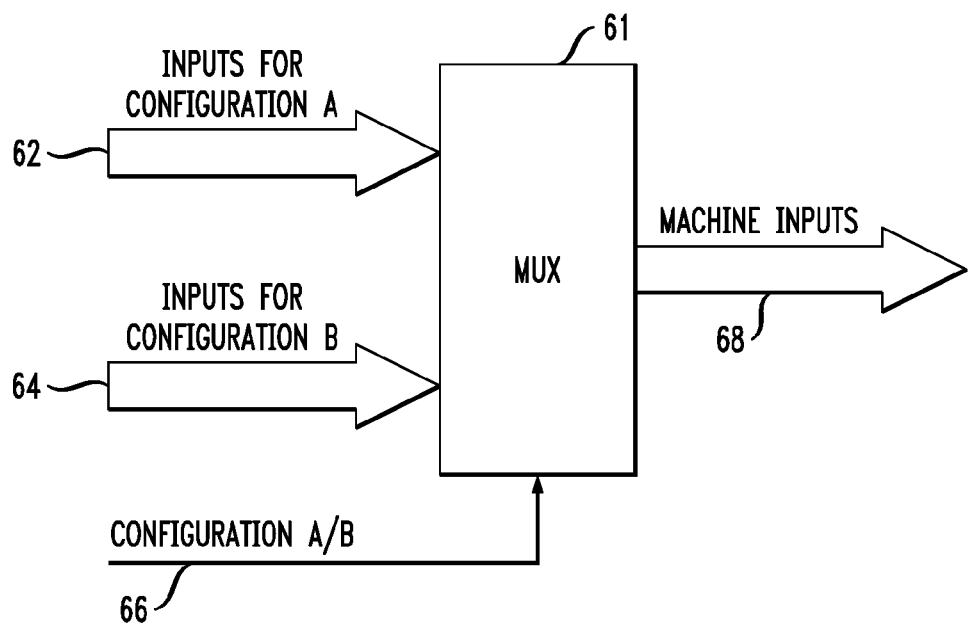
FIG. 6 schematically illustrates a method for controlling multimodal operation of a 3-D stacked multiprocessor structure, according to an exemplary embodiment of the invention.

In accordance with exemplary embodiments of the invention, control schemes are employed to control multimodal operation of two or more vertically stacked processors, so that the processors within a vertical stack can be selectively controlled to operate independently or in a collaborative manner. For example, FIG. 6 schematically illustrates a method for controlling the multimodal operation of a 3-D stacked multiprocessor structure according to an exemplary embodiment of the invention. In particular, a control scheme 60 as shown in FIG. 6 includes a multiplexer 61 that selectively receives as input a plurality of configuration parameter sets 62 and 64 and a configuration mode control signal 66. The different sets of configuration parameters A and B are selectively output as machine inputs 68 to a given vertical stack of processors, wherein the machine inputs configure the processor stack to operate in one of a plurality of different operating modes as specified by the machine inputs 68. Although two sets of input configuration parameters A and B are shown for ease of illustration, three or more different sets of configuration parameters can be input and selectively output by the multiplexer 61. It is to be understood that the control scheme of FIG. 6 is a system that is local to one processor stack, and that each processor stack in a given processor system will have a corresponding control circuit as shown in FIG. 6.

The control system 60 of FIG. 6 can be controlled by global control system, such as a service processor, that scans in the control information and outputs a configuration control signal 66 to each multiplexer 61 in the processor system to configure the processor stacks in a given manner. The machine inputs 68 that are output from each multiplexer 61 to a corresponding processor stack can be further multiplexed and/or decoded using circuitry that is internal (on-chip) to the vertically stacked processors to control various I/O ports (to be shared or bypassed) and other switches that may, be employed to control sharing and/or aggregating of resources between different layers of processors in a given processor stack.

In various exemplary embodiments of the invention as discussed below, when two or more processors in a vertical stack are spatially coincident, the processors and their components can be synergistically combined in various manners to give a processor-tupled system several new uses to enhance performance. Initially, it is to be noted that because a vertical processor stack places two or more processors (more or less—either exactly or approximately) right on top of each other, as an initial impression, this seems impractical because it doubles the heat associated with any hotspots, which tends to be mostly located in processors. In this regard, exemplary control schemes may be implemented to control the power of a stack of co-located processors by running the stacked processors at a lower power level by modulating the operating voltage and/or the operating frequency, for example, so that the total power (e.g. total power density, and/or total power consumption) is manageable.

More specifically, in one exemplary embodiment of the invention, a 3-D stacked processor device, which is fabricated by vertically stacking and connecting a plurality of processor chips, can be operated one of a plurality of operating modes to control power the 3-D stacked processor device. For example, in a 3-D stacked processor device having first and second processor chips, the 3-D stacked processor device can be selectively operated in a first mode wherein the first processor chip is turned on and a second processor chip is turned off. In the first mode, each processor of the first processor chip is turned on and may be operating at maximum frequency and full power, with a total power that can be supported by the package structure (e.g., the power density at certain hot spots is controlled so that the heat at a given hot spot in the package is not too excessive for the given package structure.)

In another mode of operation, the 3-D stacked processor device can be selectively operated in a second mode wherein both the first and second processor chips are turned on. In this instance, both processor chips can be operating at a maximum frequency and power level with a total power (e.g., power density or power consumption) that can be supported by the package structure. In another instance, in the second mode of operation, each processor of the first and second processor chips can operate at less than full power so that a total power of the 3-D stacked processor device is substantially the same as the total power of the 3-D stacked processor device when each processor of only the first processor chip or second processor chips operates at full power and/or maximum frequency. In other words, to obtain the same power consumption or power density profile, the processors in each of the processor chip layers can be operated at a lower supply voltage (or lower operating frequency) so that the aggregate power consumption is the same or similar to the first mode where the processors on only one processor chip layer are active.

A power control scheme according to principles of the invention is based on a realization that the power provided to a processor can be reduced by a significant percent (e.g., 50%) while only having to decrease the operating frequency of the processor by a much smaller amount (e.g., 10%). A power control scheme can be used to selectively control the power supply voltage of the processors or by adjusting the frequency of operation, each of which serves to adjust the overall power consumption of a processor chip. Thus, in 3-D stacked processor chip structure having multiple planes of processors, the ability to modulate the power supply voltage, and selectively power-off subsets of processor planes, allows there to be a range of operating modes in the system, including one or more modes in which multiple planes of processors are operated at a lower voltage so as to keep the total power substantially the same as the total power consumed when operating one plane of processors (or by maintaining the same power density at a given hotpot in the 3-D stacked process chip structure when operating multiple planes of processors a one plane of processors).

In a 3-D processor stack, each set of vertically stacked processors use the same set of interconnect signals, on-package as well as off-package, in each power control operating mode. In this regard, since each processor chip layer in a vertical stack shares the same interconnect signals, even when processor chips are operating at a lower frequency (in the second mode), there is less communication requirements (less I/O bandwidth) required. As such, principles of the invention which employ techniques for reusing (multiplexing) the interconnect signals and package I/O signals are motivated by the lower bandwidth requirements generated from each layer in the 3-D stack due to the lower frequency operation as demanded by the constraint to preserve the power consumption constant.

In other exemplary embodiments of the invention, in a processor system comprising two or more layers of stacked processor chips, wherein each processor chip includes one or more processors, wherein processors in different processor chip layers are connected through vertical connections between the different processor chip layers, a mode control circuit (such as shown and described above with reference to FIG. 6) can selectively configure two or more processors in different chip layers to operate in one of a plurality of operating modes. For example, in one operating mode, one or more or all of the processor chips within a given stack can be operated independently, wherein the vertical connections between layers of independently operating processor chips may be used as communication paths between independently operating processor chips within the stack.

In another mode of operation, various components/resources in different layers of processor chips can be aggregated to augment the microarchitecture of one or more processors on different layers of processor chips. As is readily understood by those of ordinary skill in the art, the term "microarchitecture" of a processor refers to the physical (hardware) configuration of a processor. The microarchitecture of a processor includes components such as caches, bus structure (path width), the arrangement and number of execution units, instruction units, arithmetic units, etc. For instance, assume a 3-D stacked processor chip device comprises a first processor chip having a first processor, and a second processor chip having a second processor. In one mode of operation, where the first and second processor chips are both active, a microarchitecture of the first processor of the first processor chip can be configured or augmented by aggregating elements from both the first and second processors, and a microarchitecture of the second processor of the second processor chip can be configured or augmented by aggregating elements from both the first and second processors. In another embodiment, the first processor chip can be active and the second processor chip can be inactive, wherein a microarchitecture of the first processor of the active first processor chip is augmented by utilizing a portion of the second processor of the inactive second processor chip. The aggregated element may be portions of executions units, register sets, caches, etc.

In another exemplary mode of operation, various components/resources in different layers of processor chips can be "shared" between different processors on different layers of processor chips. For instance, as explained below, two different processors on different layers of processor chips can combine their caches (e.g., L1, L2, or L3 caches) to create a cache that is double in size, yet actively shared by the two processors. In this instance, the aggregated (combined) components or resources are shared by the different processors. In yet another exemplary mode of operation, two or more different processors on different layers of processor chips in a given stack can be combined to operate a single processor image. Exemplary embodiments of the invention showing different modes of operation for aggregating and/or sharing and/or combining processor resources will be explained in further detail below with reference to FIGS. 7, 8, 9A, 9B, 9C, 10, 11, 12, 13, 14, 15, 16, 17A, 17B, 18, 19, 20 and 21.

Figure 7:
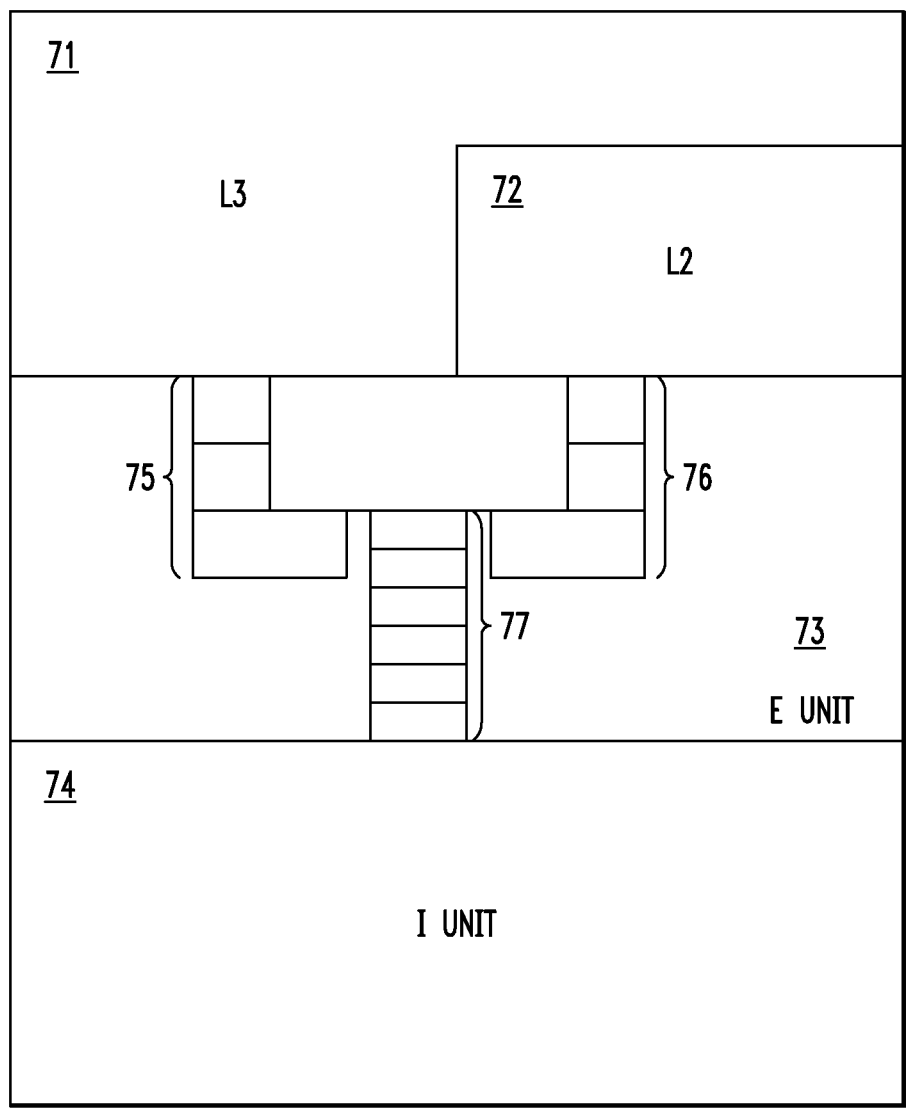
FIG. 7 is a schematic plan view of a processor to which principles of the invention may be applied.

For example, FIGS. 7 and 8 illustrate an exemplary mode of operation for selectively configuring different processors on different layers of processor chips to aggregate and/or share portions of the execution units of the different processor to enhance the execution capabilities of one or more of the different processors. FIG. 7 is a schematic plan view of a processor 70 to which principles of the invention may be applied. FIG. 7 schematically illustrates a microarchitecture of a processor 70, wherein the processor 70 comprises various components such as an L3 cache 71, an L2 cache 72, an execution unit 73 and an instruction unit 74. The execution unit 73 includes a first floating point unit 75 and a second floating point unit 76 (wherein the first and second floating point units 75 and 76 are identical) and a set of floating point registers 77. A 3-D stacked multiprocessor structure such as shown in FIG. 8 can be constructed using a plurality of the processors 70 of FIG. 7.

In particular, FIG. 8 is a schematic perspective view of a 3-D stacked multiprocessor device 80 comprising a first processor 70A and a second processor 70B vertically stacked on top of the first processor 70A. In the exemplary embodiment of FIG. 8, the processors 70A and 70B are identical in structure, and have a processor layout as depicted in FIG. 7. In particular, the first processor 70A comprises an L3 cache 71A an L2 cache 72A, an execution unit 73A and an instruction unit 74A. The execution unit 73A includes a first floating point unit 75A and a second floating point unit 76A (wherein the first and second floating point units 75A and 76A are identical) and a set of floating point registers 77A. Moreover, the second processor 70B comprises an L3 cache 71B an L2 cache 72B, an execution unit 73B and an instruction unit 74B. The execution unit 73B includes a first floating point unit 75B and a second floating point unit 76B (wherein the first and second floating point units 75B and 76B are identical) and a set of floating point registers 77B.

In one exemplary embodiment of the invention, the execution units 73A and 73B of the first and second processors 70A and 70B are aligned to each other and connected to each other using short vertical connections. With this structure, the execution units can be wired vertically so that for the two processors 70A and 70B shown in FIG. 8, the execution unit 73A of the first processor 70A can functionally include one-half of the elements of the execution units 73A/73B of the processor pair, and the execution unit 73B of the second processor 70B can functionally include the other one-half of the elements of the execution units 73A/73B of the processor pair, wherein each pair of halves being is chosen so as to minimize the planar area of each execution unit.

This 3-D aggregation of execution units is advantageous over conventional planar geometries. In a conventional planar system, the execution units of two processors lying in the same plane can be connected such that the output of one execution unit can be input to the second execution unit. However, the "horizontal" electrical interconnect between the execution units of the two processors can be relatively long (e.g., 5 mm-20 mm) such that there may be one or two "dead" cycles in the transmission of the signal between the processors, which results in an undesired delay in the signal transmission. In contrast, in the 3-D stacked processor-on-processor architecture such as shown in FIG. 8, half of the elements of the execution units on each processor are effectively aggregated into a new execution unit so that the execution unit in each plane is effectively smaller in area. Since the same elements of each processor are spatially co-located, the area of the aggregated components of both processors is achieved by vertically connecting the execution unit elements across the 3-D layers.

For example, in the exemplary embodiment of FIG. 8, assume that each processor 70A and 70B has two identical floating point units 75A/76A and 75B/76B. In the first processor plane 70A, it may take 1-2 cycles of latency to transmit a signal from the output of the first floating-point unit 75A to the input of the second floating-point unit 76A because of the horizontal distance between the floating point units 75A and 76A. If, however, the co-located pair of first floating point units 75A and 75B in both planes are vertically connected, and the co-located pair second floating point units 76A and 76B are vertically connected, then the execution unit 73A of the first processor 70A can utilize the vertically connected pair of first floating point units 75A and 75B, and the execution unit 73B of the second processor 70B can utilize the vertically connected pair of second floating point units 76A and 76B, so that the execution unit of each processor 70A and 70B still has two floating point units.

The vertical connections between the processor elements 75A and 76A and processor elements 75B and 76B provide shorter paths in the processor function, and allow each processor 70A and 70B to be constructed using elements from different planes of processors in the 3-D framework. This effectively decreases the planar geometry of each processor and removes dead cycles from the execution flow as the path from the output of one execution element (on one plane) to the input of the execution element (on another plane) is much faster. These principles can be applied to other aligned components of the execution units, such as arithmetic units, etc., as well as other processor elements such as the L2 an L3 caches, as will be explained in further detail below.

In other exemplary embodiments of the invention as depicted in FIG. 8, each of the processors 70A and 70B can be used independently of each other, wherein the vertical connections between the processor units across the processor layers would not be used to aggregate or share resources. For example, in one operating mode, both processors 70A or 70B can run (typically on unrelated programs) at reduced power (e.g., half power) so that the total power is substantially the same as it would be if only one processor 70A or 70B was operated at one time at full power. In another mode of operation, one of the processors 70A or 70B can be turned off and the other can be operated in a high-speed mode (or turbo mode) at twice the power, for example.

In another exemplary embodiment of the invention, in an enhanced "Turbo" mode of operation, one of processors 70A or 70B can be disabled (inactive), and the other can be operated in a high-speed mode (or turbo mode) at twice the power, but wherein certain elements of the execution unit of the inactive processor can be used by the active processor thereby enhancing its execution capabilities. For example, in the exemplary embodiment of FIG. 8, the second processor 70B (primary processor) can be turned on and running with increased power in a high-speed turbo mode, while the first processor 70A can be turned off, but wherein the microarchitecture of the second (active) processor 70B is augmented by using elements of the first (inactive) processor 70A By way of specific example, the floating point units 75A and 76A and registers 77A of the first (inactive) processor 70A can be utilized by the execution unit 73B of the second (active) processor 70B while operating in enhanced turbo mode so the second processor 70B can operate at increased speed with four floating-point units 75A, 75B, 76A, 76B and additional registers 77A. This augmented architecture allows the second processor 70B to run code that is more powerful faster and more efficiently. With this framework, the mode control scheme can be configured so that a given processor can be turned off, while allowing one or more components of the inactive processor to be selectively powered on and off by coupling or decoupling power lines to the desired components of the inactive processor.

In another exemplary embodiment of the invention, different caches in different layers of processor chips can be conjoined using vertical connections so that the processors can operate caches at any particular level in the cache hierarchy as a single shared cache. For example if two stacked processors have their L2 caches aligned and their L3 caches aligned, then the aligned pair of L2 caches can be operated as a single shared L2 cache having twice the capacity, and the aligned pair of L3 caches can be operated as a single shared L3 having twice the capacity. These principles will now be explained in further detail with reference to FIGS. 9A, 9B and 9C.

Figure 9A:
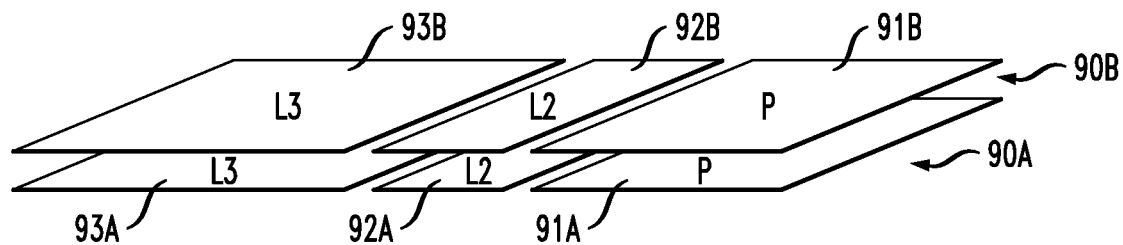
FIG. 9A is a schematic perspective view of a 3-D stacked multiprocessor device comprising first and second processors vertically stacked on top of each other having aligned L2 and L3 caches, according to an exemplary embodiment of the invention.

FIG. 9A is a schematic perspective view of a 3-D stacked multiprocessor device 90 comprising a first processor 90A and a second processor 90B vertically stacked on top of the first processor 90A. In the exemplary embodiment of FIG. 9A, the processors 90A and 90B are identical in structure, and have respective processor cores 91A and 91B, L2 caches 92A and 92B, and L3 caches 93A and 93B. As depicted in FIG. 9A, the L2 caches 92A and 92B are aligned and have the same footprint (2-D area). Moreover, the L3 caches 93A and 93B are aligned and have the same footprint. In this 3-D stacked framework, the aligned L2 caches 92A and 92B can be vertically connected and operated as a single shared L2 cache. Moreover, the aligned L3 caches 93A and 93B can be vertically connected and operated as a single shared L3 cache.

Figure 9B:
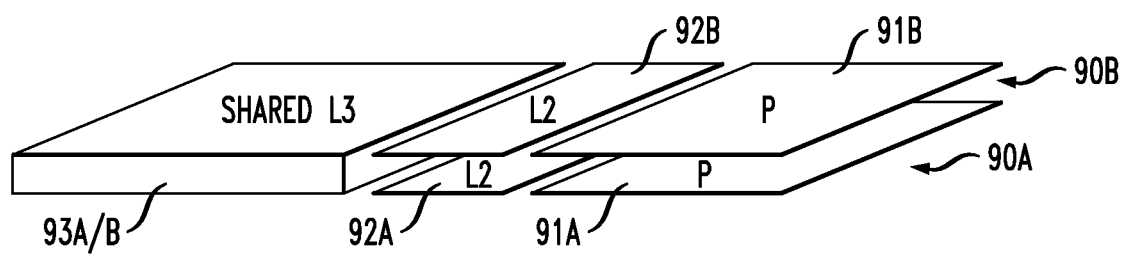
FIG. 9B is a schematic perspective view of the 3-D stacked multiprocessor device of FIG. 9A having the L3 caches conjoined for operation as a shared L3 cache by the first and second processors, according to an exemplary embodiment of the invention.
Figure 9C:
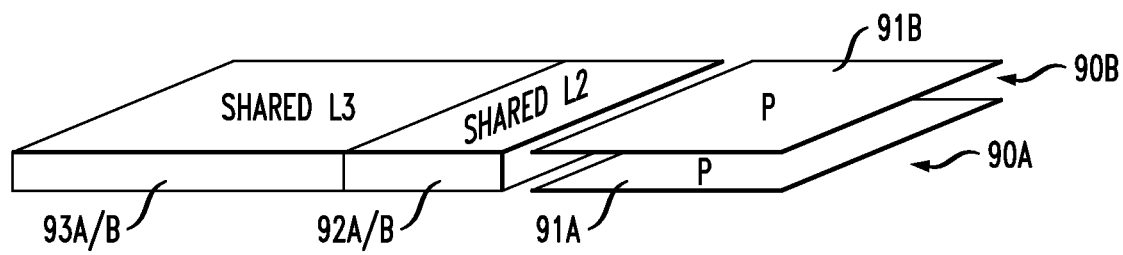
FIG. 9C is a schematic perspective view of the 3-D stacked multiprocessor device of FIG. 9A having the L3 caches as well as L2 caches conjoined for operation as a shared L2 cache and shared L3 cache by the first and second processors, according to an exemplary embodiment of the invention.

For instance, FIG. 9B is a schematic perspective view of the 3-D stacked multiprocessor device 90 of FIG. 9A, wherein the L3 caches 93A and 93B are conjoined and can operated by one or both of the processors 90A and 90B as a shared L3 cache 93A/B. Similarly, FIG. 9C is a schematic perspective view of the 3-D stacked multiprocessor device 90 of FIG. 9A, wherein the L2 caches 92A and 92B are also conjoined and can be operated by one or both of the processors 90A and 90B as a shared L2 cache 92A/B. In particular, in one exemplary embodiment wherein the L2 and L3 caches of the processors 90A and 90B are vertically connected together, the L2 and L3 caches can be used in two alternative modes—either as independent caches wherein the connections between them across layers are not used, or shared across the layers thereby enhancing the cache capacity of all the processors in the layers.

An advantage to a 3-D stacked cache framework is that the storage capacity of the caches is doubled without increasing the cache access time. Indeed, the speed of access to a cache is generally known to be proportional to the square root of the cache area. In the exemplary embodiments shown in FIGS. 9B and 9C, vertically connecting the aligned L2 and L3 caches does not increase the cache area as the footprints of the corresponding L2 and L3 caches are spatially coincident. In this regard, since area of the conjoined L2 caches 92A/B and the area of the conjoined L3 caches 93A/B does not increase by virtue of the vertical connections, the cache access speed remains the same. In order to enable access to the same cache address space for the processors 90A and 90B running different programs, cache control schemes can be readily implemented to control and organize the shared cached directory and to maintain cache coherence between the various cache layers.

In another exemplary embodiment of the invention, 3-D stacked processor device can be constructed to include a plurality of processors that are conjoinable to increase a number of threads that are supposed by a single processor image within the 3-D stack of processors. For example, in a 3-D stacked processor device comprising a first processor chip having a first processor, and a second processor chip having a second processor, both the first and second processor chips can be active, wherein the first and second processors are configured to operate as a single processor and aggregate their threads to increase an amount of threads that are usable by the first and second processors. This allows the multithreading capability of a single processor within the 3-D stacked to be effectively increased without requiring overhead (threads) associated with having to employ additional threads on the single processor itself. These principles will now be explained in further with reference to FIGS. 10 and 11.

FIG. 10 is a schematic perspective view of a 3-D stacked processor device 100 comprising a first processor 100A and a second processor 100B vertically stacked on top of the first processor 100A. In the exemplary embodiment of FIG. 10, the first and second processors 100A and 100B are multi-threaded processors, and have identical processors and resister sets. In particular, the first processor 100A comprises four sets of registers 101A, 102A, 103A and 104A to implement four threads. Similarly, the second processor 100B comprises four sets of registers 101B, 102B, 103B and 104B to implement four threads.

In the exemplary embodiment of FIG. 10, by vertically aligning and connecting the processors 100A and 100B, the 3-D processor stack can be operated in aggregation as a single multithreaded processor having correspondingly more threads. For example, in the example of FIG. 10, the four threads 101A, 101B, 102A, 102B, 103A, 103B, 104A and 104B of the two processors 100A and 100B can be run jointly so that the 3-D processor stack 100 appears to be a single processor running eight threads. Independently, for system-level arbitration in 3-D, when two or more processors are aligned, that set of processors will appear as a single node in the system's arbitration scheme. In this way, an arbitration "tree" as discussed below, for example, does not grow in complexity when additional processors are added in new stacked planes.

For a conventional planar system, processors can be fabricated with an increasing number of independent register sets to implement more threads that can be concurrently operated to increase the processing capability for multiple programs. However, as the number of threads per processor increases, the planar dimensions of the processor increases, resulting in cycle delays in communications between the resister sets and processor execution units, as well as increased power. With a 3-D stacked architecture such as shown in FIG. 10, the processors can be simplified with less register sets to support fewer threads per processor, while aggregating the thread between processor layers, as needed to increase the overall number of threads that a given layer can utilize. For instance, assuming most workloads for a given application operate with four or fewer threads, the processors 100A and 100B as shown in FIG. 10 can be optimized as four-thread processors. If a given workload requires more than four threads (up to 8 threads) to be executed, then the processors 100A and 100B within the 3-D processor stack 100 could be combined and operated as a single processor having eight threads.

In the exemplary embodiment of FIG. 10, control schemes and communication path are implemented to support the aggregation of threads across the different layers and to connect the caches between the layers and maintain cache coherence. These control schemes are communication path are designed so that each of the processors will see the same state when the threads in different layers actually share their address spaces. These concepts are schematically shown in FIG. 11.

Figure 11:
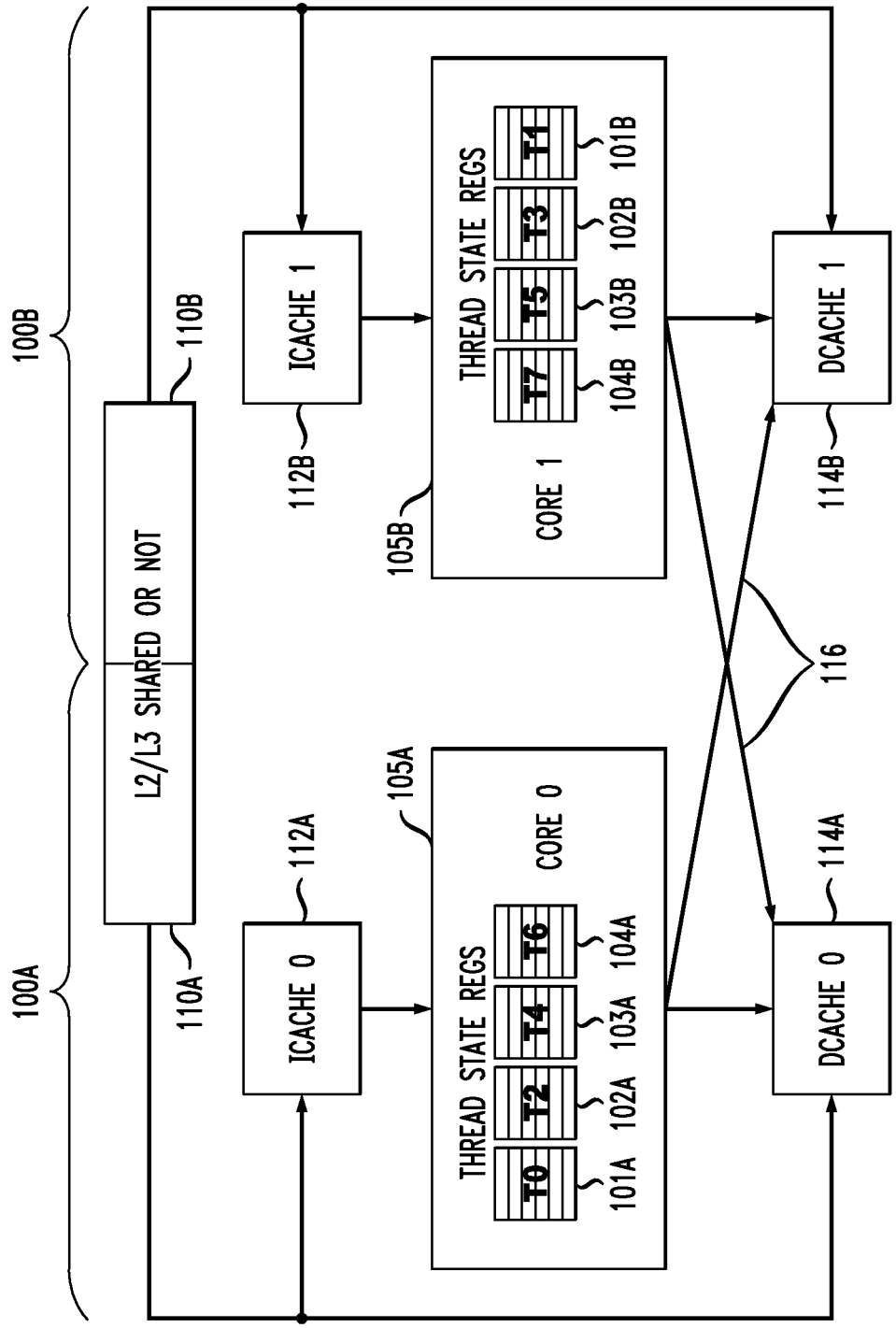
FIG. 11 schematically illustrates communication paths between various components of the processors shown in FIG. 10, according to an exemplary embodiment of the invention.

In particular, FIG. 11 schematically illustrates communication paths between various components of the processors shown in FIG. 10, according to an exemplary embodiment of the invention. As depicted in FIG. 11, the first processor 100A comprises a plurality register sets 101A, 102A, 103A and 104A (also denoted T0, T2, T4 and T6, respectively) that are associated with a first processor unit 105A, an L2 and L3 cache 110A, an instruction cache 112A, and a data cache 114A. Similarly, the second processor 100B comprises a plurality register sets 101B, 102B, 103B and 104B (also denoted T1, T3, T5 and T7, respectively) that are associated with a second processor unit 105B, an L2 and L3 cache 110B, an instruction cache 112B, and a data cache 114B.

The instruction caches 112A and 112B and data caches 114A and 114B receive program instructions and data that are stored in the respective L2 or L3 caches 110A and/or 110B. The L2 and/or L3 caches 110A and/or 110B can be conjoined and shared as discussed above with reference to FIG. 9C, for example. The program instructions that are stored in the instruction caches 112A and 112B are executed by respective processors 105A and 105B for one or more threads, and the execution state for a given thread is stored in a respective one of the thread state registers T0, T1, T2, T3, T4, T5, T6, T7. As data is generated from execution of the program instructions, the processor 105A stores data in its data cache 114A and the processor 105B stores data in its respective data cache 114B. In accordance with principles of the present invention, additional communication paths 116 across the layers between the processors 105A and 105B and the data caches 114A and 114B are utilized to facilitate consistent stores. This communication path 116 can be implemented processor-on-processor, because the ports are spatially collocated when the processors are aligned.

Although the exemplary embodiments of FIGS. 10 and 11 illustrate processors each having register sets to support 4 operating threads, principles of the invention can be readily extended to each processor having n threads, wherein if each processor is n-way multithreaded, the processor pair can be run as a 2n-way multithreaded processor, as seen by the rest of the system. Again, with this implementation, it is particularly useful when running n threads most of the time (where each processor is not heavily threaded) and thereby allowing the basic processor to be optimized for n-thread operation, but having the capability to extend the system to run 2n threads when needed.

As noted above, when two or more processors are aligned in a 3-D stacked configuration, the processors will appear as a single node in the system's arbitration scheme. With this framework, an arbitration "tree" (or more generally, processor interconnect structure) can be constructed so that does not grow in complexity when additional processors are added in new stacked planes. Exemplary processor interconnect structures according to principles of the invention will now be discussed in further detail with reference to FIGS. 12, 13, 14, 15, and 16.

Figure 12:
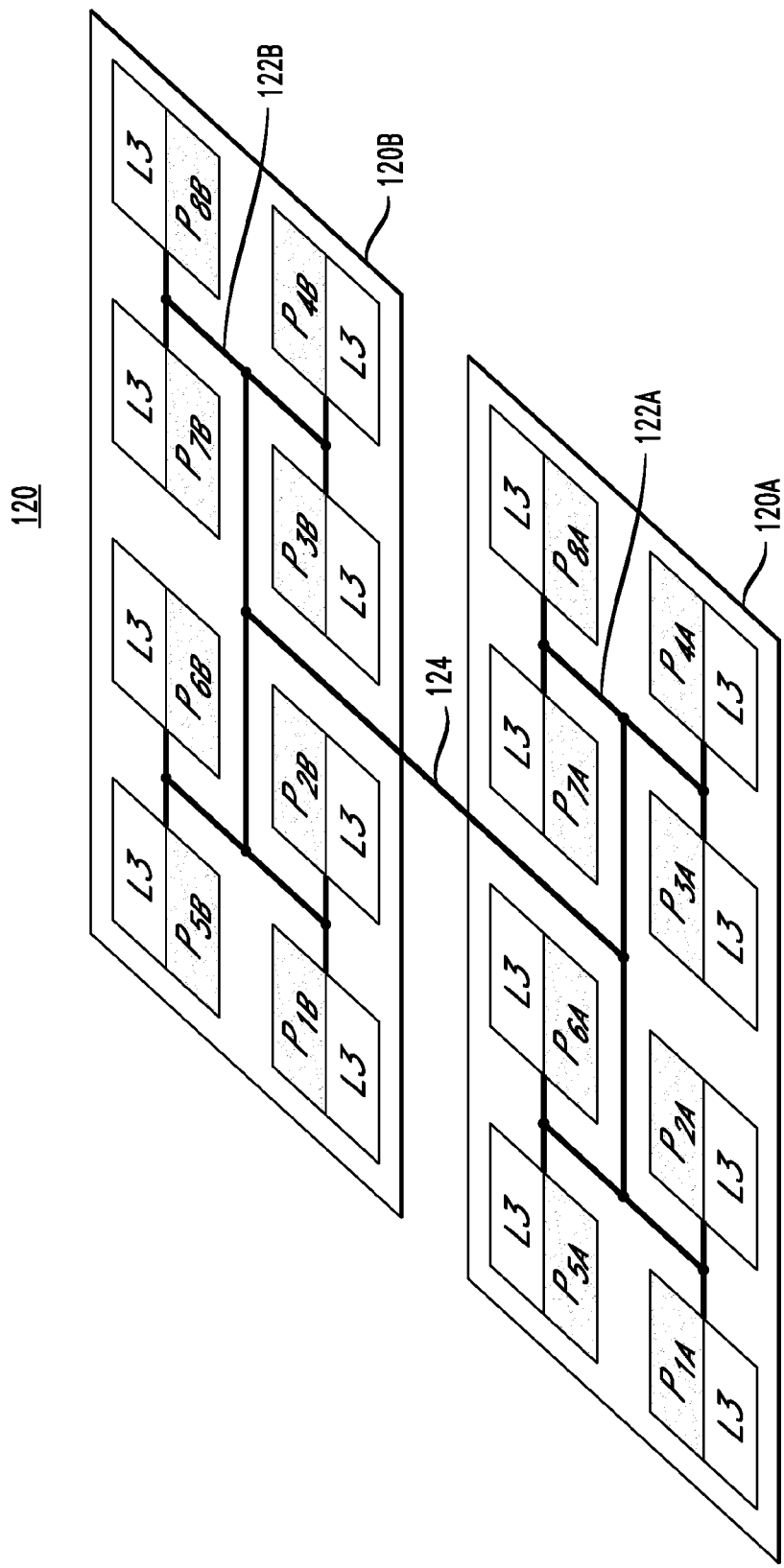
FIG. 12 schematically illustrates a processor interconnect structure for a planar processor system.

FIG. 12 schematically illustrates a processor interconnect scheme for a planar processor system. In particular, FIG. 12 illustrates a planar processor system 120 comprising a first processor 120A and a second processor 120B that are disposed on the same plane. The first processor 120A includes a plurality of processors P1A, P2A, P3A, P4A, P5A, P6A, P7A and P8A (collectively, PnA) and respective L3 caches. The processors PnA of the first processor 120A communicate over a processor interconnect structure 122A. Similarly, the second processor 120B includes a plurality of processors P1B, P2B, P3B, P4B, P5B, P6B, P7B and P8B (collectively, PnB) and respective L3 caches. The processors PnB of the second processor 120A communicate over a processor interconnect structure 122B. In the example embodiment of FIG. 12, the processor interconnect structures 122A and 122B are depicted as "tree" structures that implement a standard arbitration scheme.

Figure 13:
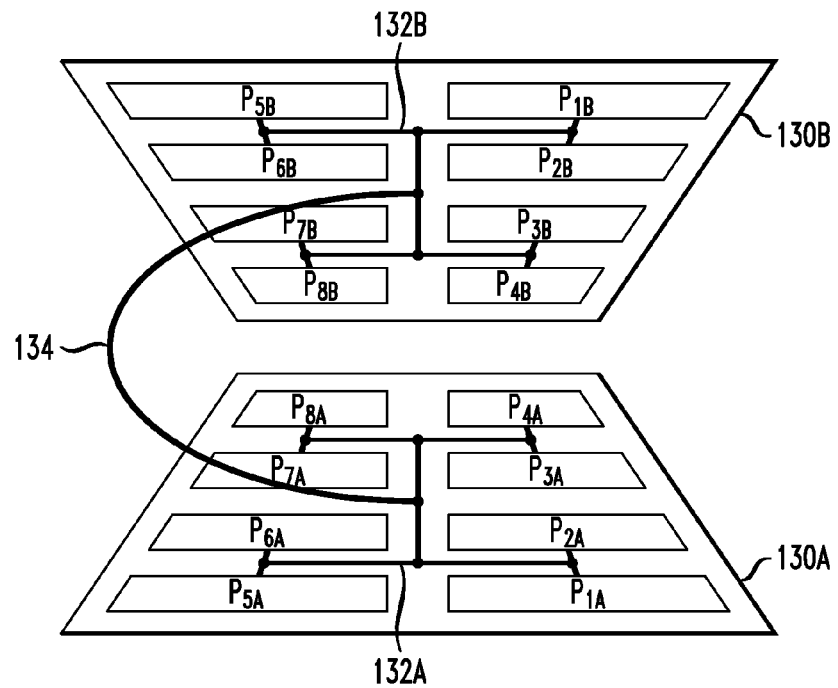
FIG. 13 schematically illustrates a processor interconnect structure for a 3-D stacked multiprocessor system according to an exemplary embodiment of the invention.

Further, as depicted in FIG. 12, the communication busses 122A and 122B are interconnected using an bus interconnect structure 124. In the planar system 120 of FIG. 12, this bus interconnect structure 124 is relatively long in the 2-D plane. Accordingly to principles of the invention, this processor interconnect structure can be more simplified in a 3-D stacked framework, such as depicted in FIG. 13. In particular, FIG. 13 schematically illustrates a processor interconnect scheme for a 3-D stacked multiprocessor system according to an exemplary embodiment of the invention. In particular, FIG. 13 illustrates a planar processor system 130 comprising a first processor 130A and a second processor 130B which is disposed on top of the first processor 130A. The first processor 130A includes a plurality of processors P1A, P2A, ..., P8A (collectively, PnA), which are interconnected and communicate using a processor interconnect structure 132A. Similarly, the second processor 130B includes a plurality of processors P1B, P2B, ..., P8B (collectively, PnB), which are interconnected and communicate using a processor interconnect structure 132B. The processor interconnect structures 132A and 132B are depicted as "tree" structures that implement a standard arbitration scheme.

As further depicted in FIG. 13, the processor interconnect structures 132A and 132B are interconnected using a connecting bus structure 134. The overall processor interconnect scheme of FIG. 13 is similar in concept to the overall processor interconnect scheme of FIG. 12 except that the bus connecting structure 134 (which connects the processor interconnect structures 132A and 132B) is formed using vertical connections between the stacked processor chips 130A and 130B. In this regard, the vertical connecting bus structure 134 is much shorter in length than the planar connecting bus structure 124 depicted in FIG. 12. As such, the overall processor interconnect scheme in FIG. 13 is effectively smaller and faster than the overall processor interconnect scheme depicted in FIG. 12.

Figure 14:
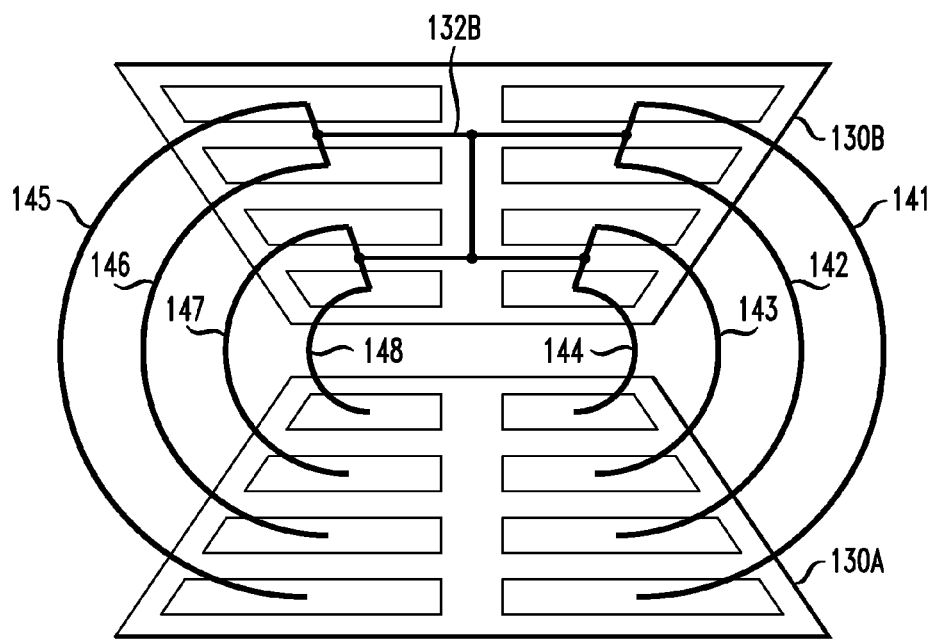
FIG. 14 schematically illustrates a processor interconnect structure for a 3-D stacked multiprocessor system according to another exemplary embodiment of the invention.

FIG. 14 schematically illustrates a processor interconnect scheme for a 3-D stacked multiprocessor system according to another exemplary embodiment of the invention. FIG. 14 schematically illustrates a 3-D stacked processor structure 140 having a processor interconnect framework that is topologically equivalent to the processor interconnect framework of the 3-D stacked processor of FIG. 13, but faster and more simplified in terms of size. More specifically, as shown in FIG. 14, a processor interconnect scheme is implemented using a tree structure 132B on the second processor chip 130B and a plurality of vertical bus connections 141, 142, 143, 144, 145, 146, 147 and 148, which extend from endpoints of the tree buss structure 132B on the second processor, chip 130B to respective processors on the first processor chip 130A. The processor interconnect scheme of FIG. 14 takes into consideration that the processors on the first and second processor chips 130A and 130B are aligned to each other, such that the terminal end points of the tree bus structures 132A and 132B of the first and second processor chips 130A and 130B (see FIG. 13) are also aligned. With this vertical alignment, the vertical bus connections 141, 142, 143, 144, 145, 146, 147 and 148 (as shown in FIG. 14) can be implemented in place of the single vertical bus interconnect 134 (as shown in FIG. 13). Indeed, since each terminal point of the bus tree structure 132B on the upper processor chip 130B is aligned to the terminal point of the bus tree structure 132A on the lower processor chip 130A, the terminal points of the two tree structures 132A and 132B can be connected using short vertical connections, which then allows one of the tree structures 132A and 132B to be disregarded and not used. These principles are further discussed and illustrated with reference now to FIG. 15.

Figure 15:
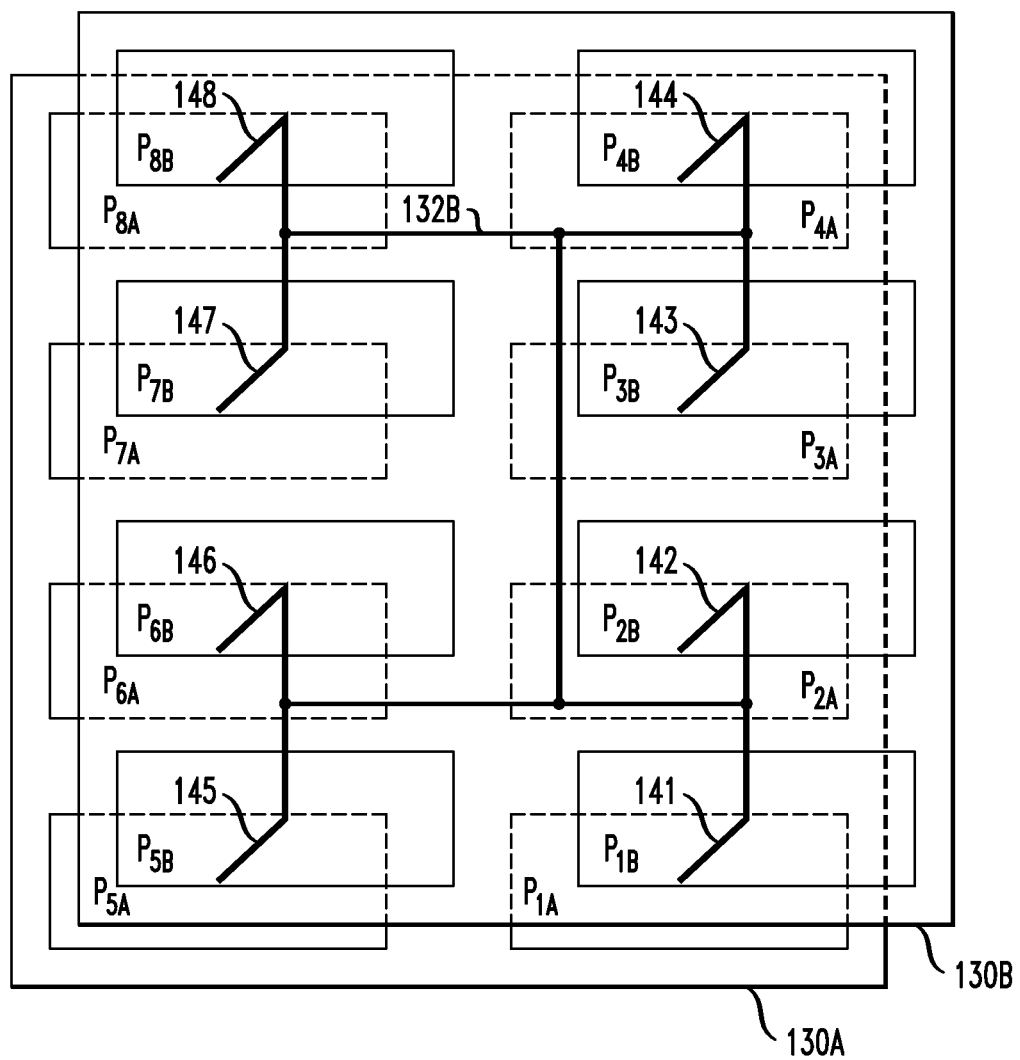
FIG. 15 is a schematic top perspective view of a 3-D stacked multiprocessor system according to an exemplary embodiment of the invention having a processor interconnect structure that is based on the processor interconnect structure of FIG. 14.

In particular, FIG. 15 is a schematic top perspective view of a 3-D stacked multiprocessor system according to an exemplary embodiment of the invention having a processor interconnect structure that is based on the processor interconnect structure scheme of FIG. 14. FIG. 15 illustrates a 3-D stacked multiprocessor system 150 that is a physical implementation of the conceptual system shown in FIG. 14, wherein the processors PnA on the lower processor chip 130A and processors PnB on the upper processor chip 130B are aligned with the terminal end points of the bus tree structure 132B. This allows the bus tree structure 132B to be connected to pairs of processors P1A/P1B, P2A/P2B, P3A/P3B, P4A/P4B, P5A/P5B, P6A/P6B, P7A/P7B, and P8A/P8B at each end point terminal of the buss tree structure 123B using short vertical conductive via connections 141, 142, 143, 144, 145, 146, 147 and 148, respectively. Because these vertical conducive via interconnects are relatively short, each upper/lower pair of processors can be treated as a single vertical drop on the global bus 132B. Again, the use of the vertical vias 141, 142, ..., 148 provide shorter communication paths between aligned processors, as compared to the single vertical buss connect structure 134 shown in FIG. 13.

Figure 16:
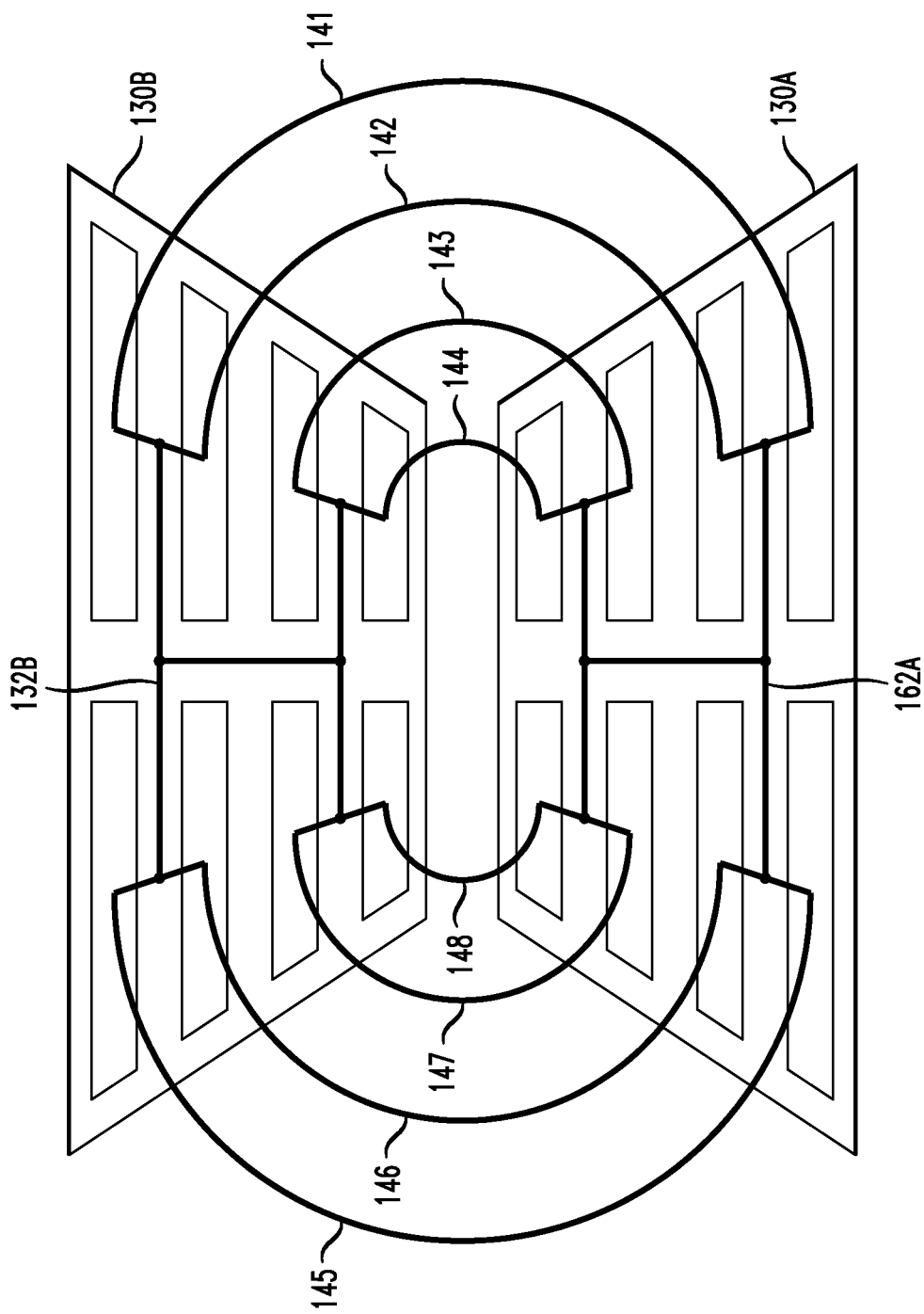
FIG. 16 schematically illustrates a processor interconnect structure for a 3-D stacked multiprocessor system according to yet another exemplary embodiment of the invention.

FIG. 16 schematically illustrates a processor interconnect structure for a 3-D stacked multiprocessor system according to yet another exemplary embodiment of the invention. FIG. 16 schematically illustrates a 3-D stacked processor structure 160 having a bus framework that is similar to that of FIG. 14, except for the inclusion and use of an additional tree structure 162A on the lower processor chip 130A. The additional tree structure 162A can be used to shorten the communication path between in-plane processors and augment communication bandwidth. In particular, in the exemplary embodiment of FIG. 16, the tree structure 162A can be used for processor-to-processor communication between processors PnA on the first processor chip 130A without having to use the short vertical buss interconnects 141, 142, ..., 148 or the upper tree structure 132B. Similarly, the tree structure 132B can be used for processor-to-processor communication between processors PnB on the second processor chip 130B without having to use the short vertical buss interconnects 141, 142, 148 or the lower buss tree structure 162A.

In another control scheme, both tree structures 162A and 132B can be used concurrently in conjunction with the short vertical interconnects 141, 142, ..., 148 to provide two independent communication paths between any two processors so that 2× increase in communication bandwidth may be realized. Indeed, assume that each tree structure 132B and 162A is a 16-byte bus, which requires 16 cycles to communicate 256 bytes of information between processors. In this embodiment, the communication bandwidth can be increased to 32 bytes by concurrently using two separate communication paths between any two processors to send 32 bytes (16 bytes per path) at same time, thereby increasing communication bandwidth to 512 bytes of information for 16 cycles.

In another exemplary embodiment of the invention, a 3-D stacked multiprocessor device can be constructed to include a plurality of processors that are conjoinable and configured as a single hyper-fast processor by selectively combining the fastest components of each vertically stacked processor. With advanced technology, there can be considerable variation in device performance between identical processors, wherein some subsystems of one processor may be faster than the same subsystems of another identical processor, while at the same time, the relationship could be the opposite for different subsystems. Indeed, based on variations of device dimensions and shapes, and doping variations, etc., a set of identical processors that are formed on given wafer, having identical layout and macro functional components, can have faster or slower components than the same components of another identical processor.

In this regard, in accordance with another exemplary embodiment of the invention, when two processors (a first and second processor) on different layers of processor chips have an identical layout of subsystem regions, in one mode of operation, the first and second processors can be configured to operate as a single processor by combining faster ones of corresponding subsystem regions of the first and second processors and by turning off slower ones of corresponding subsystem regions of the first and second processors. These principles will now be illustrated and discussed in further detail with reference to FIGS. 17A and 17B.

Figure 17B:
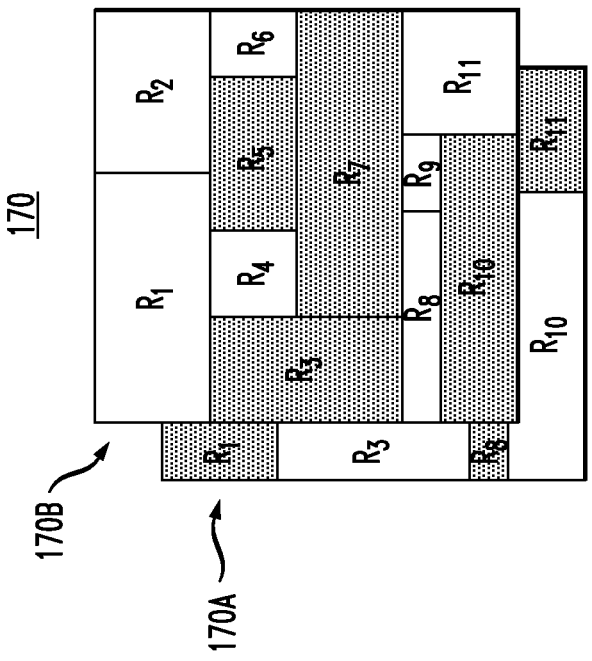
FIG. 17B schematically illustrates a 3-D stacked processor structure that is formed by vertically stacking the two processors shown in FIG. 17A, and operated as a single processor that is composed of the fastest of the corresponding regions of each processor, according to an exemplary embodiment of the invention.
Figure 17A:
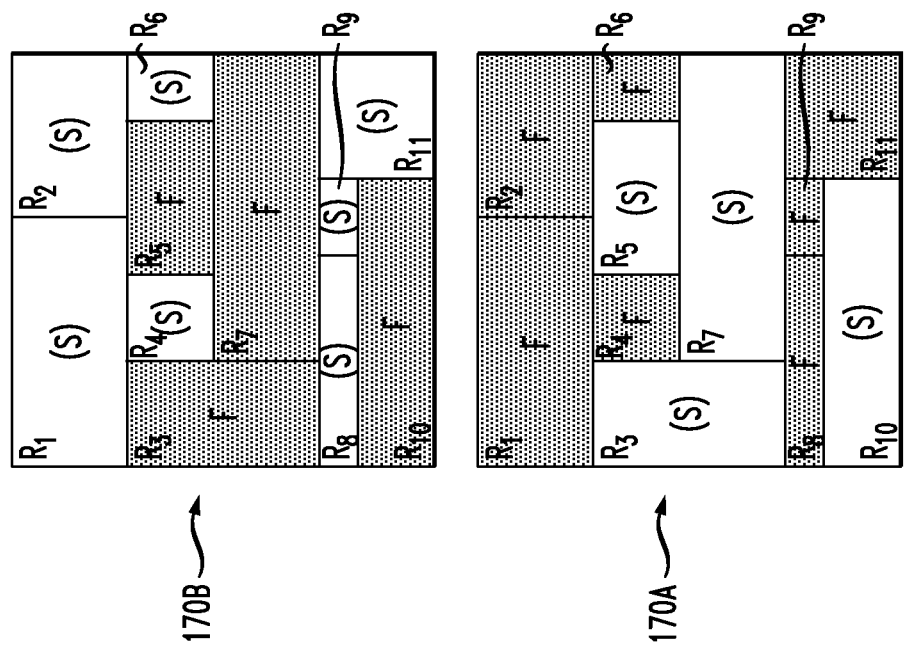
FIG. 17A schematically illustrates two processors having identical layouts according to an exemplary embodiment of the invention, wherein corresponding regions of the two identical processors are identified as being faster or slower than its counterpart region.

In particular, FIG. 17A schematically illustrates two processors having identical layouts according to an exemplary embodiment of the invention, wherein corresponding regions of the two identical processors are identified as being faster or slower than its counterpart region. In particular, FIG. 17A illustrates two identical processors 170A and 170 having eleven identical major regions (macros) R1, R2, R3, R4, R5, R6, R7, R8, R9 and R11. After fabrication, these regions of the processor are tested for speed because while the processors are the same, some regions of a given will be faster/slower than the same region of another identical processor. In the exemplary embodiment of FIG. 17A, regions R1, R2, R4, R6, R8, R9 and R11 of the first processor 170A are identified as being faster (labeled "F") than the same regions on the identical processor 170B. Moreover, regions R2, R5, R7, and R10 of the second processor 170B are identified as being faster (labeled "F") than the same regions on the identical processor 170A.

FIG. 17B a schematic view of a 3-D stacked multiprocessor system 170 according to an exemplary embodiment of the invention which includes the processors 170A and 170B of FIG. 17A. In particular, FIG. 17B schematically illustrates a 3-D stacked processor structure that is formed by vertically stacking the two processors shown in FIG. 17A, and operated as a single processor that is composed of the fastest of the corresponding regions of each processor, according to an exemplary embodiment of the invention. In FIG. 17, the processors are aligned and vertically connected such that corresponding regions R1, R2, . . . , R11 are aligned and connected to each other. The caches and execution resources of the two processors 170A and 170B are vertically connected so that the 3-D stacked processor system 170 can be operated in one of a plurality of modes.

For instance, in one mode, the processors 170A and 170B can be operated as independent processors wherein each processor is active and operating at half power, as discussed above. In another exemplary embodiment, one of the processors 170A or 170B can be operated at full power or enhanced power (Turbo Mode), while the other processor is turned off. In yet another embodiment, the processors 170A and 170B can be operated as a single processor that includes those regions from each processor that are identified as being the fastest version of that region, so that the resulting processor can operate as a single ultrafast processor with a speed that is faster than if using all the components from just one processor layer. For instance, in the exemplary embodiment of FIG. 17B, the 3-D stacked processor structure 170 can be operated as a single processor comprising 11 regions consisting of the fast regions R1, R2, R4, R6, R8, R9 and R11 of the first processor 170A and the fast regions R2, R5, R7, and R10 of the second processor 170B.

In another exemplary embodiment of the invention, a 3-D stacked multiprocessor device can have a plurality of conjoined processors that operate logically as a single processor image, but wherein at least one processor is utilized for a "run-ahead" functionality. In particular, by way of example, in a 3-D stacked multiprocessor device having first and second stacked processors that are aligned and vertically connected to each other, the first processor can be a primary processor that is responsible for the architected state of the machine, and the secondary processor can run ahead of the primary processor to resolve branches and generate misses early, while the secondary processor is unconstrained by the architecture or program and unable to change the architected state of the machine.

In this exemplary embodiment, the caches and execution resources of the first and second processors are connected together so they can be used, for example, in two alternative modes—either as independent processors wherein the connections between the processor layer are not used, or in a collaborative manner, wherein the primary processor executes programs and the secondary processor runs a simpler version of the programs so that the secondary processor can advance ahead of the primary processor generating memory requests and resolving branches whose outcome can be used by the primary processor to avoid long-latency memory accesses and branch mispredictions, among other options. This concept of implementing a run-ahead or assist-thread in a 3-D stacked processor system will be described in further detail with reference to FIG. 18.

Figure 18:
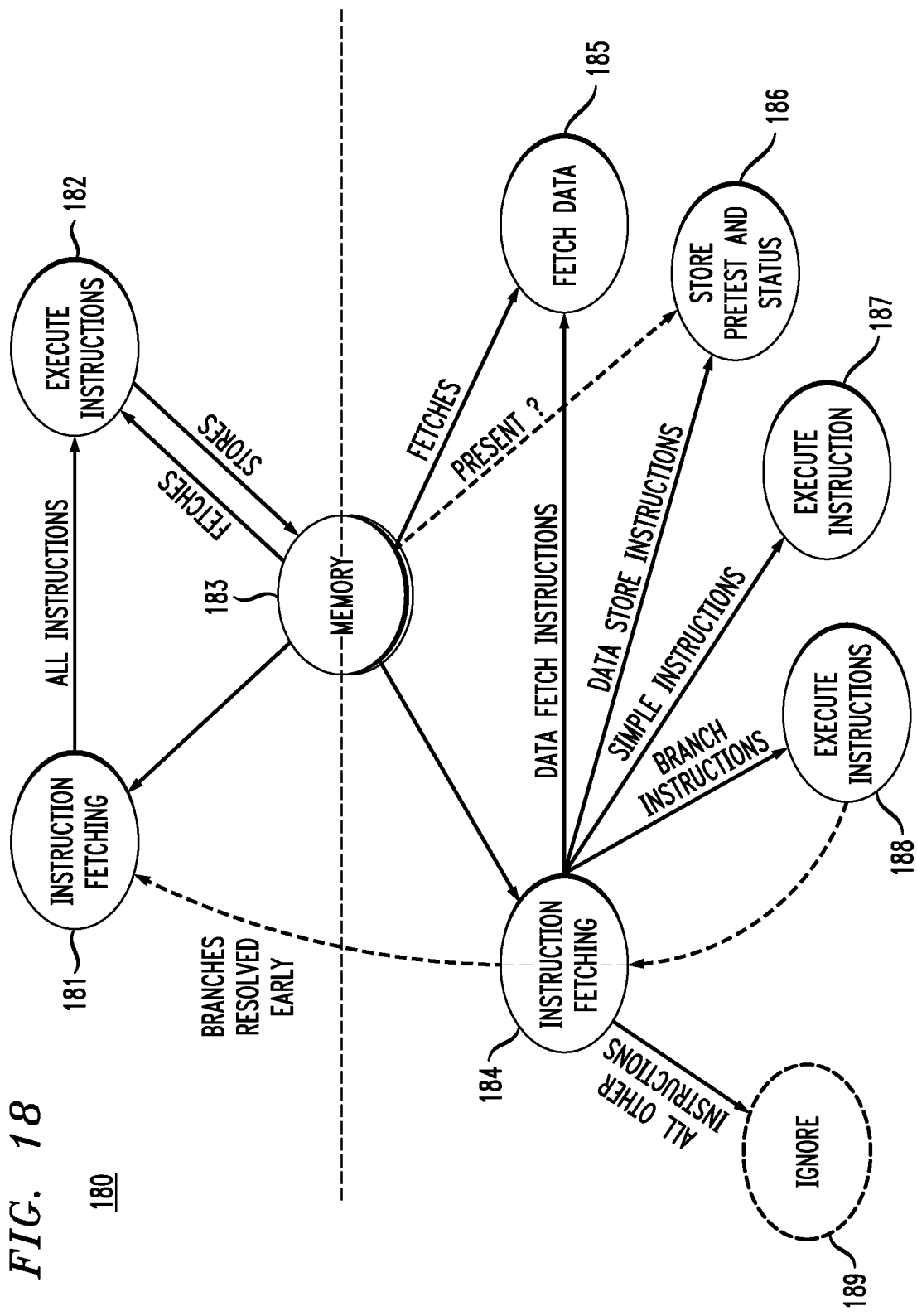
FIG. 18 schematically illustrates a method for implementing run-ahead functionality in a 3-D stacked processor system, according to an exemplary embodiment of the invention.

In particular, FIG. 18 schematically illustrates a method for implementing run-ahead functionality in a 3-D stacked processor system according to an exemplary embodiment of the invention. In particular, FIG. 18 illustrates a plurality of operations 181 and 182 that are performed by a primary processor operating a main thread with regard to a memory that is shared between the primary and a secondary processor, and a plurality of operations 184, 185, 186, 187, 188 and 189 that are performed by the secondary processor operating as run-ahead thread in collaboration with the primary processor.

In particular, as shown in FIG. 18, when executing a program in the 3-D stacked processor system, the primary processor fetches instructions 181 from memory 183 and executes every program instruction 182. While executing instructions, the primary processor will fetch and store program data from the shared memory 183 and maintain the state of the machine (storage) that is visible to all outside entities. In other words, the primary processor executes the program correctly in that the primary processor performs the instruction operations in the correct order, and only manifests state change information to the rest of the system when those changes are known to be correct. However, to make the program execution faster, with higher instruction-level parallelism, the secondary processor operates as a "run-ahead processor, wherein the secondary processor does not guarantee correct and legal operation, and does not manifest state changes to the rest of the system. Instead, it runs as fast as possible in a speculative manner, and not bothering with instructions that have nothing to do with the program flow. By operating in this manner, the run-ahead processor will resolve many of the branches and generate many necessary cache misses earlier than the primary processor would be able to. This will allow the primary processor to run faster than it normally would.

In particular, as shown in FIG. 18, the secondary processor will fetch instructions 184 from the shared memory 183 and execute certain instructions, such as data fetch instructions, and fetch data 185 from the shared memory 183 in response to the data fetch instructions. The secondary processor will execute data store instructions and perform a memory access operation 186 to determine if necessary data is stored in memory 183. The secondary processor will execute simple instructions 187 and execute branch instructions 188, and discard or otherwise ignore all other fetched instructions 189 that have no relation to determining caches misses or resolving branch redirections. In step 186, when the secondary processor sees a data store instruction coming up, the secondary processor will determine if a cache line exists for the data to be stored. If a cache line does not exist, the secondary processor will generate a cache miss and proceed to have a cache line allocated for the data store and obtain the proper permissions to store the data in the newly allocated cache line (i.e., make sure the status of the new cache line is in a "data store ready" state). If the cache line does already exist, the secondary processor will determine if the cache line is in a "data store ready" state, and proceed to obtain the proper permissions if not. In this manner, when the primary processor executes the data store instruction, the cache line will be available and in "store ready" status, thereby avoiding a cache miss in the execution flow.

The secondary processor (run-ahead processor) accelerates the primary processor by resolving contingencies before the primary processor sees them. The secondary processor can operate in this matter as it does not have to execute every instruction, and does not have to perform program operations correctly. In the 3-D stacked configuration, since the primary and secondary processors are spatially coincident and connected by short vertical connections, they are able to share and view the execution state, and otherwise synchronize more readily and robustly than in a coplanar configuration, where long wires would be needed to exchange the proper synchronization information. Even with coplanar wiring between coplanar processors, the coplanar processors would likely not be able to view each other's states coincidentally. In a 3-D stacked configuration, communications and interactions between the assist thread and main thread to share values and otherwise synchronize process flow, are more readily realizable through short vertical connections between the resources of the primary and secondary processors.

In another exemplary embodiment of the invention, a 3-D stacked multiprocessor device can have a plurality of conjoined processors that operate logically as a single processor image, but wherein at portions of their architected storage operate as a private storage space (or scratchpad space) that is not accessible to processor outside the 3-D stack. In other words, multiple processors can be conjoined into a single operating entity (a "processor" as seen from the outside) having an area of private storage that can be used for scratchpad space, and to organize other data structures, wherein the private storage is not visible to the other operating entities in the system. When a tuple of processors is run as a single logical processor in either run ahead mode or Hyper turbo mode, or any other tupling, one or more of the caches of the tuple can be used as private storage with an application-specific structure.

Figure 19:
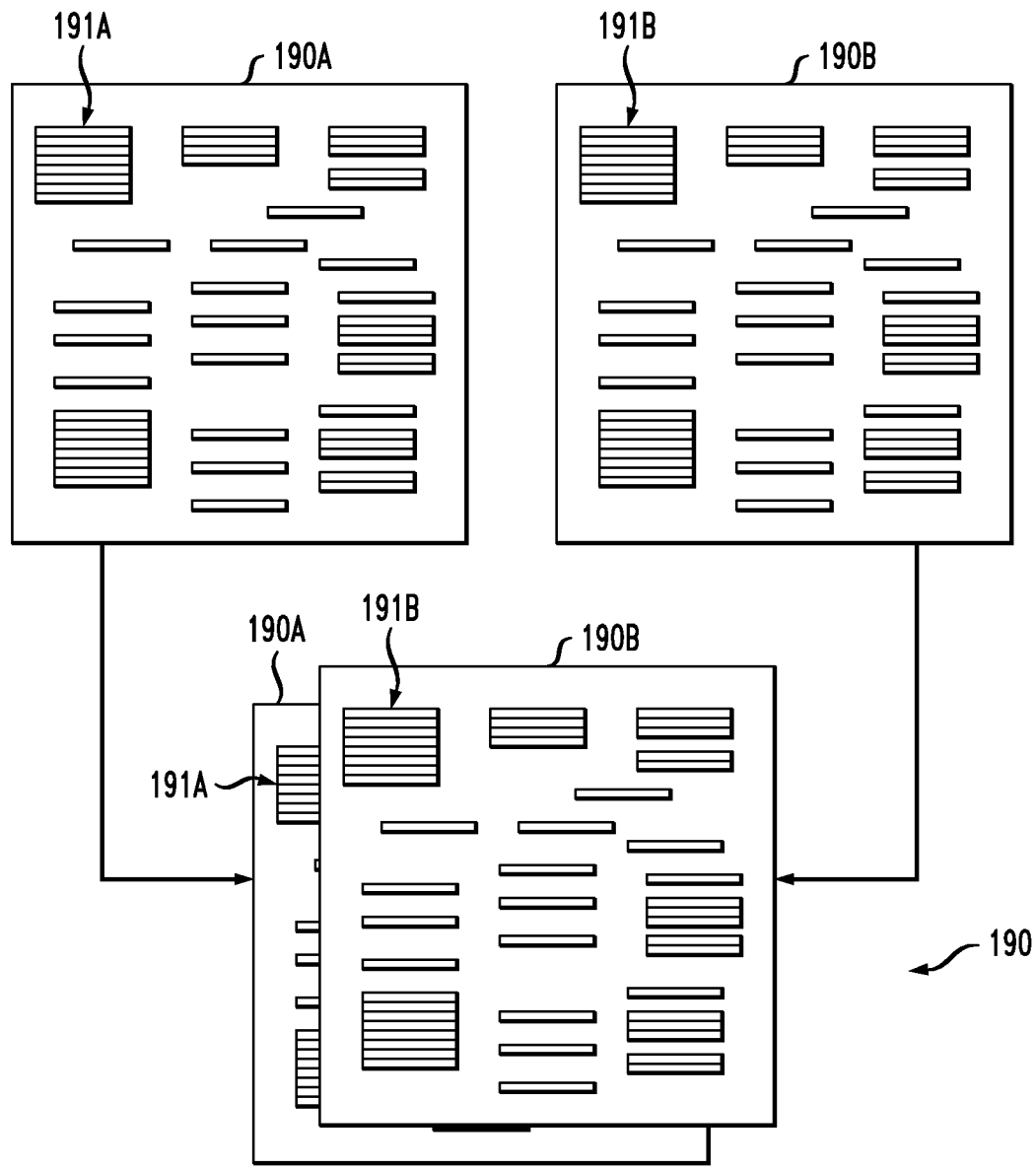
FIG. 19 schematically illustrates a 3-D stacked processor structure that is formed by vertically stacking a plurality of processors each having a similar layout of state registers, wherein the plurality of processors can be operated independent or in a collaborative manner to share their state registers, according to an exemplary embodiment of the invention.

In other exemplary embodiments of the invention, as depicted in FIG. 19, a 3-D stacked processor structure can be formed by vertically stacking a plurality of processors each having a similar layout of state registers, wherein the plurality of processors can be operated independently or in a collaborative manner to share their state registers, according to an exemplary embodiment of the invention. More specifically, FIG. 19 schematically illustrates a first processor 190A and a second processor 190B, which are vertically stacked to form a 3-D stacked processor structure 190. In the exemplary embodiment of FIG. 19, each processor 190A and 190B has a same layout of state registers (generically illustrated by groups of one or more rectangles). For instance, the first processor 190A and the second processor 190B have the same group of state registers 191A and 191B, respectively, disposed in substantially the same 2-D region of the respective processors. It is to be understood that the depiction of the set of state registers (groups of rectangles) on each processor 190A and 190B is arbitrary and meant merely to generically illustrate a processor containing its state registers.

The set of state registers on each processor 190A and 190B are used to store the "state" of the respective processor 190A and 190B at the end of each operating cycle of the processors. The term "state" refers to the information that is needed to completely capture the execution state of a program that is executing on a given processor (what an executing program has done so far). The "state" includes information contained in general purpose registers, control registers, condition codes, address registers, and any other registers that hold vital state information, as is understood by those of ordinary skill in the art. Assuming a program is executing on the first processor 190A. At some given point in the program execution (at the end of complete operating cycle of the processor 190A), the "state" of the first processor 190A could be scanned out from its state registers and stored in the corresponding state registers of the second processor 190B, and the second processor 190B could start executing the same program at the point where it stopped executing on the first processor 190A, using the scanned in state information stored in the state registers of the second processor 190B. In this regard, the program could continue to run on the second processor 190B from the stop point on the first processor 190A and the program would not be able to tell that it had been moved to a different processor. Thus, the "state" is all of the static information that would be required to capture everything needed about a running processor at any cycle. The "state" is the set of registers that completely specify all information that is pertinent to a program running on the processor.

In general, the 3-D stacked structure 190 of FIG. 19 can be fabricated using techniques as discussed above, wherein the processors 190A and 190B can be stacked on top of each other and vertically connected such that the set of state registers (and other components) of each layer of processors 190A and 190B are "aligned" and interconnected using short vertical interconnects. As noted above, the term "aligned" means that the corresponding components of each layer of processor 190A and 190B are disposed directly over each other (occupy substantially the same 2-D space in each layer of the vertical 3-D space), or uniformly staggered by a fixed displacement, should the processors 190A and 190B be attached with some offset so as to generate a lower power density, as discussed above. In this manner, by implementing the proper vertical connections between state register and other components, the 3-D stacked processor 190 can be operated in one of a plurality of modes.

FIG. 20 is a table that shows a plurality of operating modes of the 3-D stacked processor structure of FIG. 19. For instance, as shown in FIG. 20, in one mode of operation ("normal" mode), the first and second processors 190A and 190B can be operated as independent processors wherein each processor 190A and 190B is active (turned on) and operating at less than full power (e.g., each operating at half power). In another mode of operation ('turbo" mode"), one of the processors 190A (or 190B) is operated at full power, while the other processor is turned off. In the "normal" mode, each of the processors 190A and 190B can be operating at half of their maximum power so that the pair of processors will have the same power footprint as a single processor running at full speed (turbo mode). The "normal" operating mode can be employed so that the same power and cooling infrastructure can handle both cases, i.e., a single processor running at full speed (turbo mode), or a pair of processors running at a reduced speed (normal mode).

It is to be understood that the terms "full speed" or "full power" or "maximum safe speed" as used herein all refer to an operating speed at which a given processor will operate correctly for all possible situations and inputs. The maximum safe speed of a given processor is an operating characteristic that is determined ahead of time using various computer simulations, modeling, and measurements for a given processor product. The processor product is advertised as having that as its maximum speed, and it is never run faster. In fact, for most possible states that a given processor can operate, and for most possible programs and inputs, the processor can actually run faster than the "maximum safe speed." However, since certain combinations of states and inputs can cause operating errors when a processor operates above its known "maximum safe speed", the "full speed" limit is typically set so the no problems will occur under any operating conditions and circumstances in which the processor operates.

In another exemplary embodiment of the invention, as shown in the table of FIG. 20, the exemplary 3-D structure 190 of FIG. 19 can be operated in what is referred to "Hyper-Turbo" mode, wherein one of the processors (e.g., process 190A) can be operated at greater than full power (faster operating speed than the maximum safe speed of the processor), while the other processor (e.g., processor 190B) is deactivated (turned off) but wherein the state registers of the deactivated processor are used by the active processor for "check pointing" the state of the active processor. In this exemplary embodiment, the architecture of the active processor in the stack is augmented with the state registers of another inactive processor in the stack to enable the active processor to operate at the enhanced (hyper-turbo) operating speed, while using the state registers of the inactive processor to store a current state information at the completion of each operating cycle of the active processor for purposes of "check pointing" the state of the active processor in the case an execution error occurs while the active processor operates as the increased operating speed that is higher than what is deemed "safe."

Figure 21:
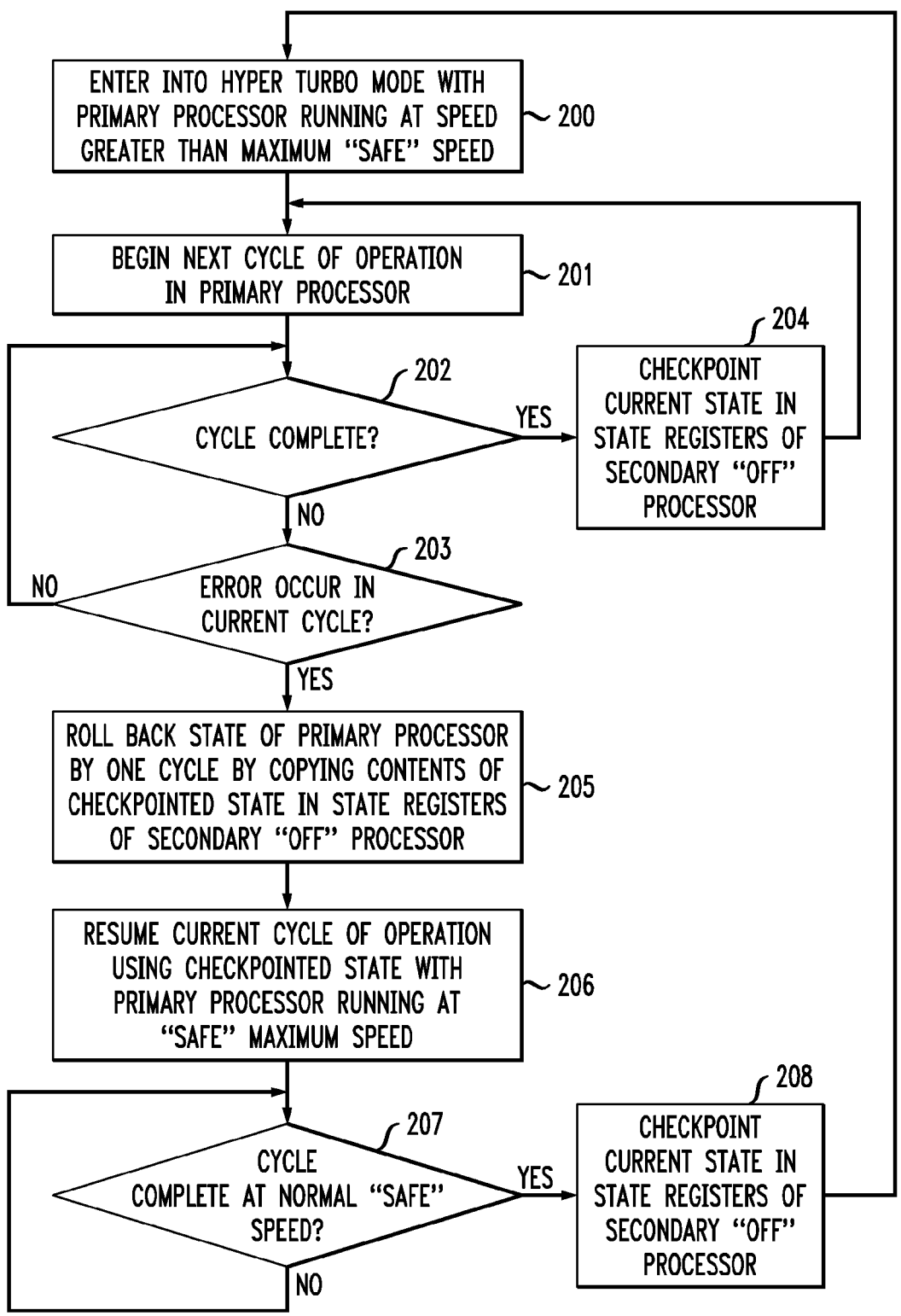
FIG. 21 is a flow diagram illustrating a mode of operation of the 3-D stacked processor structure of FIG. 19.

FIG. 21 is a flow diagram illustrating a mode of operation of the 3-D stacked processor structure 190 of FIG. 19 operating in "hyper-turbo" mode, according to an exemplary embodiment of the invention. Initially, the processor stack 190 of FIG. 19 can be selectively controlled to enter into a "hyper-turbo" mode by activating a primary processor (e.g., processor 190A) to operate at a speed which is greater than its "maximum safe speed," and turning off a secondary processor (e.g., processor 190B), while allowing the state registers of the secondary (inactive) processor to remain active for use by the primary processor (step 200). During execution of a given program, upon completion of each operating cycle, the primary processor will begin a next operating cycle (step 201). If the current cycle is completed (affirmative result in step 202) and no errors occurred during the current cycle (negative result in step 203), the current state of the primary processor (at the completion of a current cycle) will be check pointed (stored) in the state registers of the secondary processor (step 204), and the next operating cycle will begin (step 201).

If some error occurs during a current operating cycle (affirmative result in step 203), the state of the primary process is rolled back one cycle by copying the current contents of the check pointed state in the state registers of the second processor (step 205). The check pointed state in the state registers of the secondary processor is the state of the state registers of the primary processor that existed at a point in time of completion of the last operating cycle of the primary processor. The current cycle of operation (for which the error occurred) is then resumed by the primary processor (using the check pointed state accessed from the state registers of the secondary processor) (step 206). In one exemplary embodiment, this process (step 206) is preferably performed with the primary processor running at its "safe" maximum speed so as to ensure that program operation that caused a problem at the higher speed will execute correctly this time without errors.

Once the current operating cycle (executing at the normal safe speed) completes (affirmative result in step 207), the current state of the primary processor is check pointed in the state registers of the secondary processor (step 208). Thereafter, the processor stack enters back into the hyper-turbo mode wherein the primary processor commences operation at an operating speed that is greater than its maximum safe speed (step 200). In the exemplary process of FIG. 21, since the state of the primary processor is check pointed for every complete cycle of operation, and because a recovery action is simple and fast to do with the stacked geometry (that is, recover the state by refreshing the state registers of the primary processor with the contents of the state checkpoint in the state registers of the secondary processor being accessed over the vertical connections), the primary processor can run at a speed that is higher than its maximum safe speed.

In exemplary embodiments discussed above with reference to FIGS. 9A, 9B and 9C, for example, different caches in different levels of processor chips forming a 3-D stacked processor structure can be conjoined using vertical connections so that the processors can operate caches at any particular level in the cache hierarchy as a single shared cache. For example as noted above, an aligned pair of L2 caches (on two different levels) can be operated as a single shared L2 cache having twice the capacity, and an aligned pair of L3 caches (on two different levels) can be operated as a single shared L3 having twice the capacity. In other exemplary embodiments of the invention as discussed in detail below with reference to FIGS. 22~32, the cache memories of different processor chips can be constructed with access wiring structures that enable different access patterns in multiple dimensions.

Figure 22:
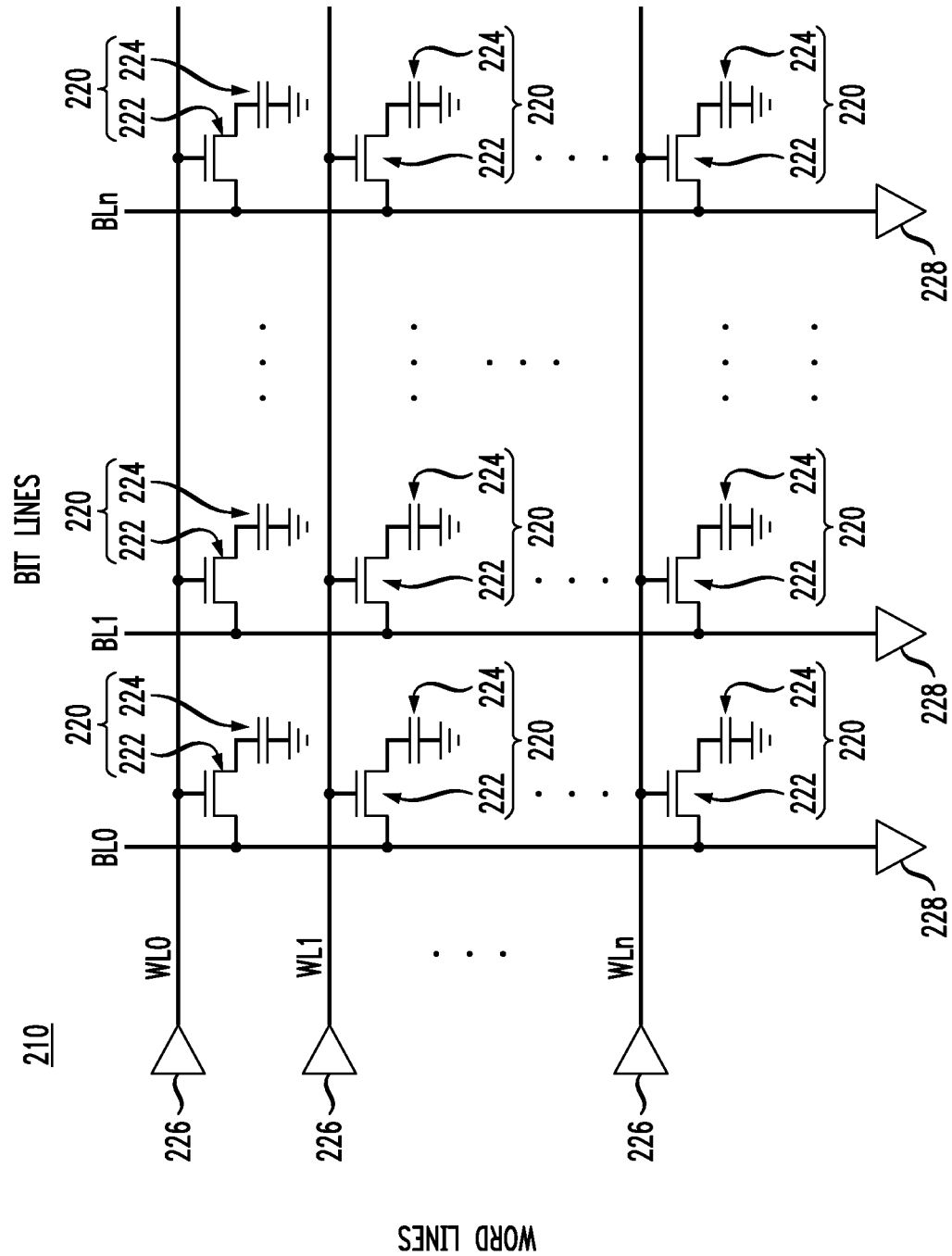
FIG. 22 schematically illustrates a memory array to which embodiments of the invention may be applied.

FIG. 22 schematically illustrates a memory array to which embodiments of the invention may be applied. In particular, FIG. 22 schematically illustrates a memory array 210 comprising a 2-D array of memory cells 220 that are accessible by a plurality of word lines (WL0, WL1, ... WLn) and a plurality of bit lines (BL0, BL1, . . . BLn). Each memory cell 220 comprises an access transistor 222 and a storage element 224 (e.g., capacitor), wherein the access transistor 222 has a gate terminal connected to a word line, a source terminal connected to a bit line and a drain terminal connected to the storage element 224. In the illustrative memory array 210 of FIG. 22, each row of memory cells 220 is connected to the same word line, wherein each row of memory cells 220 comprises groups (quanta) of bits that make up a given byte, word, cache line, etc. Furthermore, each column of memory cells 220 is connected to the same bit line, wherein each memory cell 220 connected to a given bit line corresponds to a given bit position within a given quanta (byte, word, cache line, etc.) that is read/written from/to the memory 210.

Each word line (WL0, WL1, . . . WLn) is connected to a corresponding driver 226 that operates to activate and deactivate the given word line. The driver 226 for a given word line applies a voltage to the gate terminal of each access transistor 222 within a row of memory cells connected to the given word line, which turns on each access transistor 222 in each memory cell 220 connected to the given word line. The word lines are fully decoded lines corresponding to an address that is used to perform a read or write operation, such that only one word line will be activated at any given time. Moreover, each bit line (BL0, BL1, . . . BLn) is connected to a corresponding receiver 228 (e.g., sense amplifier circuit) that senses the charge (logic "0" or logic "1") on a given storage element 224 (capacitor) of a given memory cell 220 connected to the bit line, which is selected by a given word line. For a read or write operation, one word line (row) is activated by a corresponding word line driver 226, which turns on each access transistor 222 of each memory cell 220 in the given row. Once a given word line is activated, one or more bits (columns) within the selected word line is accessed via a corresponding bit line. All bits of a given bit line are connected together, but only one bit can be selected at any given time.

FIG. 22 schematically illustrates a DRAM (dynamic random access memory) in which the state of each memory cell (e.g., logic "0" or logic "1") is stored as a charge on a capacitor which serves as the storage element 224. In other memory architectures, such as SRAM (static random access memory), the row-column "architecture" is the same with regard to word lines and bit lines, but each storage element would include several transistors instead of a capacitor, as is known in the art.

Figure 23B:
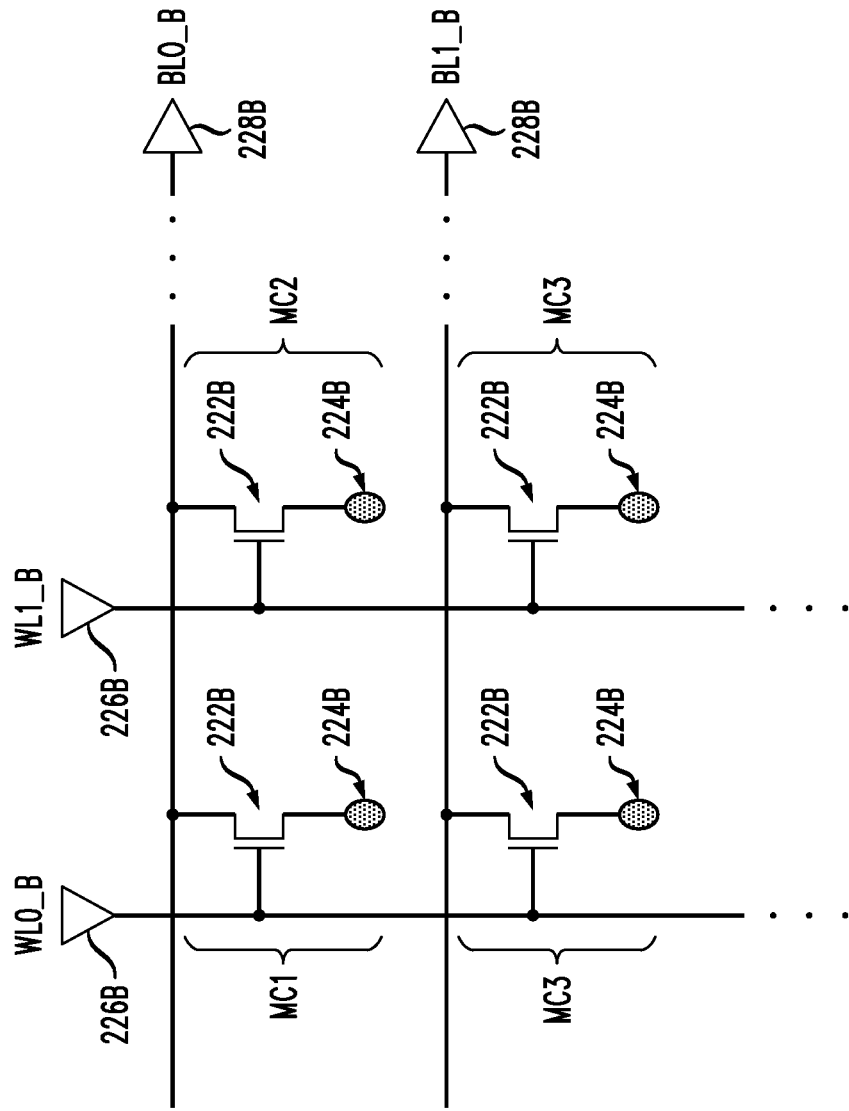

In accordance with embodiments of the invention, a multidimensional memory architecture can be constructed by stacking multiple level of memory (e.g., DRAM, SRAM) with access wiring structures that enable different access patterns for reading/writing data in multiple dimensions. For example, FIGS. 23A, 23B and 23C collectively illustrate a method for constructing a memory structure comprising multiple levels of memory with different access patterns, according to an exemplary embodiment of the invention. More specifically, FIG. 23A schematically illustrates a first level of memory 230A, FIG. 23B schematically illustrates a second level of memory 230B, and FIG. 23C schematically illustrates a 3-D memory 230C with the second level of memory 230B (FIG. 23B) disposed on the first level of cache memory 230A (FIG. 23A). The first level of cache memory 230A shown in FIG. 23A comprises an array of memory cells MC1, MC2, MC3 and MC4 each comprising an access transistor 222A and a storage element 224A, a plurality of word lines (e.g., WL0_A, WL1_A), a plurality of bit lines (e.g. BL0_A, BL1_A), word line drivers 226A, and bit line receivers 228A. The first level cache memory 230A in FIG. 23A is similar in structure and operation as the memory array 210 discussed above with reference to FIG. 22, except that in FIG. 23A, for ease of illustrations, only four memory cells MC1, MC2, MC3 and MC4 are shown, along with two word lines (rows) WL0_A and WL1_A, and two bit lines (columns) BL0_A and BL1_A. The word lines extend in a row direction and the bit lines extend in a column direction.

The second level of memory 230B shown in FIG. 23B comprises a plurality of memory cells, MC1, MC2, MC3 and MC4 that correspond to the memory cells MC1, MC2, MC3 and MC4 shown in FIG. 23A. The memory cells shown in FIG. 23B each comprise an access transistor 222B and a vertical via connection 224B. The vertical via connection 224B is connected to a storage element of a corresponding memory cell formed on a different layer of cache memory. For instance, the vertical via connection 224B is connected to the storage element 224A of a corresponding memory cell on the first level of memory 230A. Moreover, the second level of memory 230B in FIG. 23B comprises a plurality of word lines (e.g., WL0_B, WL1_B), a plurality of bit lines (e.g. BL0_B, BL1_B), word line drivers 226B, and bit line receivers 228B. In FIG. 23B, each word line extends vertically (columns) and is connected to the gate terminals of the access transistors 222B that are in a given column of memory cells. Moreover, each bit line extends horizontally (rows) and is connected to the source terminals of the access transistors 222B that are in a given row of memory cells.

In accordance with an exemplary embodiment of the invention, the second level of memory 230B is disposed on the first level of memory 230A to form a 3-D memory architecture as depicted in FIG. 23C. In particular, FIG. 23C shows a 3-D memory 230C in which each memory cell MC1, MC2, MC3 and MC4 comprises one storage element 224A and two access transistors 222A and 222B on different levels of memory for accessing the same storage element 224A using two different access wiring patterns. The access transistors 222B on the second level of memory 230B are connected to corresponding storage elements 224A on the first level of memory 230A via the vertical connections 224B. In the 3-D memory architecture of FIG. 23C, while there is a single storage element 224A for each memory cell MC1, MC2, MC3 and MC4, the word line and bit line wiring and the word line driver and bit line sensing circuitry on each the different levels of memory provides different access patterns to the same memory cells MC1, MC2, MC3 and MC4.

In particular, as depicted in FIG. 23C, the word lines WL0_A and WL1_A on the first level of memory 230A are arranged orthogonal to the word lines WL0_B and WL1_B on the second level of memory 230B. Moreover, the bit lines BL0_A and BL1_A on the first level of memory 230A are arranged orthogonal to the bit lines BL0_B and BL0_B on the second level of memory 230B. In this regard, for each bit (memory cell), the two orthogonal wiring patterns on the first and second levels of memory 230A and 230B enables access to data structures in different dimensions (e.g., rows and columns of an array). For instance, horizontal rows of memory cells in the 3-D memory 230C can be accessed using word lines (e.g., WL0_A, WL1_A) on the first level of memory 230A, and vertical columns of memory cells in the 3-D memory 230C can be accessed using word lines (WL0_B, WL1_B) on the second level of memory 230B. Since the storage element 222A for each memory cell MC1, MC2, MC3, MC4, is commonly connected to two different access transistors 222A and 222B, the 3-D memory 230C enables access to the same array of bits (one level of storage) using different geometries of word lines and bit lines on different levels of memory.

In one embodiment of the invention, the 3-D memory structure 230C of FIG. 23C is implemented as a cache memory structure. In another embodiment of the invention, the 3-D memory structure 230C of FIG. 23C is implemented as a main system memory structure. Moreover, it is to be appreciated that each level of memory 230A and 230B forming the structure shown in FIG. 23C can be implemented as a "conceptual level of memory" or as a separate "physical level of memory."

In particular, with regard to a "physical level of memory," each level of memory 230A and 230B is constructed on a separate substrate or chip, wherein the two separate substrates or chips are mounted to each other to form a stacked 3-D structure. With the first level of memory 230A shown in FIG. 23A, the various circuit components 222A, 224A, 226A and 228A are constructed on an active surface of a first substrate, while the access wiring pattern of word lines (WL0_A, WL1_A) and bit lines (BL0_A, BL1_A) are fabricated as part of a BEOL structure of the first substrate. Moreover, the second level of memory 230B shown in FIG. 23B comprises a second substrate with the various components 222B, 226B and 228B formed on an active surface of the second substrate, while the access wiring pattern of word lines (WL0_B, WL1_B) and bit lines (BL0_B, BL1_B) are fabricated as part of a BEOL structure of the second substrate. The connections 224B can be vertical thru via connections that extend through the first and second substrates connecting the access transistors 222B on the second level of memory 230B to the storage elements 224A on the first level of memory 230A.

With regard to a "conceptual level of memory," each level of memory 230A and 230B is constructed on the same substrate or chip, providing one physical level of memory, but providing two different conceptual levels of memory. In this embodiment, all the circuit components 222A, 222B, 226A, 226B, 228A, 228B would be formed on an active surface of one substrate and two different access wiring patterns of word lines and bit lines would be fabricated as part of the same BEOL structure over the active surface of the substrate. In this regard, a cache memory can be fabricated with multiple "conceptual" levels of cache memory on a single chip, such as a processor ship, such that same 2-D array of memory cells can be accessed using two different wiring access patterns. In one embodiment of the invention, the L2 and/or L3 caches one each of the first and second processors 90A and 90B as shown in FIGS. 9A, 9B and 9C can each be constructed using multiple conceptual levels of cache memory.

The memory architecture of FIG. 23C is useful in various applications in which fetching data in multiple dimensions would increase efficiency and speed of certain workloads. For example, the wiring framework of the memory structure of FIG. 23C would be useful in applications such as matrix multiplication, for example, as will be explained with reference to FIGS. 24 and 25. In particular, FIG. 24 schematically illustrates three memory blocks A, B and C that represent 4×4 blocks of memory each having 4 rows and 4 columns. Memory block C represents a result of matrix multiplication (A×B) of rows and columns of memory blocks A and B. It is to be understood that the memory blocks A, B and C can be considered different memory structures, or different portions of the same memory structure. In the example shown in FIG. 24, when applying a matrix multiplication of A×B, a given entry (bit) in the memory block C is computed as a vector dot product of a row vector of memory block A and a column vector of memory block B as follows:

$$C_{ij}=RA_i \cdot CB_j,$$

wherein $RA_i$ represents a row of memory block A with index i (where i=1, 2, 3, or 4), and wherein $CB_j$ represents a column of memory block B with index j (where j=1, 2, 3, or 4). For example, the entry in memory cell $C_{ij}$ for i=1 and j=1 would be computed as:

$$C_{11}=RA_1 \cdot CB_1=(A_{11} \times B_{11})+(A_{12} \times B_{21})+(A_{13} \times B_{31})+(A_{14} \times B_{41}).$$

As shown above, a matrix multiplication of memory block A and memory block B would require fetching rows of memory block A and columns of memory block B. Assuming both memory blocks A and B have a conventional framework such as shown in FIG. 22, fetching a given row in memory block A would require one primitive operation (in a high level program language) to fetch the given row in its entirety. Indeed, since each row is accessed by a word line, each memory cell in the given row is activated by one unique word line address, and each memory cell along the row is read via the respective bit lines. For instance, the first row RA1 of memory block A, which contains A11, A12, A13, and A14, could be read by inputting the unique address associated with row RA1 to activate its word line, and then activate the bit lines associated with each column CA1, CA2, CA3 and CA4 to read out the data from memory cell locations A11, A12, A13, and A14, thereby reading out row RA1 in a single operation.

On the other hand, because each column of the array in memory block B is stored completely in a single column of the memory, fetching a column from memory block B would require multiple operations with the conventional framework of FIG. 22. For example, to read out the first column CB1 (B11, B21, B31 and B41) of memory block B in FIG. 24, each row RB1, RB2, RB3 and RB4 in memory block B would have to be sequentially activated, and one only one bit (B11, B21, B31 and B41) would be accessed from each activated row of the target column CB1 at a given time. This would require four successive word line activation and read operations.

Figure 25:
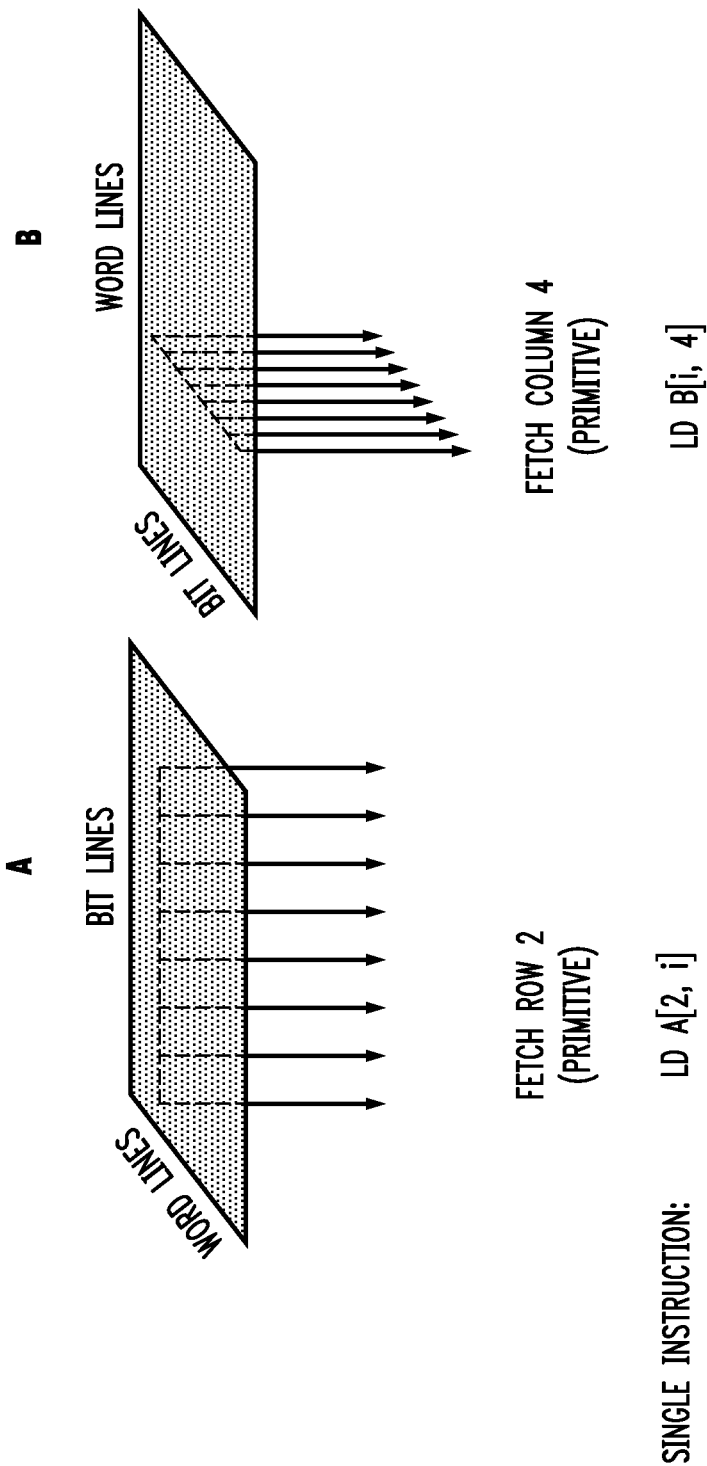
FIG. 25 schematically illustrates a method of accessing rows and columns of memory blocks using a single primitive operation, according to an exemplary embodiment of the invention.

In accordance with an embodiment of the invention, the memory blocks A and B shown in FIG. 24 can be constructed using the framework of FIG. 23C such that rows in memory block A and columns in memory block B could be accessed in single operations. For example, FIG. 25 schematically illustrates a method of accessing rows and columns of memory blocks using a single primitive operation, according to an exemplary embodiment of the invention. In particular, FIG. 25 illustrates that a single row (second row) of memory block A can be accessed in a single primitive instruction LD A[2,i] using the access layer of the memory in which the word lines extend horizontally, wherein LD denotes a "load" operation in an assembly language. Similarly, FIG. 25 illustrates that a single column (fourth column) of memory block B can be accessed in a single primitive instruction LD B[i,4] using the access layer of the memory in which the word lines extend vertically.

The exemplary embodiment of FIG. 23C illustrates a 3-D memory structure comprising two levels of memory with two different orthogonal access wiring patterns. In other embodiments of the invention, 3-D memory structures can be formed having three or more levels of different access wiring patterns for accessing one level of storage. Furthermore, while FIG. 23C illustrates a 3-D memory structure having one level of storage that is accessed by two different wiring patterns, in other embodiments of the invention, a 3-D memory structure is constructed to have two or more levels of storage with each level of storage being shared by one or more layers of different access wiring geometries. Moreover, in other exemplary embodiments of the invention, access wiring patterns other than orthogonal patterns can be implemented, such as shown in FIGS. 26, 27 and 28.

Figure 26:
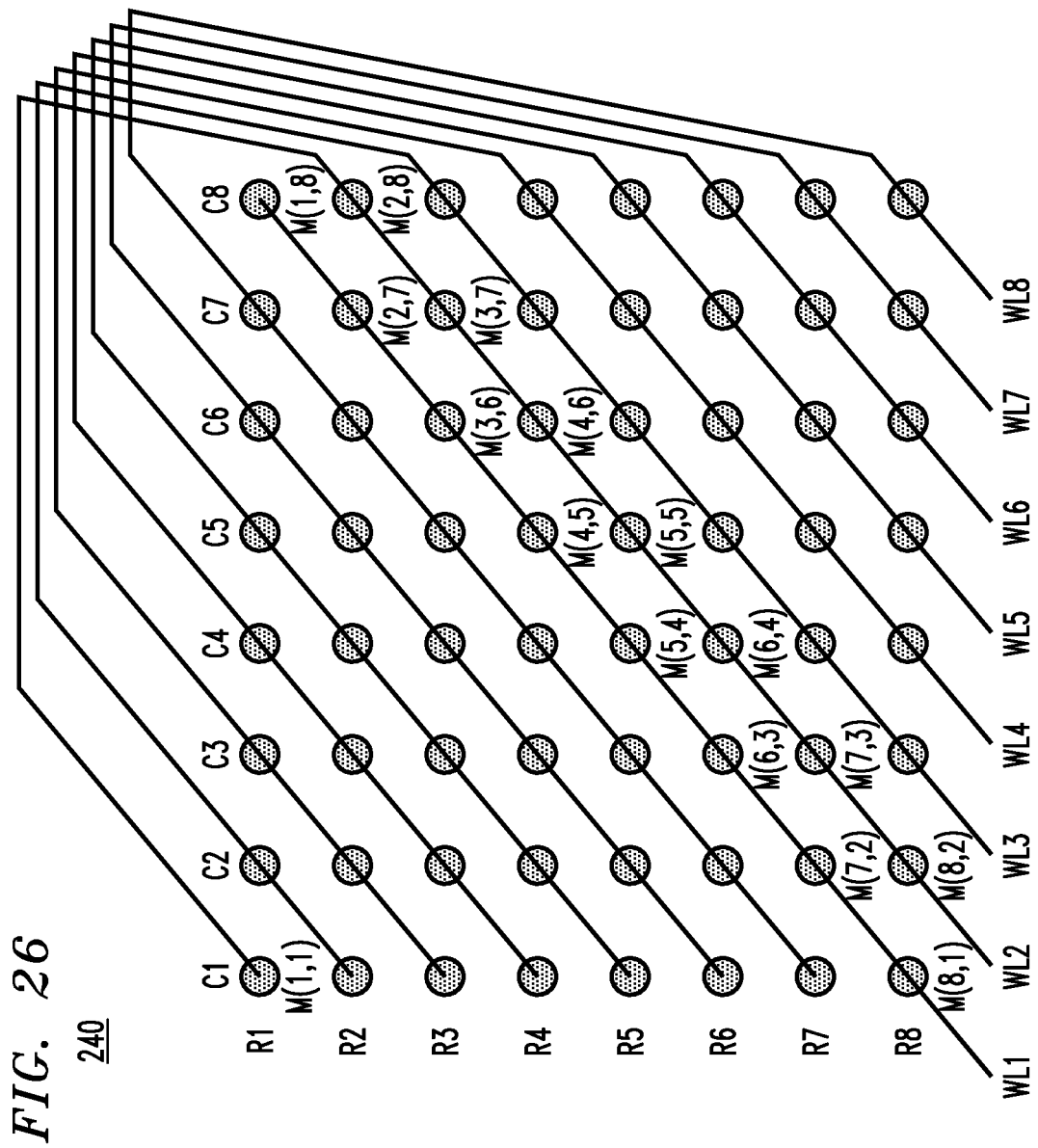
FIG. 26 illustrates a memory array comprising an array of memory cells and a diagonal access wiring pattern, according to an exemplary embodiment of the invention.

In general, FIG. 26 illustrates a memory array comprising an array of memory cells and a diagonal access wiring pattern, according to an exemplary embodiment of the invention. More specifically, FIG. 26 illustrates a memory array 240 comprising 64 memory cells (M) arranged in a 2-D array of 8 rows (R1, R2, ... R8) and 8 columns (C1, C2, ..., C8). The memory array 240 comprises a plurality of word lines WL1, WL2, WL3, WL4, WL5, WL6, WL7, and WL8 that are arranged in a diagonal access pattern, wherein each word line is connected to one memory cell M from each row and each column M (i,j), where i denotes a row index and j denotes a column index. For instance, word line WL1 is connected to memory cells M(1,8), M(2,7), M(3,6), M(4,5), M(5,4), M(6, 3), M(7,2), and M(8,1). Moreover, word line WL2 is connected to memory cells M(1,1). M(2,8), M(3,7), M(4,6), M(5, 5), M(6,4), M(7,3), and M(8,2). Although not specifically shown in FIG. 26, in one embodiment of the invention, all bit lines of the memory array 240 in FIG. 26 can run in either a column direction or a row direction. As such, when activating a given word line, each of the bit lines can be activated at the same time to sense one bit in each column that is activated by the given word line.

Figure 27:
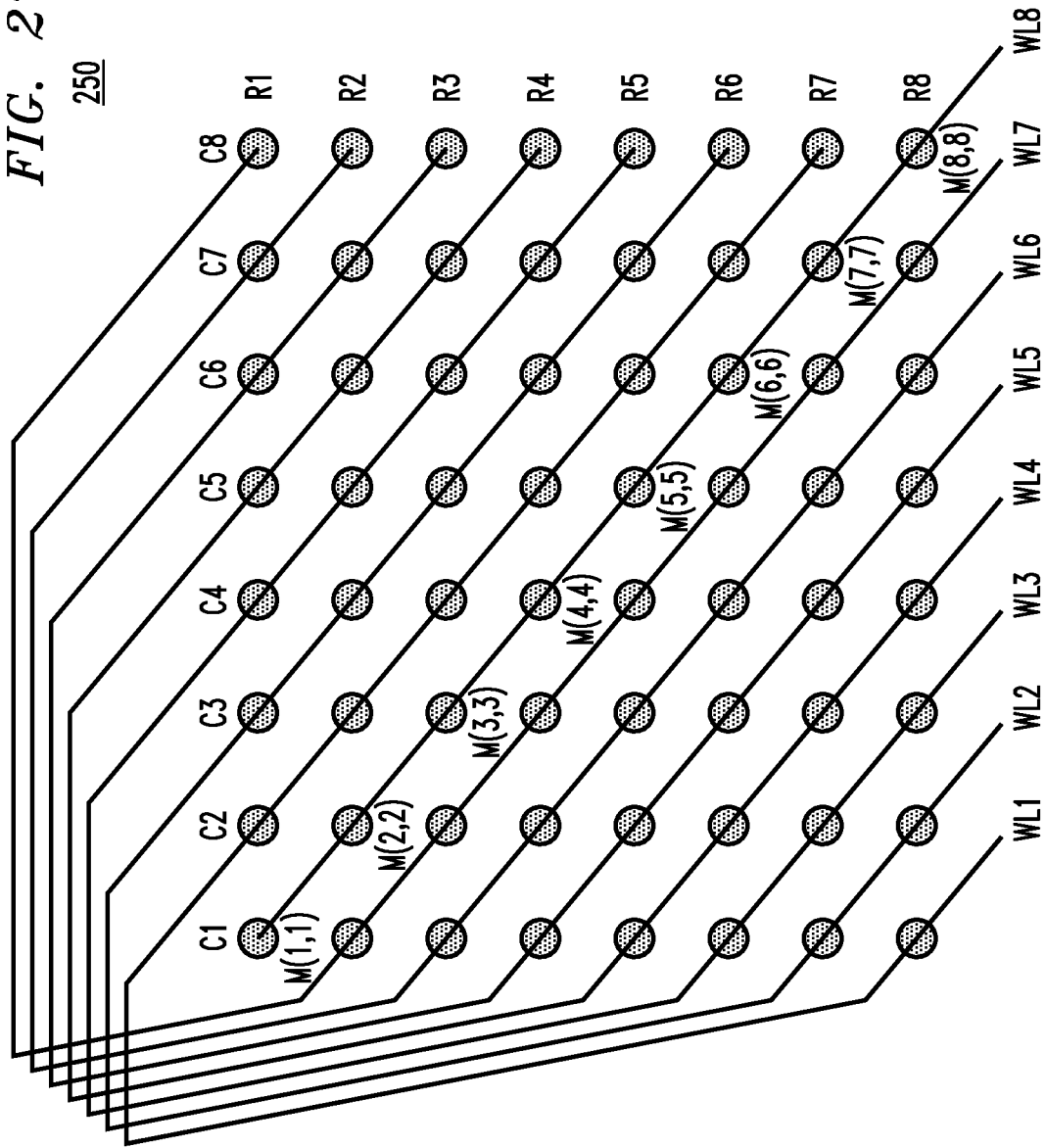
FIG. 27 illustrates a memory array comprising an array of memory cells and a diagonal access wiring pattern, according to another exemplary embodiment of the invention.

Moreover, FIG. 27 illustrates a memory array comprising an array of memory cells and a diagonal access wiring pattern, according to another exemplary embodiment of the invention. More specifically, FIG. 27 illustrates a memory array 250 comprising 64 memory cells (M) arranged in a 2-D array of 8 rows (R1, R2, . . . R8) and 8 columns (C1, C2, . . . , C8), similar to that of FIG. 26, but wherein a plurality of word lines WL1, WL2, WL3, WL4, WL5, WL6, WL7, and WL8 in FIG. 27 are arranged in a diagonal access pattern which is a mirror image of the word line wiring pattern shown in FIG. 26. In FIG. 27, each word line is connected to one memory cell M from each row and each column M (i,j), where i denotes a row index and j denotes a column index. For instance, word line WL8 is connected to memory cells M(1, 1), M(2,2), M(3,3), M(4,3), M(5,5), M(6,6), M(7,7), and M(8,8). Although not specifically shown in FIG. 27, in one embodiment of the invention, all bit lines of the memory array 250 in FIG. 27 can run in either a column direction or a row direction. As such, when activating a given word line, each of the bit lines can be activated at the same time to sense one bit in each column that is activated by the given word line.

Figure 28:
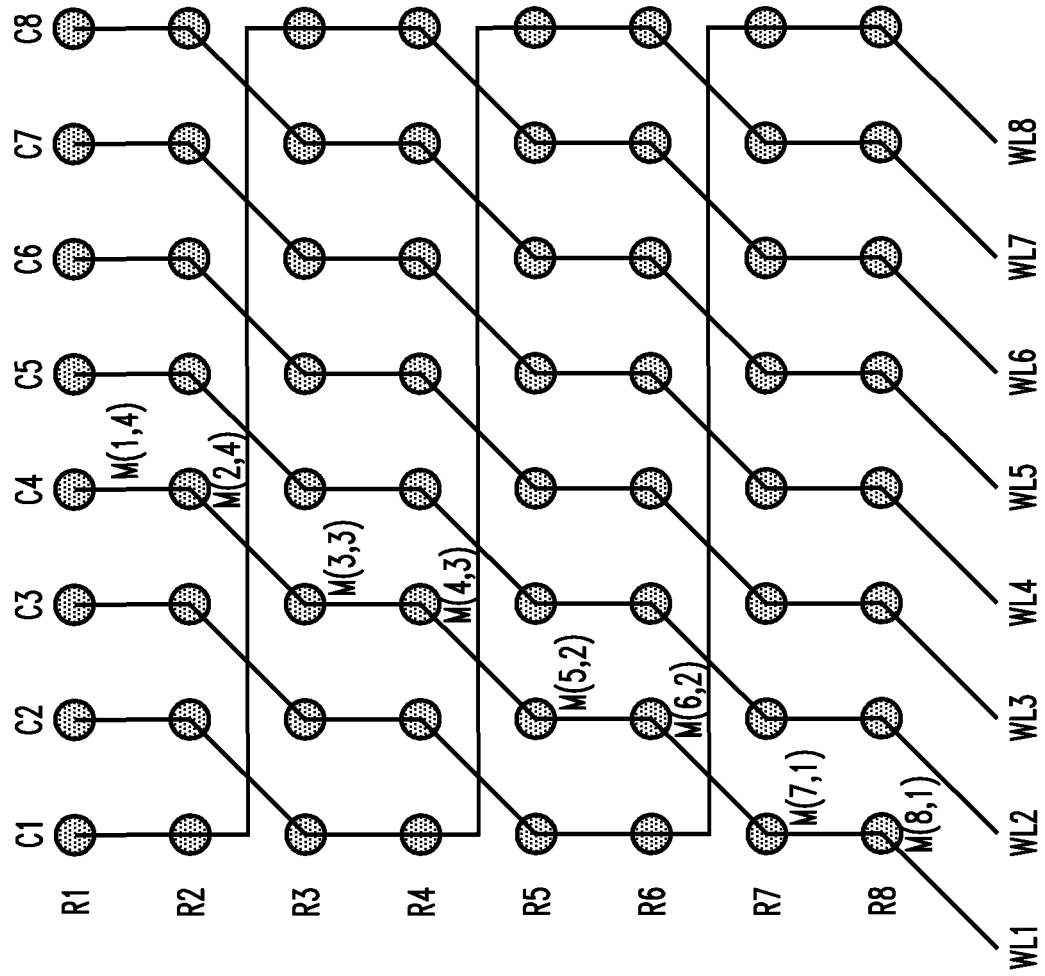
FIG. 28 illustrates a memory array comprising an array of memory cells and a column-shifted access wiring pattern, according to another exemplary embodiment of the invention.

FIG. 28 illustrates a memory array comprising an array of memory cells and a shifted access wiring pattern, according to another exemplary embodiment of the invention. More specifically, FIG. 28 illustrates a memory array 260 comprising 64 memory cells (M) arranged in a 2-D array of 8 rows (R1, R2, . . . R8) and 8 columns (C1, C2, . . . , C8), similar to that of FIGS. 26 and 27, but wherein a plurality of word lines WL1, WL2, WL3, WL4, WL5, WL6, WL7, and WL8 in FIG. 27 are arranged in column-shifted access pattern. In particular, the word lines in FIG. 28 are shown to extend in a column direction for at least two rows, and then are shifted diagonally to another column where they extend for another two rows, and so on. For instance, word line WL1 is connected to memory cells M(1,4), M(2,4), M(3,3), M(4,3), M(5,2), M(6, 2), M(7,1), and M(8,1). Although not specifically shown in FIG. 28, in one embodiment of the invention, the bit lines of the memory array 260 in FIG. 28 can run in a row direction such that when a given word line is activated, each of the bit lines can be activated to sense one bit in each row that is activated by the given word line.

It is to be understood that the access wiring patterns shown in FIGS. 23C, 26, 27 and 28 are illustrative embodiments, and that other access wiring patterns can be implemented. A 3-D memory structure can have multiple layers of different access wiring patterns such as shown in FIGS. 23C, 26, 27 and 28, which are commonly connected to one level of storage. As noted above, the orthogonal access wiring patterns shown in FIG. 23C enable data structures to be accessed in different dimensions (e.g., rows and columns of an array). The random access patterns of FIGS. 26, 27 and 28 allows data to be stored in an arbitrary patterns that support cryptography and error checking. For example, the access wiring patterns of FIGS. 26, 27 and 28 can be used to store data in an arbitrary manner such that the data is essentially encrypted in a unique manner. Moreover, if simple parity is maintained in each dimension, the different access wiring patterns can be used to perform powerful error correction on an array. For example, if the parity of one row and one column is bad, then the bit at which the row and column intersect is determined as bit that is wrong.

Figure 29:
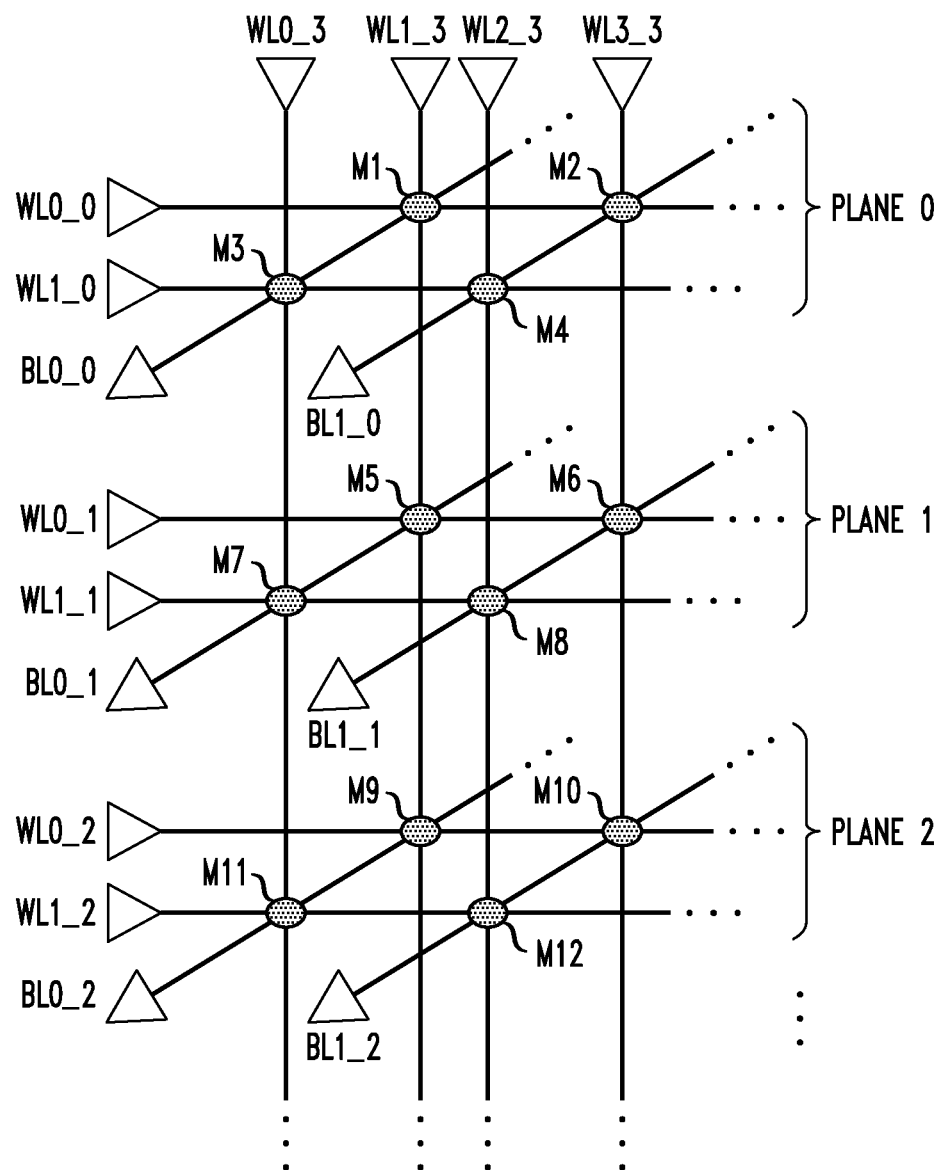
FIG. 29 schematically illustrates a 3-D memory structure enabling 3-D access patterns over multiple levels of storage, according to an exemplary embodiment of the invention.

In other embodiments of the invention, a 3-D memory structure is constructed with multiple layers of storage, where data can be stored or accessed in three dimensions. For instance, FIG. 29 schematically illustrates a 3-D memory structure enabling 3-D access patterns over multiple levels of storage, according to an exemplary embodiment of the invention. In particular, FIG. 29 illustrates a 3-D memory structure 270 comprising a plurality of levels of memory (e.g., Plane 0, Plane 1, Plane 2, . . . ), wherein each memory level comprises one level of storage and at least one 2-D access wiring geometry. By way of illustration, FIG. 29 shows that the first level of memory (Plane 0) comprises a 2-D array of memory cells M1, M2, M3 and M4, which are accessible within the given plane using an orthogonal pattern of access wiring comprising word lines (WL0_0, WL1_0) and bit lines (BL0_0, BL1_0). The second level of memory (Plane 1) comprises a 2-D array of memory cells M5, M6, M7 and M8, which are accessible within the given plane using an orthogonal pattern of access wiring comprising word lines (WL0_1, WL1_1) and bit lines (BL0_1, BL1_1). Moreover, the third level of memory (Plane 2) comprises a 2-D array of memory cells M9, M10, M11, and M12, which are accessible within the given plane using an orthogonal pattern of access wiring comprising word lines (WL0_2, WL1_2) and bit lines (BL0_2, BL1_2).

Furthermore, the 3-D memory structure 270 of FIG. 29 comprises a plurality of vertical word lines WL0_3, WL1_3, WL2_3 and WL3_3, which are connected to columns of memory cells across the different levels of storage. In particular, a first vertical word line WL0_3 is connected to memory cells M3, M7 and M11 over the first three planes (Planes 0, 1 and 2). A second vertical word line WL1_3 is connected to memory cells M1, M5 and M9 over the first three planes. A third vertical word line WL2_3 is connected to memory cells M4, M8 and M12 over the first three planes. A fourth vertical word line WL3_3 is connected to memory cells M2, M6 and M10 over the first three planes. In this regard, FIG. 29 illustrates a 3-D storage structure in which data can be stored in any of the three dimensions, and accessed in any of the three dimensions. These concepts are further illustrated with reference to FIGS. 30A, 30B and 30C.

In particular, FIGS. 30A, 30B, and 30C schematically illustrate methods for accessing data in various dimensions using the exemplary 3-D memory structure of FIG. 29. In particular, FIG. 30A illustrates a method for accessing data (memory cells M1, M2, M5, M6, M9 and M10) in a y-z plane for a fixed value of x in the memory structure 270 of FIG. 29. FIG. 30B illustrates a method for accessing data (memory cells M5, M6, M7, and M8) in a x-y plane for a fixed z in the memory structure 270 of FIG. 29. FIG. 30C illustrates a method for accessing data (memory cells M1, M3, M5, M7, M9 and M11) in an x-z plane for a fixed y in the memory structure 270 of FIG. 29. The 3-D structure of FIG. 29 supports the use of new primitive operations for moving data. For instance, in any dimension, a plane of data can be moved in an orthogonal dimension as one primitive operation. By way of example, in FIG. 30B, an x-y plane of data for a fixed value of z can be moved to another x-y plane of memory location for another value of value of a as one primitive operation. In other embodiments of the invention, one primitive operation can be defined to transpose (swap) two parallel planes of data as one operation. The various horizontal and vertical lines shown in FIGS. 30A, 30B and 30C are depicted with double arrows such that the lines generically represent word lines and/or bit lines, depending on the wiring architecture that may be implemented.

It is to be understood that each memory cell shown in FIG. 29 (as well as FIGS. 30A, 30B, and 30C) may represent a single bit, a byte, a word, a cache line, or any other quantum of data. It is to be further understood that for ease of illustration, each 2-D memory plane (Plane 0, Plane 1, Plane 2) is shown in FIG. 29 as having four memory cells and two word lines and bit lines, but each memory plane can have more memory cells and word lines and bit lines. Furthermore, while only three 2-D planes of memory are shown in FIG. 29, a 3-D memory structure can be constructed with either two levels of 2-D storage, or four or more levels of 2-D storage, wherein each level of storage has one or more different access wiring patterns associated therewith. Indeed, while FIG. 29 shows one access wiring pattern associated with each 2-D level of storage, one or more of the memory planes (Plane 0, Plane 1, Plane 2) can have two or more different access wiring patterns associated therewith, such that the 2-D array data of a given memory plane is accessible with different wiring geometries, such as described above in FIG. 23C.

It is to be further understood that each level (plane) of memory of the 3-D memory structure 270 shown in FIG. 29 can be implemented as a physical level of memory or a conceptual level of memory, as discussed above. For instance, in one embodiment of the invention, the 3-D memory structure 270 can be implemented on a single substrate or chip, wherein all memory circuit components (access transistors, storage elements, drivers, sense amplifiers, etc.) are formed on the active surface of a single substrate or chip, and wherein all the wiring would be fabricated as part of the BEOL structure of the single chip. In this embodiment, all the storage bits of the 3-D memory would be disposed in single 2-D plane, but the access wiring structure would be designed to connect the storage bits of the memory cells in a way that would create a virtual 3-D memory structure as conceptually shown in FIG. 29.

In another embodiment of the invention, to obtain increased storage density, each of level (plane) of memory in the 3-D memory structure 270 shown in FIG. 29 is formed on a separate substrate or chip, wherein the different substrates/chips are stacked on each other to form a physical 3-D stacked memory structure. In this embodiment, each substrate/chip would have the storage elements, access devices and access wiring structure associate with a given level of memory, wherein vertical through via connections formed through the different substrates/chips bits to create the vertical access wiring (e.g., word lines) for accessing memory cells across the different physical levels of memory. By way of example, in one embodiment of the invention, the conjoined L2 and L3 caches between the first and second processors 90A and 90B as shown in FIG. 9C can each be constructed using multiple physical levels of cache memory using the structure of FIG. 29.

In other embodiments of the invention, a 3-D memory structure 270 shown in FIG. 29 can be fabricated with a combination of conceptual and physical levels of memory. For example, assuming a 4-level memory structure, 2 of the 4 levels of memory can be fabricated on a first substrate as a first and second conceptual memory levels, and the other 2 levels of memory can be fabricated on a separate second substrates as third and fourth conceptual memory levels. The first and second substrates (each having two conceptual levels of memory) can be stacked on each other to form a 3-D stacked structure with 4-levels of memory.

Figure 31:
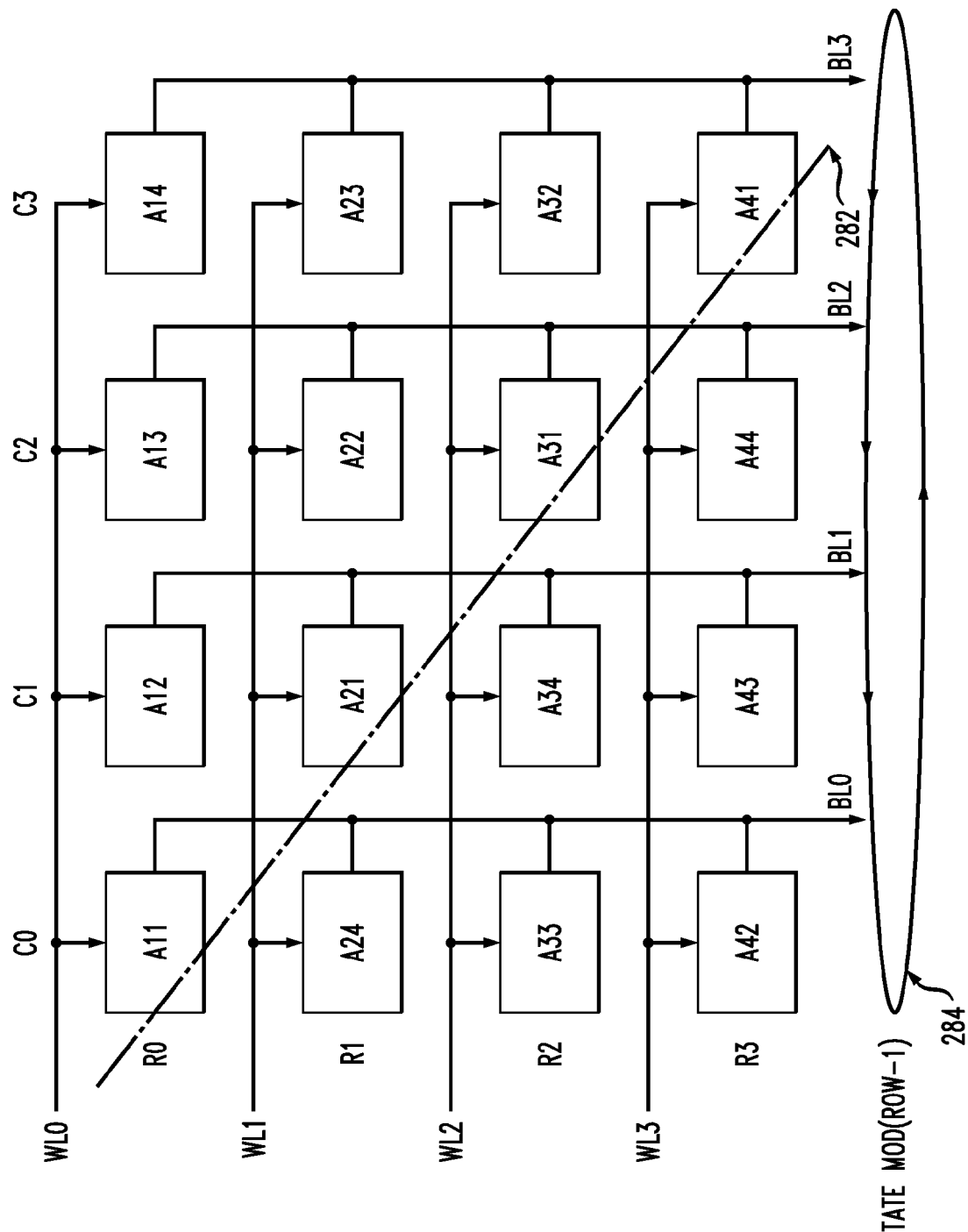
FIG. 31 illustrates a method for storing a 2-D data array structure in a memory according to an exemplary embodiment of the invention, which enables access to rows and columns in one operation.

As discussed above with reference to FIGS. 23C and 24, for example, a 2-D array (data structure) can be stored in a memory structure having one level of memory with two different access wiring patterns, such that entire rows or entire columns of the 2-D array can be accessed using one primitive operation. In other embodiments of the invention, a 2-D data array structure can be stored in a standard memory structure with one level of memory and one access wiring pattern such that entire rows or columns can be accessed in one operation. For example, FIG. 31 illustrates a method for storing a 2-D data array structure in a memory according to an exemplary embodiment of the invention, which enables access to rows and columns in one operation. FIG. 31 schematically illustrates a memory array 280 comprising a 2-D array of memory cells arranged in four rows (R0, R1, R2 and R3) and four columns (C0, C1, C2 and C3), wherein the memory cells are accessible by an access wiring structure comprising four word lines (WL0, WL1, WL2, WL3) and four bit lines (BL0, BL1, BL2, BL3).

The memory array 280 of FIG. 31 is depicted as storing a 4×4 data array structure comprising data elements, A(i,j), where is denotes a row index and j denotes a column index. In contrast to the data storage arrangement of memory block A shown in FIG. 24, the rows and columns of the data array structure shown in FIG. 31 are stored in a permuted arrangement such that all elements of a row are stored in different columns and all elements of a given column are stored in different rows. In particular, the elements A(i,j) of the data array structure are stored in memory cells by offsetting the columns of each row with its row number, so that the data is skewed both by row and by column.

For instance, in FIG. 31, the $0^{th}$ row (R0) of the memory 280 includes the first row of the data structure (A11, A12, A13 and A14) stored in a canonical position. However, the second row of data structure (A21, A22, A23 and A24) is stored in the $1^{st}$ row (R1) of the memory 280 with the data element shifted to the right by 1. Moreover, the third row of the data structure (A31, A32, A33, A34) is stored in the $2^{nd}$ row (R2) of the memory 280 with the data elements shifted to the right by 2, and the fourth row of the data structure (A41, A42, A43, A44) is stored in the $3^{rd}$ row (R3) of the memory 280 with the data elements shifted to the right by 3. In this regard, each row and each column of the data structure A are in different rows and columns of the memory array 280. This allows any row or any column to be fetched in a single operation. For instance, the first row RA1 (elements A11, A12, A13, A14) of the data structure A can be accessed by activating the word line WL0, and then activating each bit line BL0, BL1, BL2 and BL3 to read out each element (A11, A12, A13, A14) in the first row RA1 of the data array structure A in one operation. Moreover, the first column CA1 (elements A11, A21, A31, A41) of the data array structure A (as shown by the dashed line 282) can be accessed by activating each word line WL0~WL3, and then activating each bit lines BL0~BL3 to read out each element (A11, A21, A31, A41) in the first column CA1 of the data array structure A in one operation.

The second, third and fourth rows and columns of the data array structure can be read out from the memory 280 in a similar fashion, but a rotate method 284 is applied to shift the bits to the left a certain number of positions as needed to place the bits in proper order. For instance, when the second row of the data array structure is read out, the data elements on bit lines BL0, BL1, BL2 and BL3 will be in the order of A24, A21, A22, and A23. A right shift operation of 1 bit position will be applied to place the data elements in proper order, i.e., A21, A22, A23, and A24.

Figure 32:
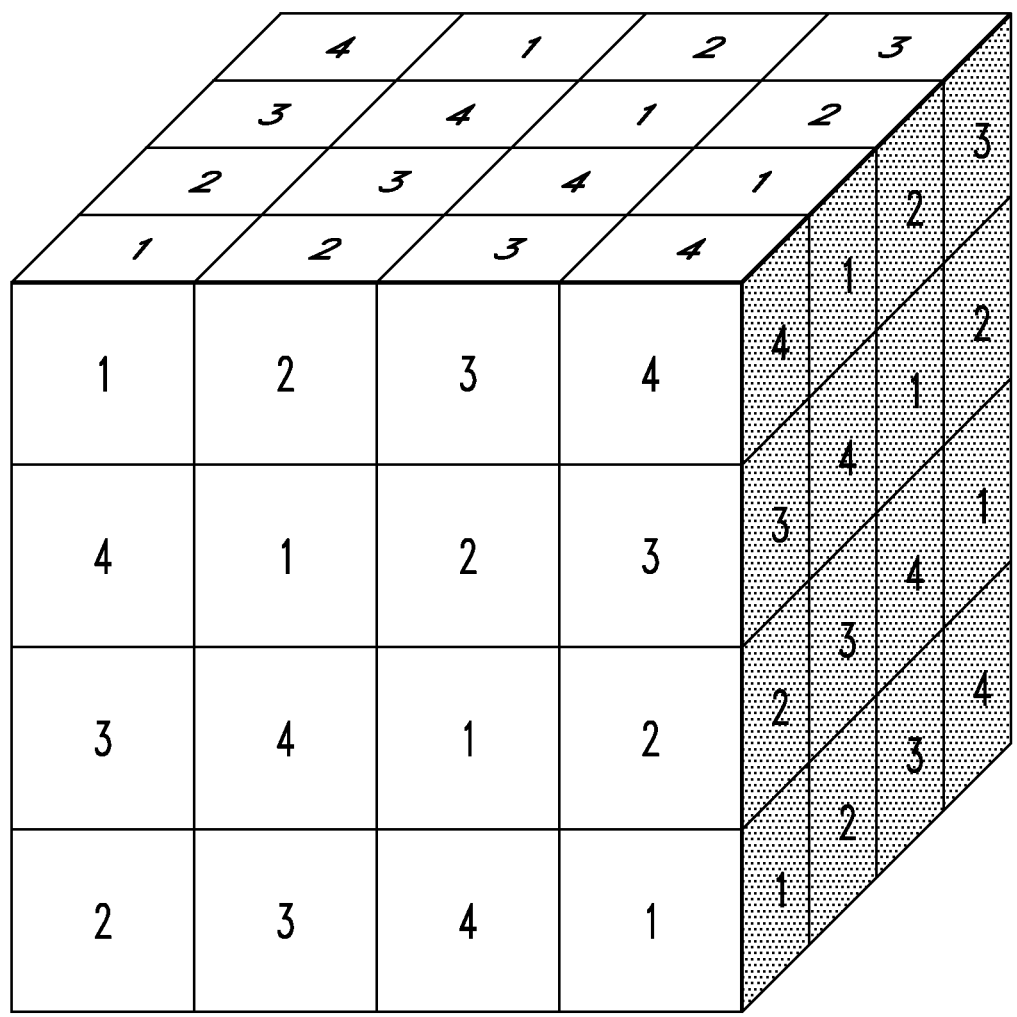
FIG. 32 schematically illustrates method for storing a 3-D array of data in a 3-D memory structure, according to an exemplary embodiment of the invention.

In another embodiment of the invention, the exemplary storage method discussed above with reference to FIG. 31 is extended to a 3-D application, such as shown in FIG. 32. FIG. 32 schematically illustrates method for storing a 3-D array of data in a 3-D memory structure, according to an exemplary embodiment of the invention. FIG. 32 illustrates a cube structure 290 comprising a 4×4×4 matrix of memory cells. The cube structure represents a 3-D memory structure having an architecture as depicted in FIG. 29, for example. In this embodiment, a 3-D array of data can be stored in a 3-D memory by offsetting both the rows and the columns in each 4×4 2-D plane, as well as in the vertical (stacked) direction. In FIG. 32, the number (1, 2, 3, 4) of each cube in the memory structure 290 represents a bit position of a data element of a given row of a given 2-D array as well as the associated column number of a given column in the given 2-D array.

The storage arrangement of FIG. 32 would allow any 4×4 (2-D) plane in the 3-D memory system to hold any 2-D slice of the 4×4×4 (3-D) data structure so that the data elements of each 2-D data slice could be accessed in one operation. In other embodiments, 2-D data can be mapped onto the 3-D memory structure by storing one of the dimensions in a plane. For instance, a 4×16 2-D matrix could be stored in the 3-D memory of FIG. 32 by dividing the 4×16 array into two 4×4 portions and storing each 4×4 portion in a separate plane of the 3-D memory structure. Moreover, assuming a 3-D memory system was constructed with multiple levels of 64×256 memory, a 256×256 2-D array of data could be stored on the 3-D memory system by dividing the first 256 dimension into 4 separate portions (e.g., forming 4 64×256 portions) and storing each of the 4 portions on 4 different levels of 64×256 of the 3-D memory.

Figure 33:
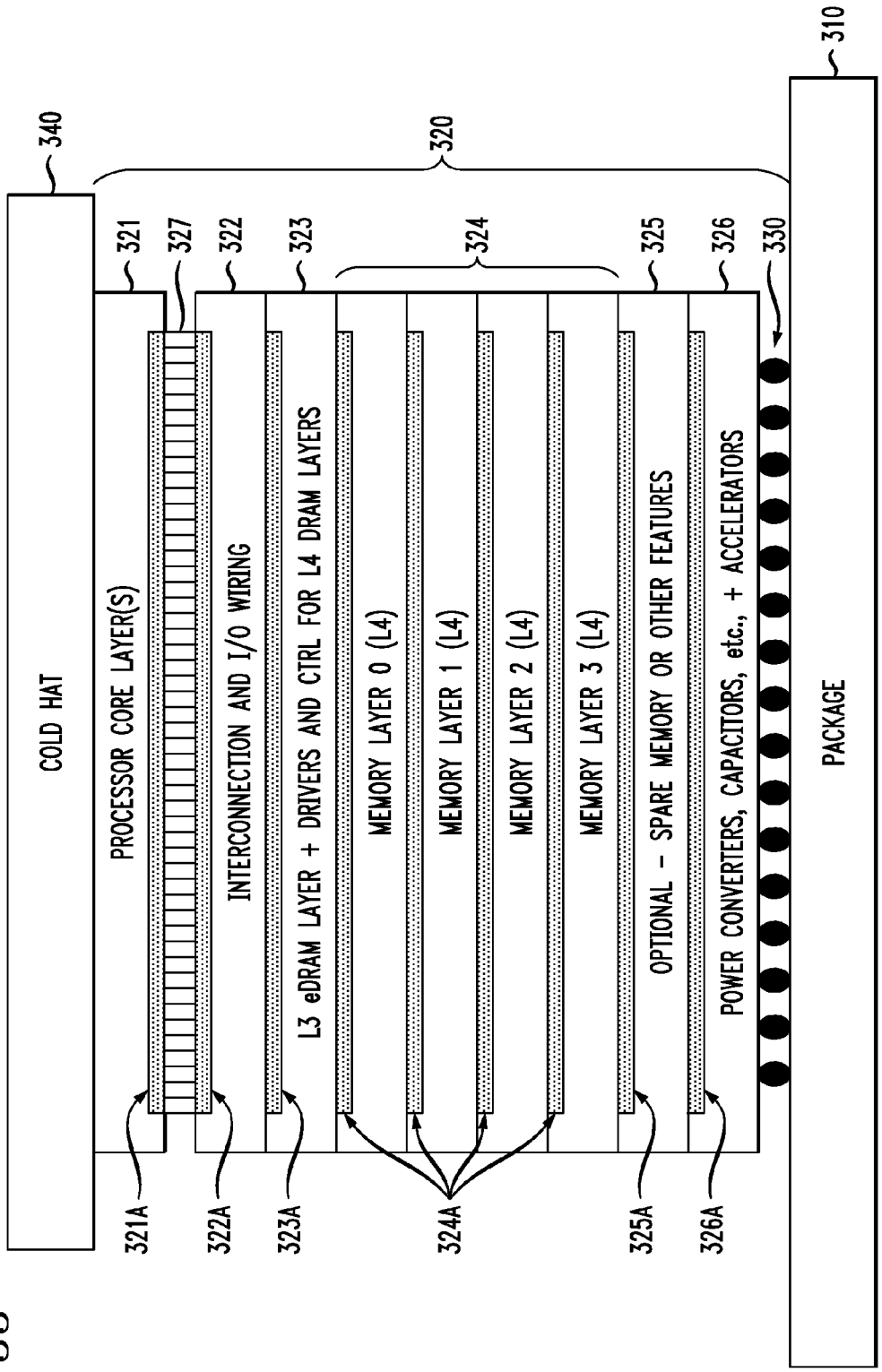
FIG. 33 is a side-schematic view of a multi-chip system for which embodiments of the invention can be applied.

Other embodiments of the invention include structures and methods for implementing a 3-D computer processor system using multi-chip systems. For example, FIG. 33 is a side-schematic view of a multi-chip system for which embodiments of the invention can be applied. In particular, FIG. 33 shows a multi-chip system 300 comprising a package substrate 310, a 3-D computing stack 320 mounted on the substrate 310 using a surface mount structure 330 (e.g., Ball Grid Array structure), and a cooling plate 340 mounted on the computing stack 320. The computing stack 320 comprises a plurality of stacked layers including one or more processor core layers 321, an interconnection and input/output wiring layer 322, an L3 cache memory layer 323, a plurality of L4 cache memory layers 324, an optional layer 325, and a power converter layer 326. Each layer 321, 322, 323, 324, 325, and 326 comprises a semiconductor chip having a front side (active) surface 321A, 322A, 323A, 324A, 325A and 326A, respectively, and a backside (inactive) surface, opposite the active surface.

The power converter layer 326 comprises circuitry for converting high-voltage power (e.g., 10V) that is delivered by the package substrate 310 into a lower voltage (e.g., 1V) that is supplied to the active circuitry of the various layers. The power converter layer 326 may include other circuitry and circuit components such as capacitors and accelerator circuits for implementing other standard functions. For example, accelerators are ASIC hardware engines that perform certain functions. The backside of the power converter layer 326 is connected to the package substrate 310 via the surface mount structure 330. The optional layer 325 may include spare memory or other features. The L4 cache memory layers 324 include a plurality memory layers (L1, L2, L3 and L4) mounted to each other face-to-back. The L3 cache memory layer 323 is backside mounted to the face of the first layer L1 of the L4 cache memory stack 324. The active surface 323A of the L3 cache memory layer 323 may further include drivers and control circuitry for controlling the various L4 cache memory layers 324.

In one embodiment, the processor core layers 326 include a plurality of processor chips, wherein each processor chip may include one or more processors. The processor chips can be connected using techniques as discussed above with respect to FIGS. 13, 14, 15 and 16, for example. The interconnection and I/O wiring layer 322 comprises wiring that connects each of the processor core layers 321 to each other, wherein the interconnection and I/O wiring layer comprises a plurality of input/output ports wherein the various processor core layers 321 are commonly connected and share the plurality of input/output ports. In the example embodiment of FIG. 33, the lower processor core layer in the stack of processor core layers 321 is shown as being mounted face-to-face with the interconnection and I/O wiring layer 322 via an array of interconnects 327 (e.g., solder balls).

The interconnection and I/O wiring layer 322 comprises a wiring network to connect each of the local memory layers together (i.e., memory layers 323 and 324) to create a storage system. For example, the various memory layers can be interconnected and controlled using one or more of the techniques as discussed above with reference to FIGS. 9A, 9B, 9C, and 22 through 32. Furthermore, the interconnection and I/O wiring layer 322 comprises a wiring network to connect the commonly shared input/output ports of the stack of processor core layers 321 to the aggregated storage system formed by the interconnected memory layers 323 and 324. Furthermore, a global interconnect bus, which comprises vertical wiring and interconnects formed through the memory layers 323, 324 and the power converter layer 326, is formed to connect the interconnection and I/O wiring layer 322 to wiring formed on the package substrate 310 (via the surface mount structure 330).

Figure 34:
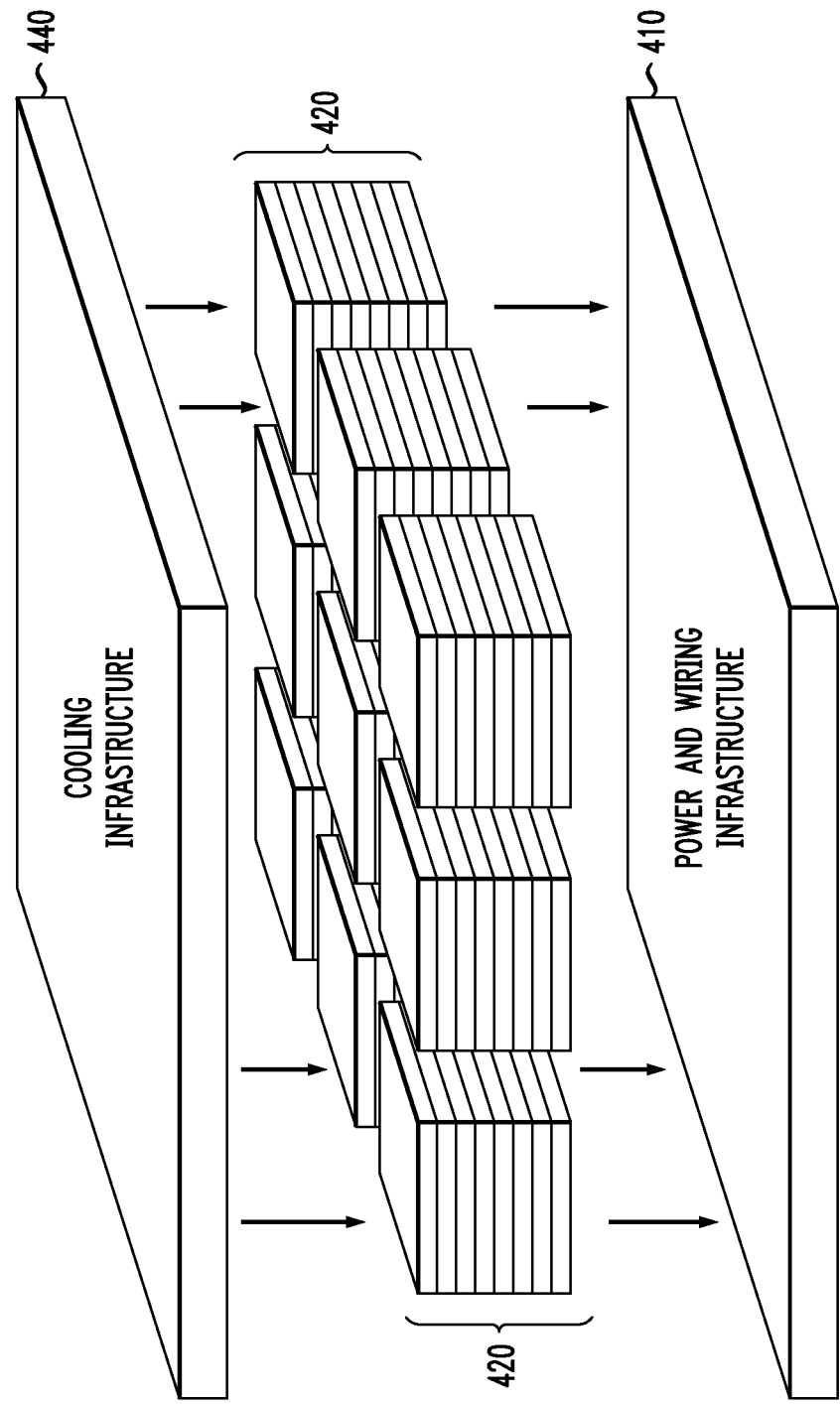
FIG. 34 is a high-level perspective view of a 3-D computer processor system for which embodiments of the invention can be applied.

Although FIG. 33 depicts one computing stack 320, a plurality of computing stacks can be mounted on a package substrate to form a multi-processor computing system. For example, FIG. 34 is a high-level perspective view of a 3-D computer processor system for which embodiments of the invention can be applied. In particular, FIG. 34 illustrates a 3-D multi-processor computing system 400 having a plurality of computing stacks 420 mounted on a common substrate 410 and cooled by a common cooling plate structure thermally coupled to the upper surfaces of the computing stacks 320. The computing stacks 420 shown in FIG. 34 may have the same or similar structure as the computing stack 320 shown in FIG. 33. The package substrate 410 comprises a plurality of electrical interconnects and traces that form electrical wiring which provides an all-to-all connection between the various computing stacks 420. The cooling plate 440 may be a structure that supports liquid cooling, or a thermal spreader plate that supports air-cooling, for example.

In the embodiment of FIG. 34, the use of a common cooling plate 440 to cool each of the computing stacks 420 can be problematic for various reasons. For example, the depending the cooling techniques employed (e.g., liquid cooling, air cooling), the common cooling plate 440 may not adequately provide sufficient thermal cooling to different computing stacks 420 located at different locations of the cooling plate 440, for reasons understood to those of ordinary skill in the art. Moreover, as the cooling plate 440 expands and contracts due to its coefficient of thermal expansion, different stresses and strains can be applied to a thermal interface between the cooling plate 440 and upper surfaces of the computing stacks 420 located as different regions (areas) of the cooling plate 440, which is hard to control For example, the displacement between the surface of the cooling plate 440 relative to the surface of a given computing stack 420 is greater for those computing stacks 420 that are located further away from the center of the cooling plate 440, which causes greater strain and possible damage to the thermal interfaces between the cooling plate 440 and computing stacks 420 located closer to the outer perimeter of the cooling plate 440. Moreover, with the 3-D computing system 400 of FIG. 34, the fabrication of the package substrate 410 can be very expensive and complex due to the various levels of wiring that is needed to connect all the computing stacks 420 together. Indeed, depending on the number of computing stacks 420 forming the system, and the particular wiring network structure employed, the package substrate 410 may have 100 or more levels of wiring, which can be very expensive to manufacture.

Figure 35:
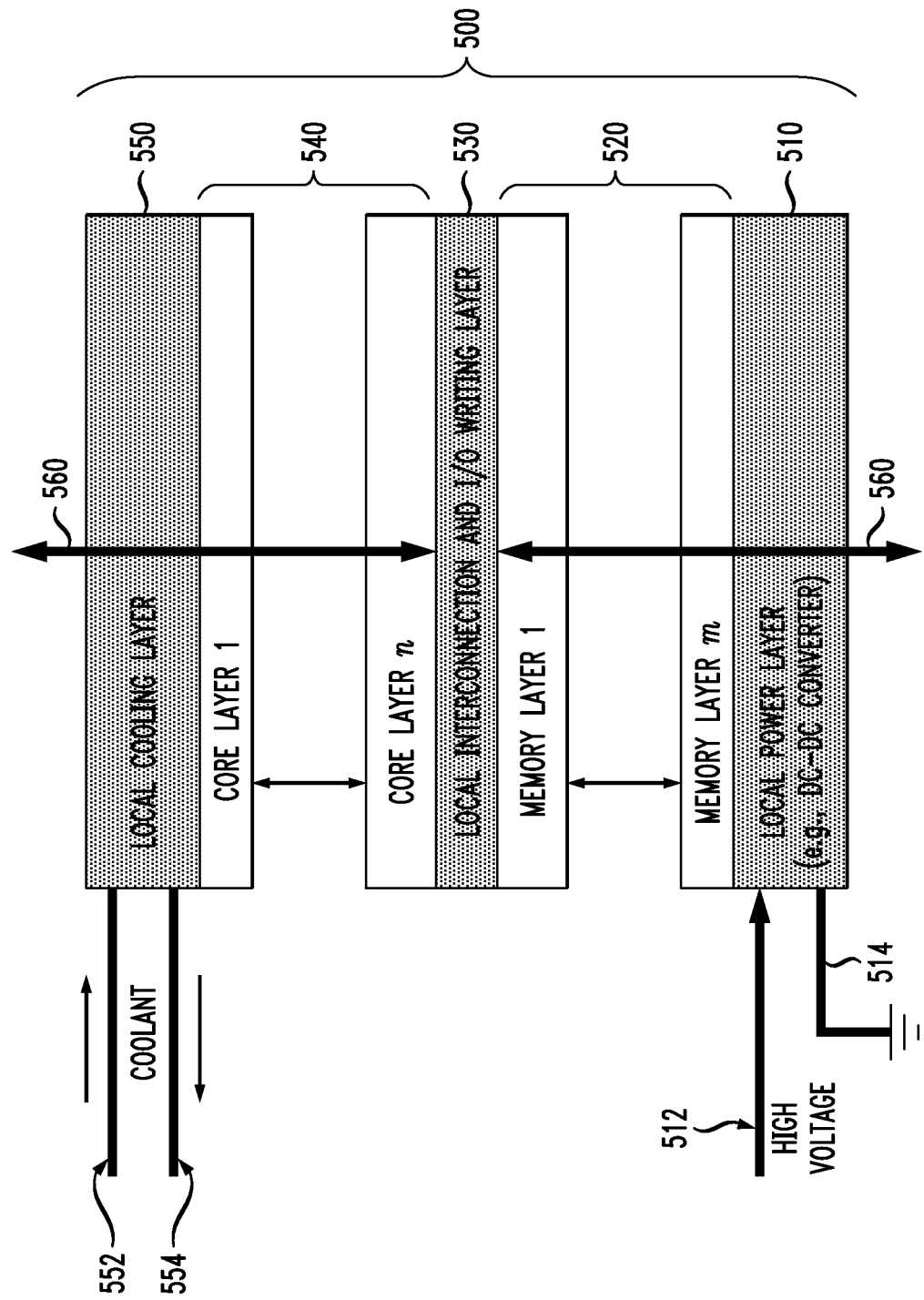
FIG. 35 is a side-schematic view of a multi-chip system according to an embodiment of the invention.
Figure 36:
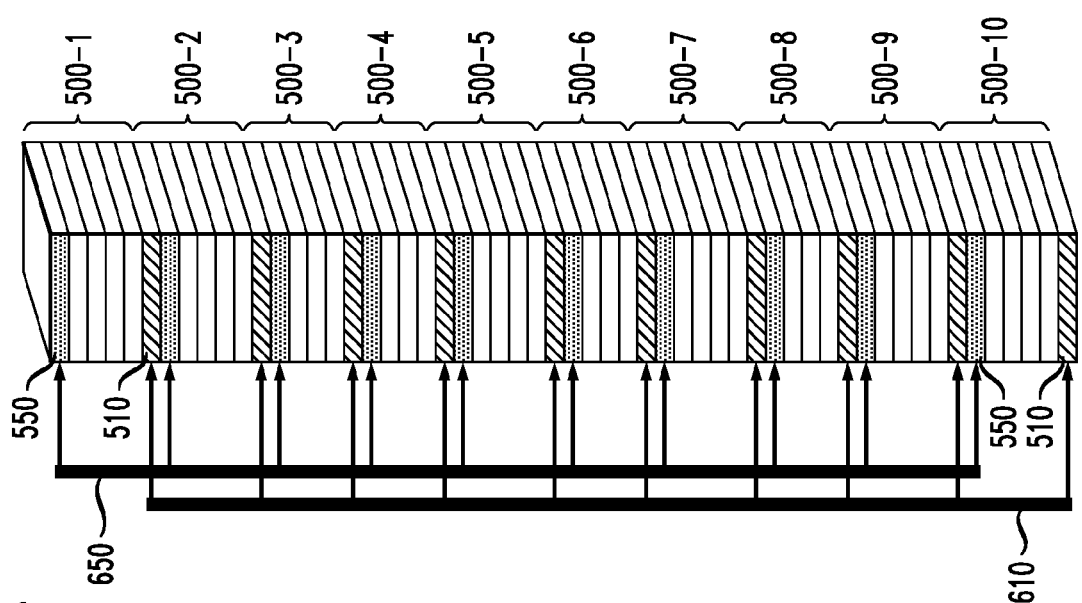
FIG. 36 illustrates a 3-D computer processor system according to an embodiment of the invention, which is constructed by conjoining a plurality of multi-chip systems as shown in FIG. 35.

In other embodiments of the invention, the problems associated with the common cooling plate 440 and package substrate 410 with complex wiring are eliminated by constructing a 3-D computer processor system comprising a plurality of multi-chip systems in an aggregated structure that incorporates multiple local power and cooling layers, and a global interconnect structure that connects the multi-chip systems in the aggregated structure. For example, FIGS. 35, 36, 37, 38 and 39 schematically illustrate embodiments of a 3-D computer processor systems comprising a plurality of multi-chip systems. FIG. 35 is a side-schematic view of a multi-chip system according to an embodiment of the invention, and FIG. 36 illustrates a 3-D computer processor system according to an embodiment of the invention, which is constructed by conjoining a plurality of multi-chip systems as shown in FIG. 35.

In particular, FIG. 35 illustrates a multi-chip system 500 comprising a local power converter layer 510, a plurality of m memory layers 520, a local interconnection and I/O wiring layer 530, a plurality of processor core layers 540, and a local cooling layer 550. The local cooling layer 550 comprises a local inlet 552 and local outlet 554. The local power converter layer 510 comprises a local power supply feed 512 and a local ground connection 514. The multi-chip system 500 further comprises a global bus 560 that traverses through the stacked structure connecting to the local interconnection and I/O wiring layer 530. The various layers 510, 520, 530, 540 and 550 of the multi-chip system 500 are similar in structure and function as the similar corresponding layers 326, 324/323, 322, 321 and 340 of the multi-chip system 300 shown in FIG. 33. However, the multi-chip system 500 shown in FIG. 35 provides a building block for a 3-D computer processor system that is constructed by physically aggregating and conjoining a plurality of multi-chip systems such as shown in FIG. 35.

FIG. 36 schematically illustrate a 3-D computer processor system 600 according to an embodiment of the invention, which is formed by stacking a plurality of multi-chip systems (such as the multi-chip systems 500 shown in FIG. 35) in a vertical structure. In particular, FIG. 36 shows a 3-D computer processor system 600 comprising ten multi-chip systems (500_1, 500_2 . . . , 500_10) that are vertically stacked on top of each other. The system 600 comprises global power supply structure 610 that is connected to each local power converter layer 510 of each multi-chip system (500_1, 500_2 . . . , 500_10), and global coolant system 650 that is connected to the local inlets/outlets of the local cooling layer 550 of each multi-chip system (500_1, 500_2 . . . , 500_10). In this embodiment, the cooling system is integrated throughout the 3-D computer processor system 600 by virtue of the separate local cooling layers 550 of each multi-chip system 500. This structure eliminates the need and problems associated with a common cooling plate 440 as shown in FIG. 34.

Figure 37:
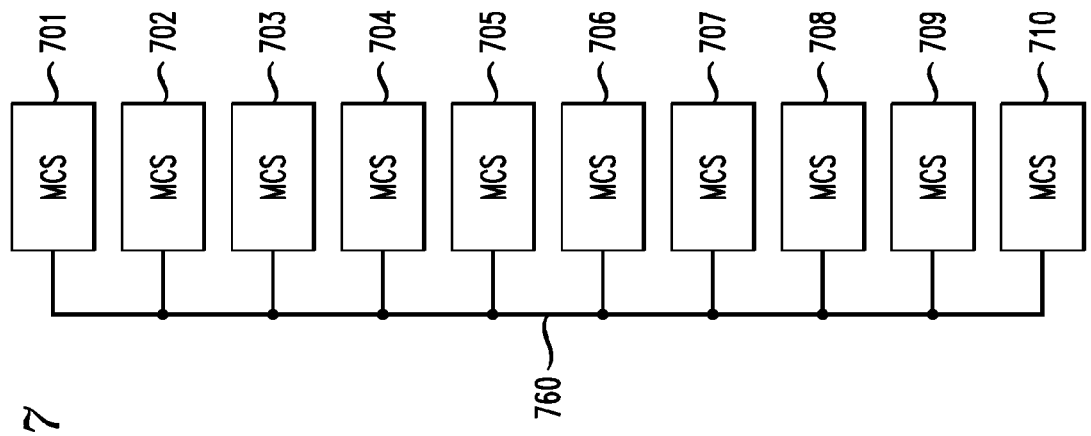
FIG. 37 schematically illustrates techniques for connecting a global bus to each multi-chip system of the 3-D computer processor system according to embodiments of the invention.

FIG. 37 schematically illustrates techniques for connecting a global bus to each multi-chip system of the 3-D computer processor system according to embodiments of the invention. In particular, FIG. 37 shows illustrate a 3-D computer processor system 700 comprising a plurality of multi-chip systems 701, 702, 703, 704, 705, 706, 707, 708, 709 and 710), and a global interconnect structure 760 that connects the multi-chip systems in the 3-D computer processor system 700. For ease of illustration, the global bus 760 is generically depicted FIG. 37 as being a shared bus that connects to each multi-chip system 701, 702, 703, 704, 705, 706, 707, 708, 709 and 710) in the 3-D computer processor system 700. In one embodiment, the global bus 760 can be an electrical bus that is formed of wiring and interconnects that traverse through each of the various layer of chips that form the multi-chip systems 701, 702, 703, 704, 705, 706, 707, 708, 709 and 710). For example, the bus elements 560 shown in FIG. 35 represent a portion of the global bus 760 of FIG. 37 which traverses the local chip layers of each multi-chip system 500 and which connects to the local interconnection and I/O wiring layer 530 of each multi-chip system.

The global bus 760 shown in FIG. 37 is connected to the local interconnection and I/O wiring layer of each multi-chip system 701, 702, 703, 704, 705, 706, 707, 708, 709 and 710) forming the 3-D computer processor system 700. As discussed above, the local interconnection and I/O wiring layer in a given multi-chip system connects all of the processor core layers to each other, connects all the memory layers 520 to each other, and connects the all local processor core and memory layers to each other in the given multi-chip system. The global bus 760 enables point-to-point communication between each multi-chip system (710, 702, 703, 704, 705, 706, 707, 708, 709, and 710) in the 3-D computer processor system 700. The global bus 760 eliminates the need for the wiring network provided by the package substrate 410 to connect each multi-chip system 420 in the 3-D computer processing system 400 shown in FIG. 34. In this embodiment, the overall length of the global bus 760 wiring between the outer most multi-chip systems 701 and 710 of the 3-D computer processor system 700 would not be problematic in that assuming each layer in the system 700 is 100 microns thick, 100 layers in the 3-D system 700 would be around 1 cm thick.

In another embodiment of the invention, the global buss 760 may be formed of an optical fiber system using laser communications. In this embodiment, point-to-point communication over a shared optical fiber bus can be facilitated by assigning each multi-chip 701, 702, 703, 704, 705, 706, 707, 708, 709, and 710) a different communication signal wavelength (color) in the 3-D computer processing system 700. For instance, a base wavelength can be assigned to the first multi-chip system 701 and then each remaining multi-chip system 702, 703, 704, 705, 706, 707, 708, 709, and 710) can be assigned an incrementally larger (or smaller) wavelength of laser light. A fiber optic system would allow the multiple multi-chip systems 701, 702, 703, 704, 705, 706, 707, 708, 709, and 710) to transmit information on the shared bus 760 to other multi-chip systems, without waiting for control of the shared bus 760, as would be required if the global bus 760 is implemented electrically. In either instance, whether the global bus 760 is implemented optically or electrically, a coherency scheme would be employed to control and coordinate point-to-point communication over the shared global bus 760.

FIG. 38 illustrates a 3-D computer processor system according to another embodiment of the invention. In particular, FIG. 38 shows a 3-D computer processor system 800 comprising a plurality of multi-chip systems 820. The multi-chip systems 820 include a plurality of layers 826 that are conjoined together, wherein the layers 826 include processor chips, memory chips, local interconnection and input/output wiring layers, etc. as discussed above. Some of the multi-chip systems 820 may include processor chips only, memory chips only, or a combination thereof. The multi-chip systems 820 further include local power converter layers 822 and local cooling layers 824. The local cooling layers 824 have inlets and outlets that connected to a global coolant system 830, as discussed in other embodiments above.

The 3-D computer processor system 800 further comprises a substrate 810 on which the plurality of multi-chip systems 820 are mounted. In particular, the various chips and layers of the multi-chip systems 820 are edge-mounted to the substrate 810. In one embodiment, the substrate 810 includes wiring and components to provide a power distribution network for delivering global power to each of the local power converter layers 822, as well as wiring to implement an global electrical bus that is edge-coupled to the local interconnection and input/output wiring layers of the multi-chip systems 820. In another embodiment, the substrate 810 comprises wiring and components to implement the power distribution network, while the global interconnection network is constructed using wiring and interconnects that are formed in the various layers of the aggregated multi-chip systems 820, longitudinally extending from end to end through the multi-chip systems 820.

Figure 39:
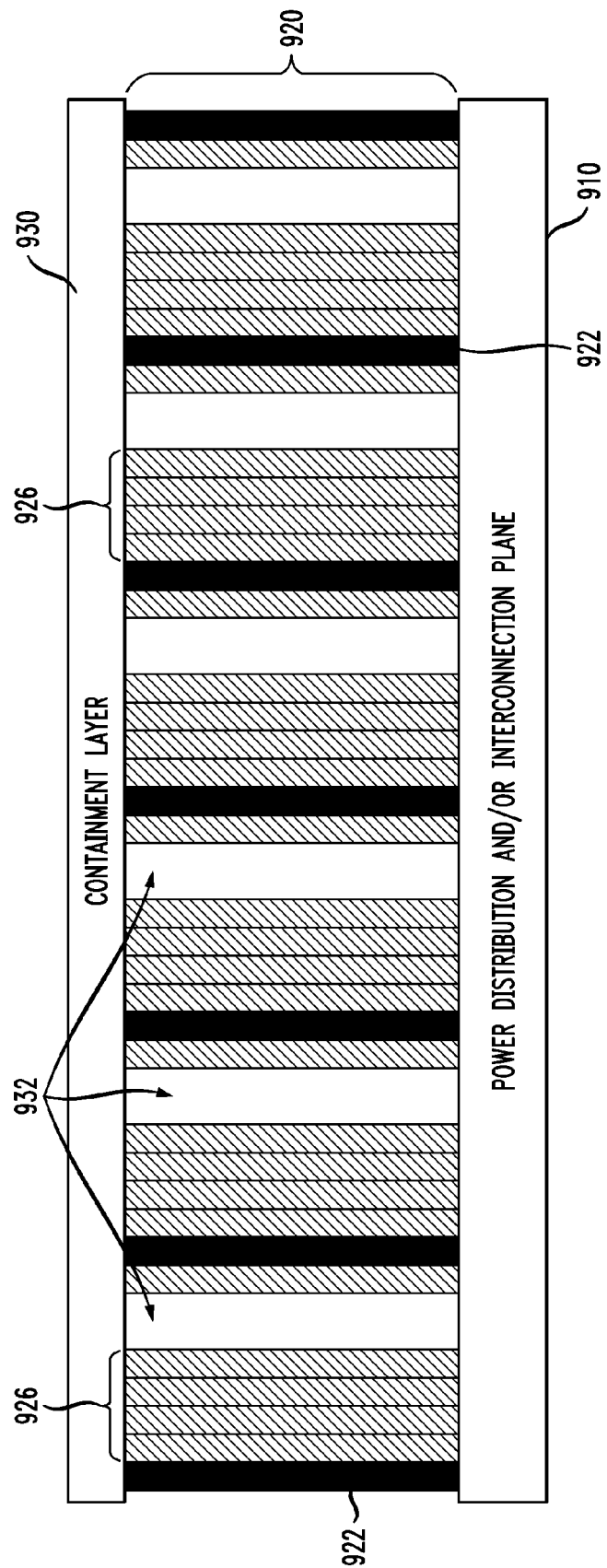
FIG. 39 illustrates a 3-D computer processor system according to yet another embodiment of the invention.

FIG. 39 illustrates a 3-D computer processor system according to yet another embodiment of the invention. In particular, FIG. 39 shows a 3-D computer processor system 900 comprising a plurality of multi-chip systems 920 edge-mounted on a substrate 910, similar to FIG. 38. The multi-chip systems 920 include a plurality of layers 926 that are conjoined together, wherein the layers 926 include processor chips, memory chips, and local interconnection and input/output wiring layers, etc. as discussed above. Some multi-chip systems may include processor chips only, memory chips only, or a combination thereof. The multi-chip systems 920 further include local power converter layers 922. The substrate 910 of the 3-D computer processor system 900 comprises wiring and components to provide a power distribution network for delivering global power to each of the local power converter layers 922, as well as wiring to implement an global electrical bus that is edge-coupled to the local interconnection and input/output wiring layers of each of the multi-chip systems 920.

Furthermore, in the 3-D computer processor system 900 of FIG. 39, the multi-chip systems 920 are edge-mounted to the substrate 910 with spaces 932 disposed between adjacent multi-chip systems. A containment layer 930 is coupled to the upper edges of the various layers of the multi-chip systems 920 to provide mechanical stability, as well as provide a confined cavity provided by the spaces 932 through which forced air or coolant can flow to provide cooling for the multi-chip systems 920.

Although exemplary embodiments of the present invention have been described herein with reference to the accompanying figures, it is to be understood that the invention is not limited to those precise embodiments, and that various other changes and modifications may be made therein by one skilled in the art without departing from the scope of the appended claims.

What is claimed is:

1. A computer processor system, comprising:
a plurality of multi-chip systems that are physically aggregated and conjoined, wherein each multi-chip system comprises:
a plurality of chips that are conjoined together; and
a local interconnection and input/output wiring layer; and
a global interconnection network that is connected to the local interconnection and input/output wiring layer of each multi-chip system to interconnect the multi-chip systems together,
wherein at least one multi-chip system comprises a plurality of processor chips that are conjoined together.

2. The computer processor system of claim 1, wherein at least one of the multi-chip systems comprises a plurality of memory chips that are conjoined together.

3. The computer processor system of claim 2, wherein the plurality of memory chips comprise L4 cache memory.

4. The computer processor system of claim 2, wherein the plurality of memory chips comprise L3 cache memory.

5. The computer processor system of claim 1, wherein at least one of the multi-chip systems comprises a local power converter layer to supply local power to the multi-chip system.

6. The computer processor system of claim 1, wherein at least one of the multi-chip systems comprises a local cooling layer to provide local cooling to the multi-chip system.

7. The computer processor system of claim 6, wherein the local cooling layer comprises a liquid cooling plate having a local inlet and a local outlet connected to a liquid coolant delivery system.

8. The computer processor system of claim 1, wherein the global interconnection network comprises a global electrical bus.

9. The computer processor system of claim 8, wherein the global electrical bus comprises electrical wiring that runs in a direction orthogonal to parallel planes of the chips forming the multi-chip systems.

10. The computer processor system of claim 9, wherein the electrical wiring of the global electrical bus comprises wiring and through vias that are formed in and extend through the chips that form the multi-chip systems.

11. The computer processor system of claim 9, wherein the electrical wiring of the global electrical bus comprises wiring that is formed within a separate substrate that is connected to edges of the chips forming the plurality of multi-chip systems.

12. The computer processor system of claim 1, wherein the global interconnection network comprises an optical bus.

13. The computer processor system of claim 12, wherein each multi-chip system communicates with a different wavelength of light over the optical bus.

14. The computer processor system of claim 12, wherein the optical bus is disposed adjacent to the multi-chip systems and extends in a direction orthogonal to parallel planes of the chips forming the multi-chip systems.

15. The computer processor system of claim 1, wherein each multi-chip system comprises a local power converter layer and a local cooling layer.

16. The computer processor system of claim 15, wherein the local cooling layer of a first multi-chip system is disposed adjacent to, and in contact with, the local power converter layer of a second multi-chip system.

17. The computer processor system of claim 1, wherein the plurality of processor chips of the at least one multi-chip system are connected to each other using vertical through vias that are formed in the processor chips, and wherein each of the processor chips are commonly connected to, and share I/O ports formed on, the local interconnection and input/output wiring layer.

18. A computer processor system, comprising:
- a plurality of multi-chip systems, wherein each multi-chip system comprises:
  - a plurality of chips that are conjoined together; and
  - a local interconnection and input/output wiring layer, wherein at least one multi-chip system comprises a plurality of processor chips that are conjoined together;
- a global interconnection network that is connected to the local interconnection and input/output wiring layer of each multi-chip system to interconnect the multi-chip systems together; and
- a substrate on which the plurality of multi-chip systems are mounted, wherein the chips of the multi-chip systems are edge-mounted to the substrate in parallel to each other.

19. The computer processor system of claim 18, wherein the global interconnection network comprises an electrical bus that is formed within the substrate on which the multi-chip systems are edge-mounted.

20. The computer processor of claim 18, wherein the multi-chip systems are edge-mounted to the substrate with a space between the multi-chip systems to allow air or coolant to flow through the spaces and provide cooling for the multi-chip systems.

* * * * *